(12) United States Patent
Ugajin

(10) Patent No.: US 7,135,071 B2
(45) Date of Patent: Nov. 14, 2006

(54) FRACTAL STRUCTURE AND METHOD OF FORMING IT

(75) Inventor: Ryuichi Ugajin, Tokyo (JP)

(73) Assignee: Sony Corporation, Tokyo (JP)

( * ) Notice: Subject to any disclaimer, the term of this patent is extended or adjusted under 35 U.S.C. 154(b) by 279 days.

(21) Appl. No.: 10/089,857

(22) PCT Filed: Aug. 24, 2001

(86) PCT No.: PCT/JP01/07248

§ 371 (c)(1),
(2), (4) Date: Apr. 2, 2002

(87) PCT Pub. No.: WO02/17410

PCT Pub. Date: Feb. 28, 2002

(65) Prior Publication Data

US 2002/0195598 A1 Dec. 26, 2002

(30) Foreign Application Priority Data

Aug. 25, 2000 (JP) .............................. 2000-255236
Oct. 31, 2000 (JP) .............................. 2000-333395

(51) Int. Cl.
*C30B 25/02* (2006.01)

(52) U.S. Cl. ............................. 117/84; 117/85; 117/86; 117/92; 117/93

(58) Field of Classification Search .................. 117/84, 117/85, 86, 92, 93
See application file for complete search history.

(56) References Cited

FOREIGN PATENT DOCUMENTS

JP 11195801 7/1999
JP 2001118379 4/2001

OTHER PUBLICATIONS

H. Isshiki, K. Tanaka and T. Kimura, "Conduction subband formation in (GaSa)m(GaP)n FRACTAL structured atomic-layer-superlattice grown by atomic layer epitaxy", Proc. of the 24th International Conference on The Physics of Semiconductors, CD-ROM File No. 0948, World Scientific Publishing Co. (1999).

R. Ugajin, "Composite nanomaterials based on fractal-shaped structures", Physics Letters A, 227, (2000) pp. 267 to 272.

Primary Examiner—Robert Kunemund
(74) Attorney, Agent, or Firm—Sonnenschein Nath & Rosenthal LLP

(57) ABSTRACT

A fractal structure is formed to have a plurality of regions different in fractal dimension characterizing the self-similarity. The fractal structure is grown from one or more origins under growth conditions providing a first fractal dimension in a first portion of the growth process from the start point of time to a first point of time, and under growth conditions providing a second fractal dimension lower than the first fractal dimension in another portion of the growth process from the first point of time to a second point of time. By adjusting the timing for changing the growth conditions, the fractal structure is controlled in nature of phase transition, such as critical temperature for ferromagnetic phase transition, which occurs in the fractal structure. For enhancing the controllability, the first fractal dimension is preferably larger than 2.7 and the second fractal dimension is preferably smaller than 2.3.

19 Claims, 51 Drawing Sheets

FRACTAL STRUCTURE AND METHOD OF FORMING IT

BACKGROUND OF THE INVENTION

This invention relates a fractal structure and its forming method, especially based on a novel principle.

BACKGROUND ART

For application of a solid material to electronic or optical devices, physical properties of the material may restrict its applications. For example, in case of using a semiconductor material in a light-emitting device, it will be usable in a device of an emission wavelength corresponding to the band gap of the material, but some consideration will be necessary for changing the emission wavelength. Regarding physical properties related to semiconductor bands, controls by superlattices have been realized. More specifically, by changing the period of a superlattice, the bandwidth of its subband can be controlled to design an emission wavelength.

Targeting on-controlling many-electron-state structures by material designs, the Inventor proposed many-body effect engineering by quantum dot-based structures and has continued theoretical analyses ((1) U.S. Pat. No. 5,430,309; (2) U.S. Pat. No. 5,663,571; (3) U.S. Pat. No. 5,719,407; (4) U.S. Pat. No. 5,828,090; (5) U.S. Pat. No. 5,831,294; (6) U.S. Pat. No. 6,020,605; (7) J. Appl. Phys. 76, 2833(1994); (8) Phys. Rev. B51, 10714(1995); (9) Phys. Rev. B51, 11136(1995); (10) J. Appl. Phys. 77, 5509(1995); (11) Phys. Rev. B53, 6963(1996); (12) Phys. Rev. B53, 10141(1996); (13) Appl. Phys. Lett. 68, 2657(1996); (14) J. Appl. Phys. 80, 3893(1996); (15) J. Phys. Soc. Jpn. 65, 3952(1996); (16) Jpn. J. Appl. Phys. 36, 638(1997); (17) J. Phys. Soc. Jpn. 66, 425(1997); (18) J. Appl. Phys. 81, 2693 (1997); (19) Physica (Amsterdam) 229B, 146(1997); (20) Physica (Amsterdam) 237A, 220(1997); (21) Surf. Sci. 375, 403(1997); (22) Physica (Amsterdam) 240B, 116(1997); (23) Physica (Amsterdam) 240B, 128(1997); (24) Physica (Amsterdam) IE, 226(1997); (25) Phys. Rev. Lett. 80, 572(1998); (26) Jpn. J. Appl. Phys. 37, 863(1998); (27) Physica (Amsterdam) 245B, 311(1998); (28) Physica (Amsterdam) 235B, 96(1998); (29) Phys. Rev. B59, 4952(1999); (30) Surf. Sci. 432, 1(1999); (31) International Journal of Modern Physics B. Vol. 13, No. 21, 22, pp. 2689–2703, 1999). For example, realization of various correlated electronic systems is expected by adjusting a tunneling phenomenon between quantum dots and interaction between electrons in quantum dots. Let the tunneling transfer between adjacent quantum dots be written as t. Then, if quantum dots are aligned in form of a square lattice, the bandwidth of one electron state is $T_{eff}=4t$. If quantum dots form a one-dimensional chain, the bandwidth of one electron state is $T_{eff}=2t$. In case of a three-dimensional quantum dot array, $T_{eff}=6t$. That is, if D is the dimension of a quantum dot array, the bandwidth of one electron state has been $T_{eff}=2Dt$. Here is made a review about half-filled (one electron per each quantum dot) Mott transition (also called Mott-Hubbard transition or Mott metal-insulator transition). Let the effective interaction of electrons within a quantum dot be written as $U_{eff}$, then the Hubbard gap on the part of the Mott insulator is substantially described as $\Delta=U_{eff}-T_{eff}$, and the Mott transition can be controlled by changing $U_{eff}$ or t. As already proposed, the Mott-Hubbard transition can be controlled by adjusting $U_{eff}$ or t, using a field effect, and it is applicable to field effect devices (Literatures (5), (6), (11) and (14) introduced above).

On the other hand, reviewing the equation of $\Delta=U_{eff}-T_{eff}=U_{eff}-2Dt$, it will be possible to control Mott-Hubbard transition by controlling the dimensionality D of the system. For this purpose, the Applicant already proposed a fractal-based structure that can continuously change the dimensionality, and have exhibited that Mott-Hubbard transition is controllable by changing the fractal dimensions.

To enable designing of wider materials, it is desired to modify and control the dimension of materials by designing methods beyond the simple fractal nature.

As physical systems in charge of information processing, intrinsic non-linearity is indispensable. As devices having been used for years, there are electronic devices using materials exhibiting non-linear responses to certain extents. For example, two-terminal devices exhibiting defferential negative resistances are one example of devices that are non-linear in current-voltage characteristics. Of course, MOS-FET, which is a three-terminal device, supports the modern technologies. By coupling these electronic devices having non-linear properties with a linear electronic circuit and constructing an information processing device having a non-linear property, any desired calculation can be executed.

However, difficulties by high integration have become issues with such electronic circuits. Generation of heat is one of the problems, for example. The heat generation caused by intrinsic electric resistance is mandatory for producing non-linearity of an electronic device, and indispensable and essential for executing information processing.

To avoid this difficulty, trials have been made to decrease the number of devices by enhancing non-linearity of component devices. Progress of this scheme necessarily results in the need for component devices having non-linearity as strong as chaotic. When a chaotic classical system is quantized, what characterizes the behaviors of the quantum system is quantum chaos.

On the other hand, as miniaturization of component devices progresses, electrons confined in a device result in behaving as quantum mechanical particles. Therefore, from this point of view, hopes are placed on components devices exhibiting quantum chaos. The Applicant has continued to theoretically demonstrate that, in a quantum system in a structure having a fractal configuration, the quantum chaos can be controlled by changing the fractal dimension characterizing the system.

An object the invention intends to accomplish is to provide a fractal structure and its forming method capable of modulating and controlling the dimensionality of a material by a design method beyond the simple fractal nature.

Another object the invention intends to accomplish is to provide a fractal structure and its forming method capable of controlling phase transition and chaos, in particular, quantum chaos, by a design method beyond the simple fractal nature.

SUMMARY OF THE INVENTION

The Inventor found, through concentrated researches toward solution of those issues, that a more complex fractal structure having a portion characterized by a plurality of fractal dimensions can be formed by changing the growth conditions with time during growth of the fractal structure. Especially in the process of growing a random fractal, it has been found that a distinctive nebula-like fractal-based complex structure made up of a mixture of a plurality of regions different in fractal dimension can be formed by changing growth conditions toward obtaining a higher fractal dimension after forming regions of a lower fractal dimension. Then, it has been found that, in fractal structures of this type, occurrence of phase transition, such as magnetic phase transition, and chaos, such as quantum chaos in an electron state, can be controlled. As a result of later detailed analysis, it has been found that there are fractal dimensions suitable for controlling these phenomena.

The present invention has been made on the basis of those researches by the Inventor.

That is, to overcome the above-indicated problems, according to the first aspect of the invention, there is provided a fractal structure having a plurality of regions different in fractal dimension characterizing the self-similarity, comprising:

the fractal structure being grown from one or more origins under growth conditions providing a first fractal dimension in a portion of the growth process from the start point of time of growth to a first point and under growth conditions providing a second fractal dimension in another portion of the growth process from the first point of time to a second point of time.

According to the second aspect of the invention, there is provided a fractal structure forming method for forming a fractal structure having a plurality of regions different in fractal dimension characterizing the self-similarity, comprising:

growing the fractal structure from one or more origins under growth conditions providing a first fractal dimension in a portion of the growth process from the start point of time of growth to a first point and under growth conditions providing a second fractal dimension in another portion of the growth process from the first point of time to a second point of time.

In the present invention, by adjusting the timing for changing the growth conditions from those for obtaining a first fractal dimension to those for obtaining a second fractal dimension, the nature of phase transition appearing in the fractal structure is controlled. For example, by adjusting the timing for changing the growth conditions, critical temperature for ferromagnetic phase transition appearing in the fractal structure is controlled. Further, by adjusting the timing for changing the growth conditions, the nature of chaos appearing in the fractal structure is controlled, or more particularly, quantum chaos in the electron state, for example, is controlled. The control of the quantum chaos in the electron state can be controlled with a high controllability by adjusting the timing for changing the growth conditions and additionally introducing a random magnetic field by addition of magnetic impurities. Typically, these regions forming the fractal structure exhibit a form of nebula as a whole.

From the viewpoint of ensuring satisfactory control of the critical temperature of ferromagnetic transition appearing in the fractal structure and satisfactory control of the quantum chaos, or ensuring satisfactory control of the correlative electron system, the first fractal dimension $D_{f1}$ and the second fractal dimension $D_{f2}$ are determined to be preferably $D_{f1} > 2.7$ and $D_{f2} < 2.3$, typically $2.7 < D_{f1} \leq 3$ and $1 \leq D_{f2} < 2.3$, and more preferably $2.9 \leq D_{f1} \leq 3$ and $1 \leq D_{f2} < 2.3$. The upper limit value 3 of $D_{f1}$ corresponds to the dimension of a three-dimensional space whereas the lower limit value 1 of $D_{f2}$ is necessary for ensuring connectivity in the structure.

In an embodiment that will be explained later in detail, growth conditions of the fractal structure are represented by α of Equation (4). In actual growth, however, if the fractal structure is grown in the liquid phase, for example, natures of solvents employed for the growth are one of the growth conditions. That is, in this case, a plurality of regions different in fractal dimension can be formed by selecting appropriate solvents, respectively, in the growth process.

According to the invention having the above-summarized configuration, a nebula-like fractal-based complex structure made up of a mixture of a plurality of regions different in fractal dimension from each other can be obtained by changing the growth condition of the fractal structure with time so as to first carry out the growth under growth conditions providing a low fractal dimension and to thereafter continue the growth under different growth conditions providing a higher fractal dimension. Then, in this fractal structure, the nature of phase transition occurring in the fractal structure can be controlled by, for example, adjustment of the timing for changing the growth conditions. Additionally, optimization of the fractal dimensions improves the controllability.

DETAILED DESCRIPTION OF THE INVENTION

Figure 1:
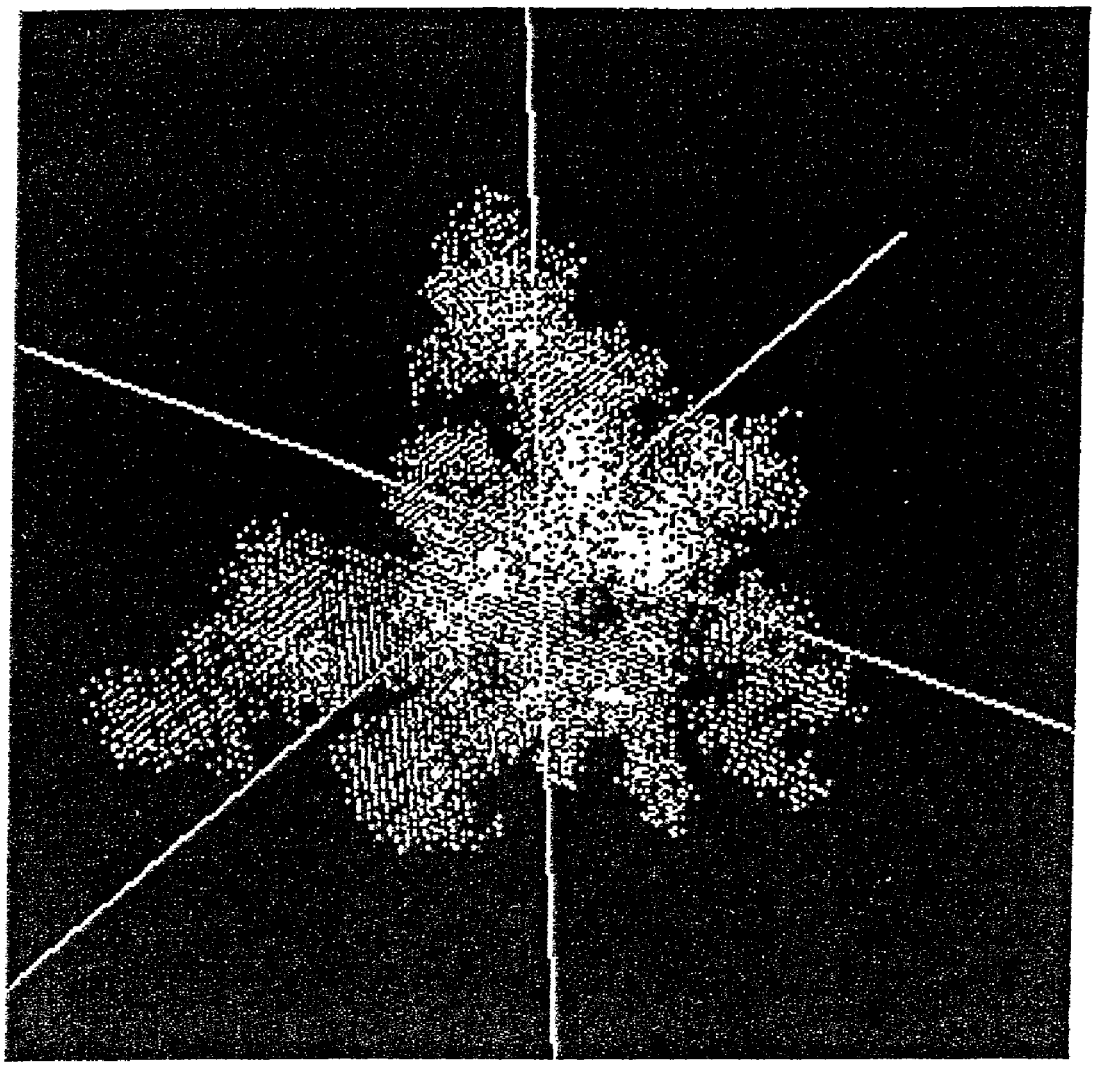
FIG. 1 is a schematic diagram that shows a nebula-like fractal-based complex structure obtained by simulation according to the first embodiment of the invention.

Some embodiments of the invention will now be explained below. In the following embodiments, nebula-like fractal-based complex structures each made up of a mixture of portions characterized by a plurality of fractal dimensions are taken. These nebula-like fractal-based complex structures are formed by first forming a region having a lower fractal dimension and thereafter changing the growth conditions to provide a higher fractal dimension.

FIRST EMBODIMENT (1) Formation of a Nebula-Like Fractal-Based Complex Structure

A method of forming a nebula-like fractal-based complex structure according to the first embodiment can be obtained by developing Dielectric Breakdown Model ((32) A. Erzan, L. Pietronero, A. Vespignani, Rev. Mod. Phys. 67, 545 (1995); (33) L. Niemeyer, L. Pietronero, H. J. Wiesmann, Phys. Rev. Lett. 52, 1033(1984) (34) R. Ugajin, S. Hirata, and Y. Kuroki, Physica A, 278, 312(2000)).

Here is defined a cubic lattice S in a three-dimensional space, and a scalar potential field $\phi(i_1, i_2, i_3)$ is defined on its lattice site $(i_1, i_2, i_3) \in S$ and called a potential. Let this potential obey the Laplace's equation $$\Delta\phi(i_1,i_2,i_3)=0 \qquad (1)$$

A pattern $T_n$, which will be defined later, is a set of lattice sites on the three-dimensional lattice. $T_0$ contains $(0, 0, 0)$ alone, and $T_{n+1}$ is created by sequentially adding a single lattice site to $T_n$ according to the rule given below.

Let the potential of each site contained in $T_n$ be 1 and let the potential at infinity be 0. That is, $$\phi(i_1,i_2,i_3)=0 \text{ when } (i_1,i_2,i_3) \to \infty \qquad (2)$$

$$\phi(i_1,i_2,i_3)=1 \text{ when } (i_1,i_2,i_3) \in T_n \qquad (3)$$

Under these boundary conditions, Equation (1) is solved to determine the potential. The lattice site, which will be added to $T_n$ to construct $T_{n+1}$, is not contained in $T_n$, and it is selected from the set of lattice sites, i.e. $U_n$, nearest to $T_n$. The number of lattice sites contained in $U_n$ is denoted by $N_n$.

Intensity of the electric fields for lattice sites $(i_{1,m}, i_{2,m}, i_{3,m})$ (where m=1, 2, ..., $N_n$) in $U_n$ is defined as $$E_m(\alpha)=|\phi(i_{1,m},i_{2,m},i_{3,m})-1|^\alpha \qquad (4)$$

The probability that a certain site $(i_{1,m},i_{2,m},i_{3,m})$ in $U_n$ is selected is proportional to the electric field $E_m(\alpha)$. That is, the probability is $$p_m(\alpha) = \frac{E_m(\alpha)}{\sum_{j=1}^{N_n} E_j(\alpha)} \qquad (5)$$

By repeating these operations, construction of $T_n$ is progressed. An ideal fractal will be a set of limits repeated infinitely as $$T_\infty = \lim_{n\to\infty} T_n \qquad (6)$$

When $\alpha=1$, the foregoing and the result of generation of the pattern by Diffusion limited aggregation ((35) T. A. Witten, Jr. and L. M. Sander, Phys. Rev. Lett. 47, 1400(1984); Phys. Rev. B27, 5686(1983)).

Figure 2:
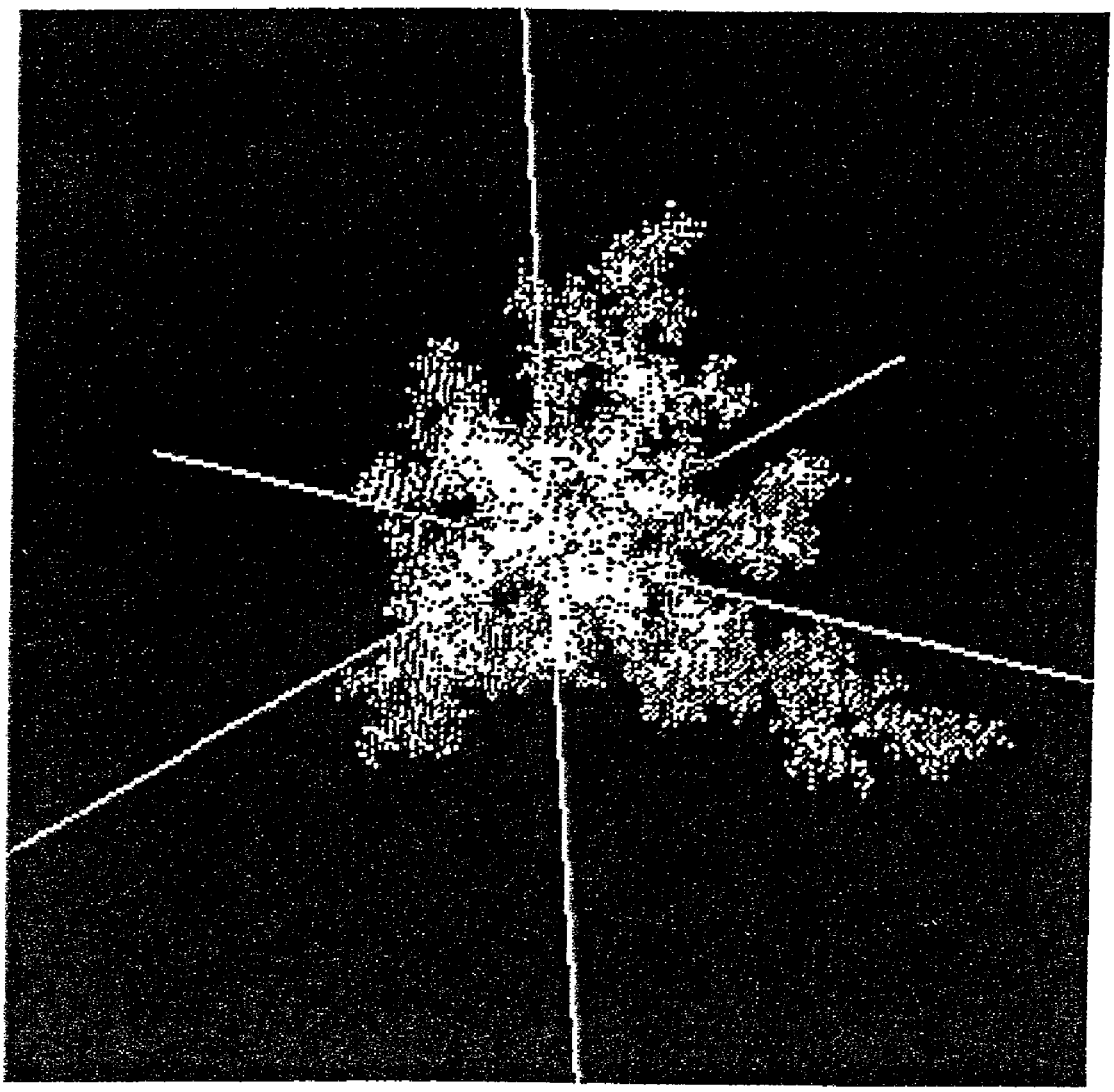
FIG. 2 is a schematic diagram that shows the nebula-like fractal-based complex structure obtained by simulation according to the first embodiment of the invention.
Figure 3:
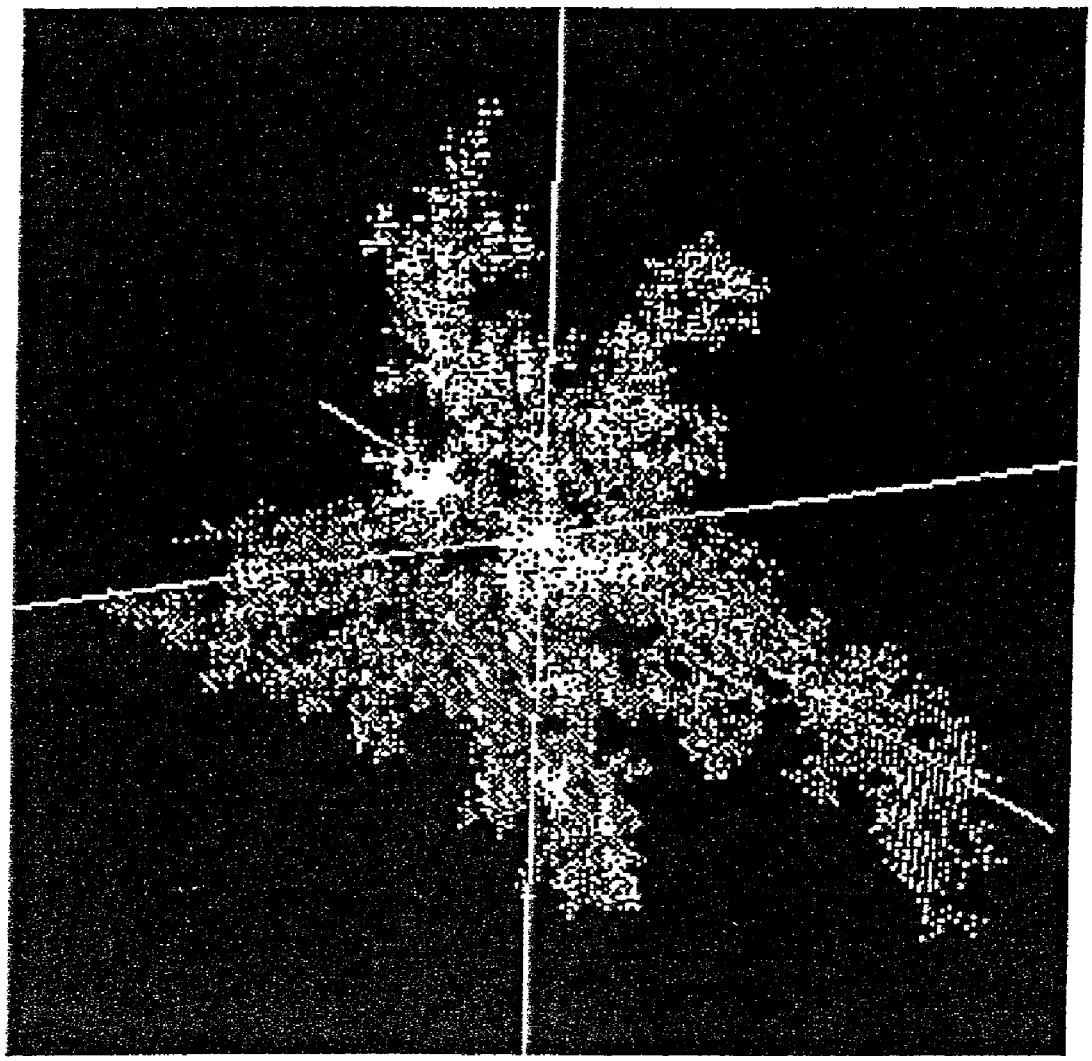
FIG. 3 is a schematic diagram that shows the nebula-like fractal-based complex structure obtained by simulation according to the first embodiment of the invention.

The nebula-like fractal-based complex structure according to the first embodiment is formed by changing the a parameter in accordance with the step n of the above-mentioned growth. That is, the above growth process is progressed using $\alpha_1$ under $1 \leq n \leq \tau_1$, $\alpha_2$ under $\tau_1+1 \leq n \leq \tau_2$, and $\alpha_3$ under $\tau_2+1 \leq n \leq \tau_3$. Simulation is performed below, taking fractal structure having two different fractal dimensions. Those characterized by $\alpha_1 > \alpha_2$ are called nebula-like fractal-based complex structures, and simulation was carried out particularly for cases commonly fixing $\tau_2=10000$, $\alpha_1=2$ and $\alpha_2=0$, and changing $\tau_1$. Results of the simulation are shown in FIGS. 1, 2 and 3. FIG. 1 is for $\tau_1=3000$, FIG. 2 is for $\tau_1=5000$, and FIG. 3 is for $\tau_1=7000$. It will be understood from FIGS. 1, 2 and 3 that regions of a low fractal dimension are formed while violently branching in an early period of growth, and thereafter, a layer of a higher fractal dimension grows on the branched structure. In the regions formed in the latter half of the growth, since the growth progresses entirely, it shows the tendency of smoothing the branched structure formed in the initial stage. This is just a nebula-like fractal-based complex structure.

Figure 4:
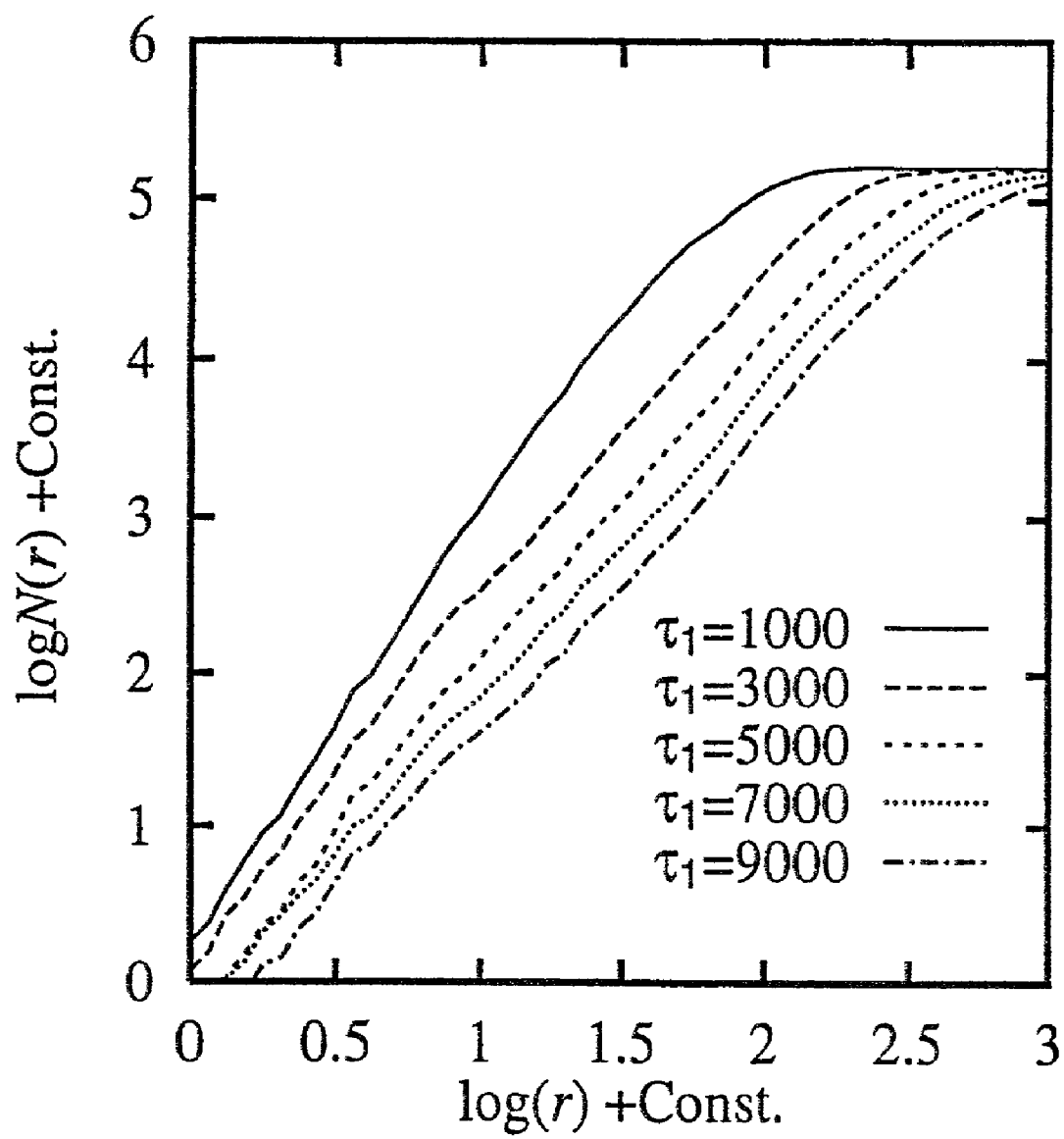
FIG. 4 is a schematic diagram that shows log-log plots of a distance r from the growth origin in the nebula-like fractal-based complex structure according to the first embodiment and the number of growth points N(r) contained in a ball with the radius r.

For the purpose of understanding the structure in greater detail, a calculation process of fractal dimensions is used. Let r represent the distance from the growth origin (0, 0, 0) and N(r) represent the number of growth points contained in a ball with the radius r. Then, using a as a factor of proportionality, if N(r) can be expressed as $$N(r)=ar^{D_f} \qquad (7)$$

then $D_f$ is called the fractal dimension. Therefore, since logarithms of both sides are $$\log N(r)=\log a + D_f \log r \qquad (8)$$

if log-log plots ride on a straight line, the structure can be regarded as a fractal, and its inclination is the fractal dimension. In FIG. 4, log-log plotting was made for various cases obtained by the above-mentioned growth experiment. It will be understood from FIG. 4 that, under $\tau_1=3000$, 5000 and 7000, the fractal dimension in the region with small log(r) is approximately $D_f=2.6$, and the fractal dimension of the region with large log(r) is approximately $D_f=2.0$.

(2) Ferromagnetic Phase Transition in the Nebula-Like Fractal-Based Complex Structure A spin system describing a ferromagnetic structure is defined on the nebula-like fractal-based complex structure defined in (1). A review is made about the lattice point $$r_p = (i_{1,p}, i_{2,p}, i_{3,p}) \in T_n \qquad (9)$$

that is the origin of $T_n$. In Equation (9), p=1, 2, ..., n+1. By placing a spin on a lattice site $r_p \in T_n$, here is taken a spin system that can be described by the following Hamiltonian.

$$H = -\sum_{p,q} J_{p,q} S_p \cdot S_q \qquad (10)$$

$S_p$ is the spin at the p site. A natural model of spin-to-spin interaction $J_{p,q}$ is:

$$J_{p,q} = \begin{cases} 1 & \text{when } |r_p - r_q| = 1 \\ 0 & \text{otherwise} \end{cases} \qquad (11)$$

That is, spin-to-spin interaction exists only between nearest-neighbor sites. For the purpose of calculating spontaneous magnetization M at a finite temperature T, statistical mechanics of an equilibrium system is introduced. A partition function Z is defined as follows.

$$Z = \sum_{\{S_p\}} e^{-H/T} \tag{12}$$

where $\{S_p\}$ in the symbol of the sum pertains to the sum regarding all spin states. Spontaneous magnetization is defined as the statistical average of spins as follows.

$$M = \frac{1}{n+1} \sum_{p=1}^{n+1} \langle S_p \rangle \tag{13}$$

where the expected value $\langle S_p \rangle$ is $$\langle S_p \rangle = \frac{1}{Z} \sum_{\{s_p\}} S_p e^{-H/T} \tag{14}$$

and n+1 is the total number of spins. M is generally a vector quantity in a spin space, but its absolute value M=|M| is calculated.

Here is made a review about an Ising model. In an Ising model, only two states of $$S_p = 1 \text{ or } -1 \tag{15}$$

can exist. Let a mean field approximation be introduced into the Ising model. Spontaneous magnetization of the p-th site is written as $\mu_p$. In this system, since the molecule field varies with site, let it written as $\bar{\mu}_p$. As an assumption of the mean field approximation, here is employed a molecule field that can be written by spontaneous magnetization of the nearest-neighbor site as $$\bar{\mu}_p = \sum_q J_{p,q} \mu_q \tag{16}$$

This assumption simplifies the foregoing Hamiltonian to $$H_{MF} = -\sum_{p=1}^{n+1} \bar{\mu}_p \sigma_p \tag{17}$$

A self-consistent equation ensuring spontaneous magnetization obtained by using a partition function by the simplified Hamiltonian becomes $\mu_p$ results in $$\mu_p = \tan h(\beta \bar{\mu}_p) \tag{18}$$

and by numerically solving this equation, spontaneous magnetization of the system $$M_{Ising} = \frac{1}{n+1} \sum_{j=0}^{n} \mu_j \tag{19}$$

is obtained.

Figure 5:
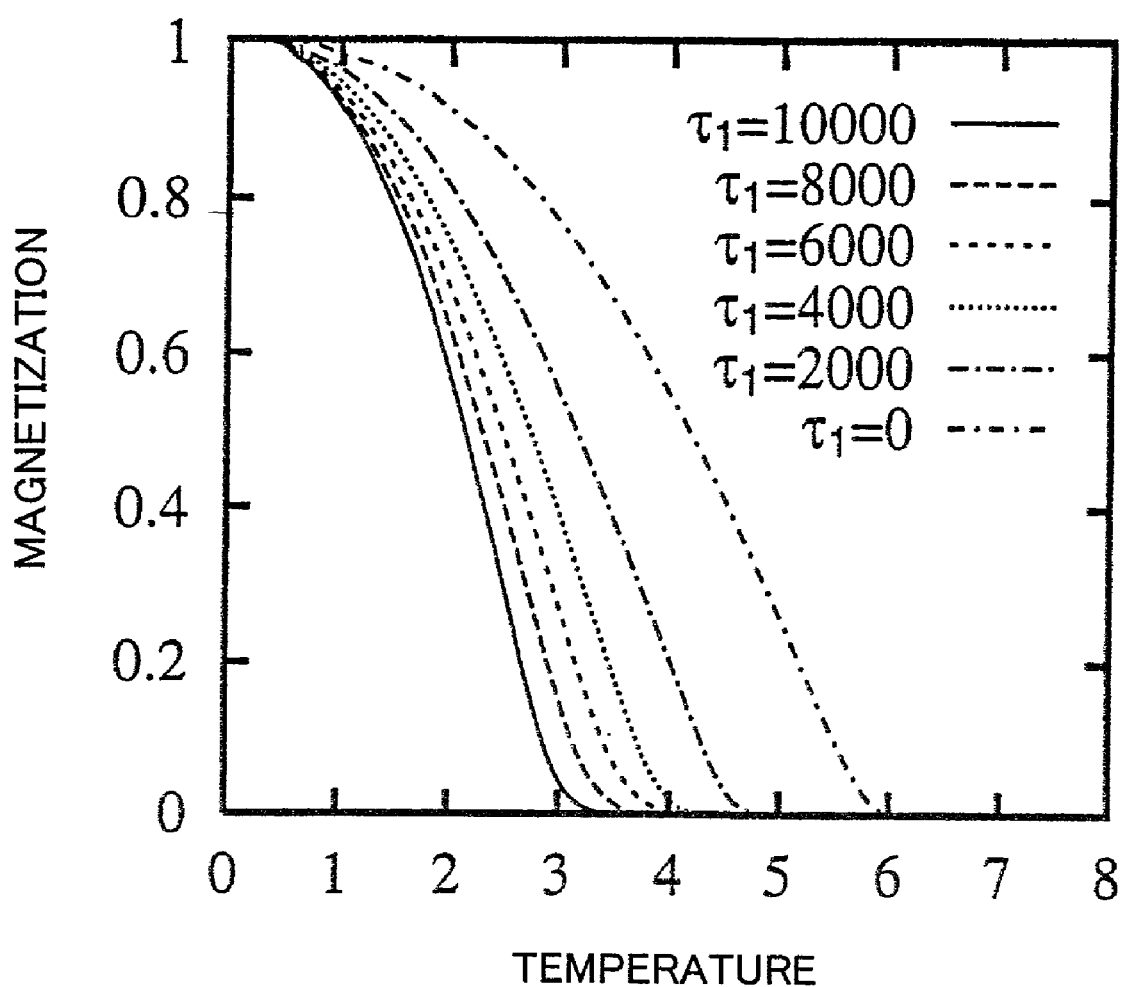
FIG. 5 is a schematic diagram that shows spontaneous magnetization in the nebula-like fractal-based complex structure according to the first embodiment of the invention.

FIG. 5 shows spontaneous magnetization in the nebula-like fractal-based complex structure shown in FIGS. 1, 2 and 3. Note that the structure of $\tau_1=0$ is the same as a simple fractal structure having a single fractal dimension of $\alpha=0$. Further, the structure of $\tau_1=10000$ is the same as a simple fractal structure having a single fractal dimension of $\alpha=2$. It is seen that the critical temperature for spontaneous magnetization to disappear changes with $\tau_1$. As apparent from FIG. 5, in this nebula-like fractal-based complex structure, the form of the magnetization curve does not change, and the critical temperature changes. It has been found, therefore, that various materials exhibiting various magnetic properties can be obtained by changing growth parameters in this nebula-like fractal-based complex structure, which is a fractal-based complex.

Figure 6:
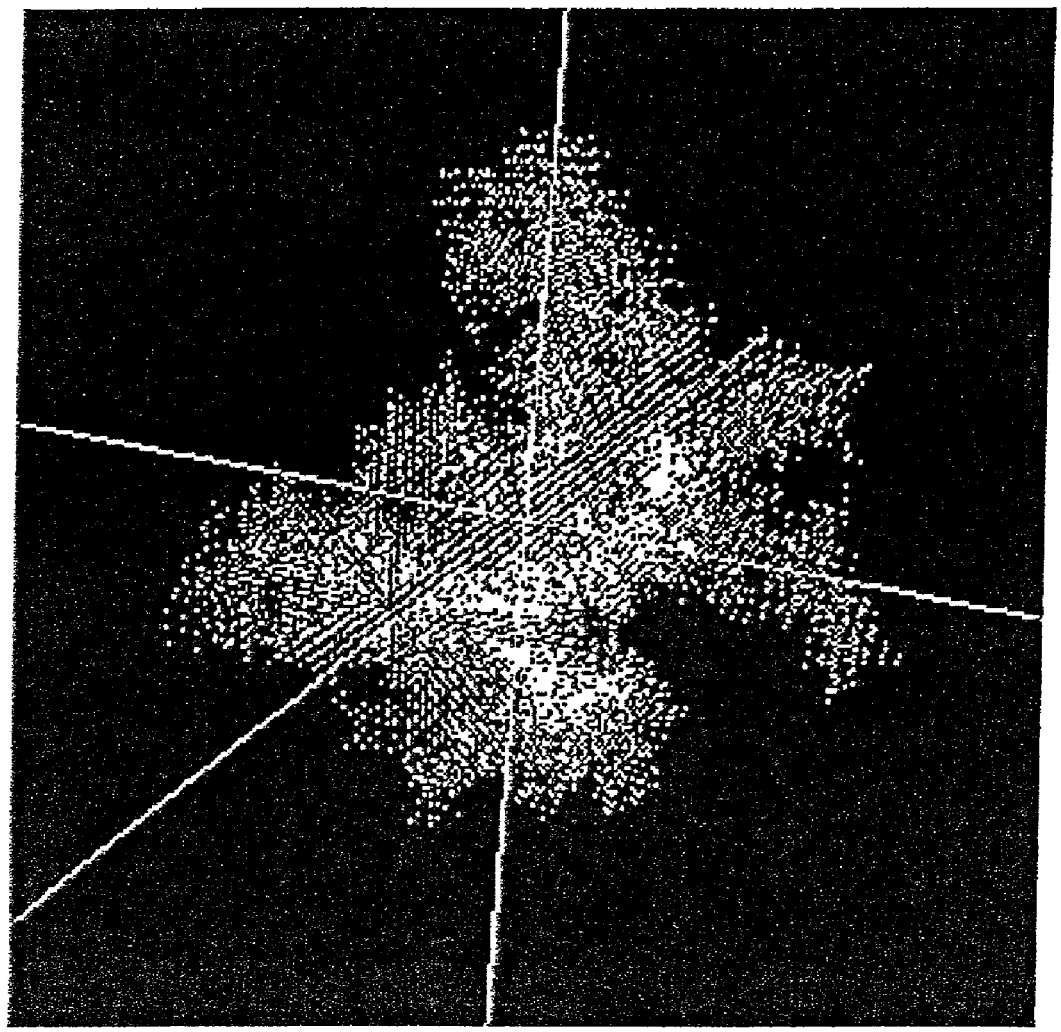
FIG. 6 is a schematic diagram that shows a nebula-like fractal-based complex structure obtained by simulation according to the second embodiment of the invention.
Figure 7:
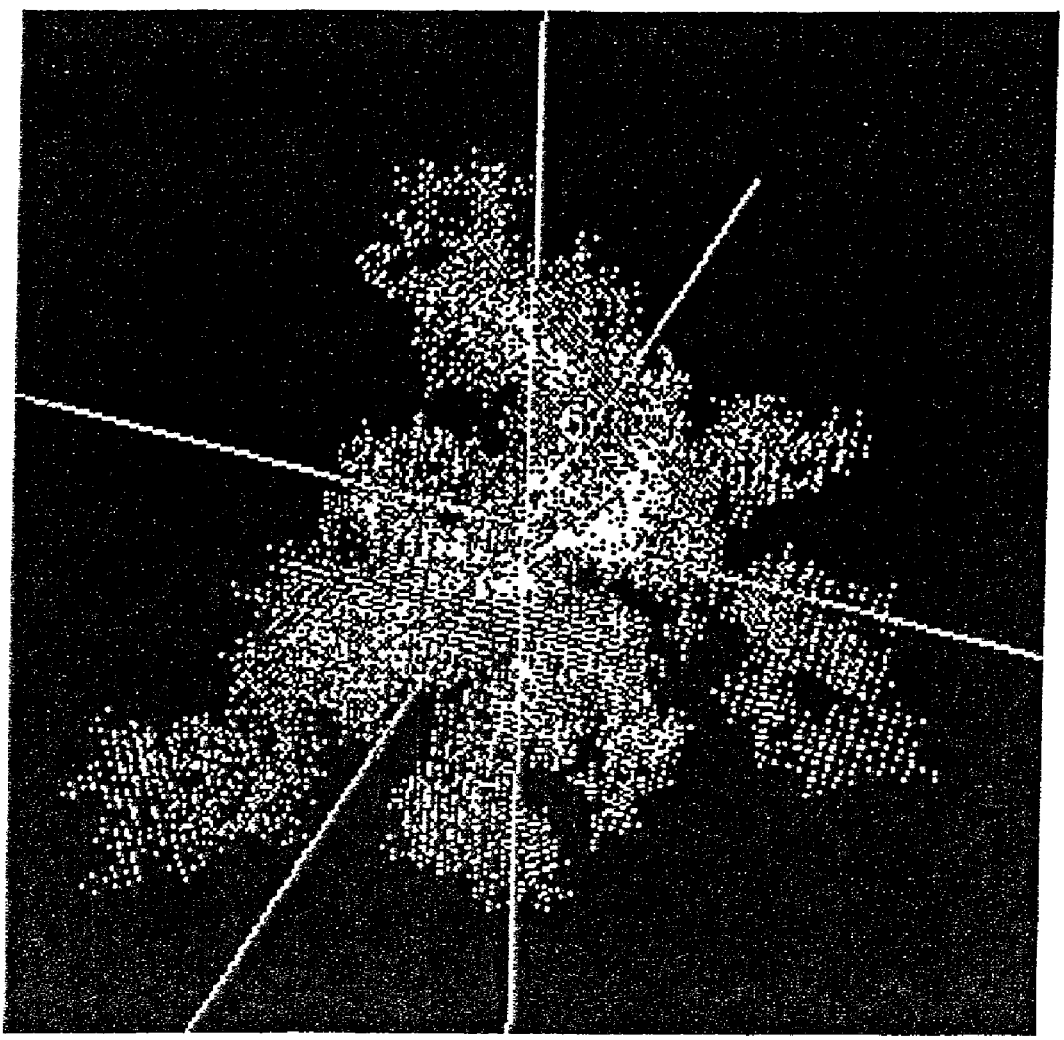
FIG. 7 is a schematic diagram that shows the nebula-like fractal-based complex structure obtained by simulation according to the second embodiment of the invention.
Figure 8:
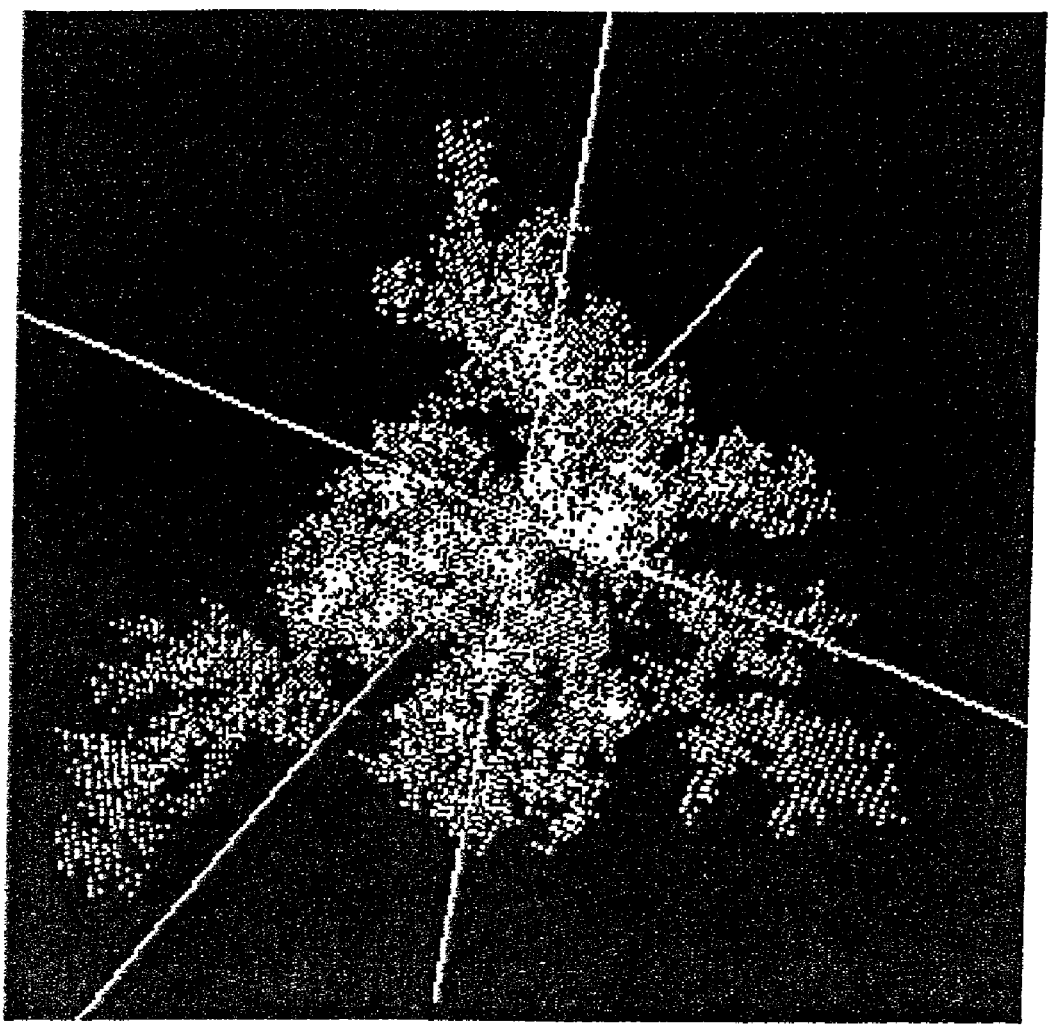
FIG. 8 is a schematic diagram that shows the nebula-like fractal-based complex structure obtained by simulation according to the second embodiment of the invention.
Figure 9:
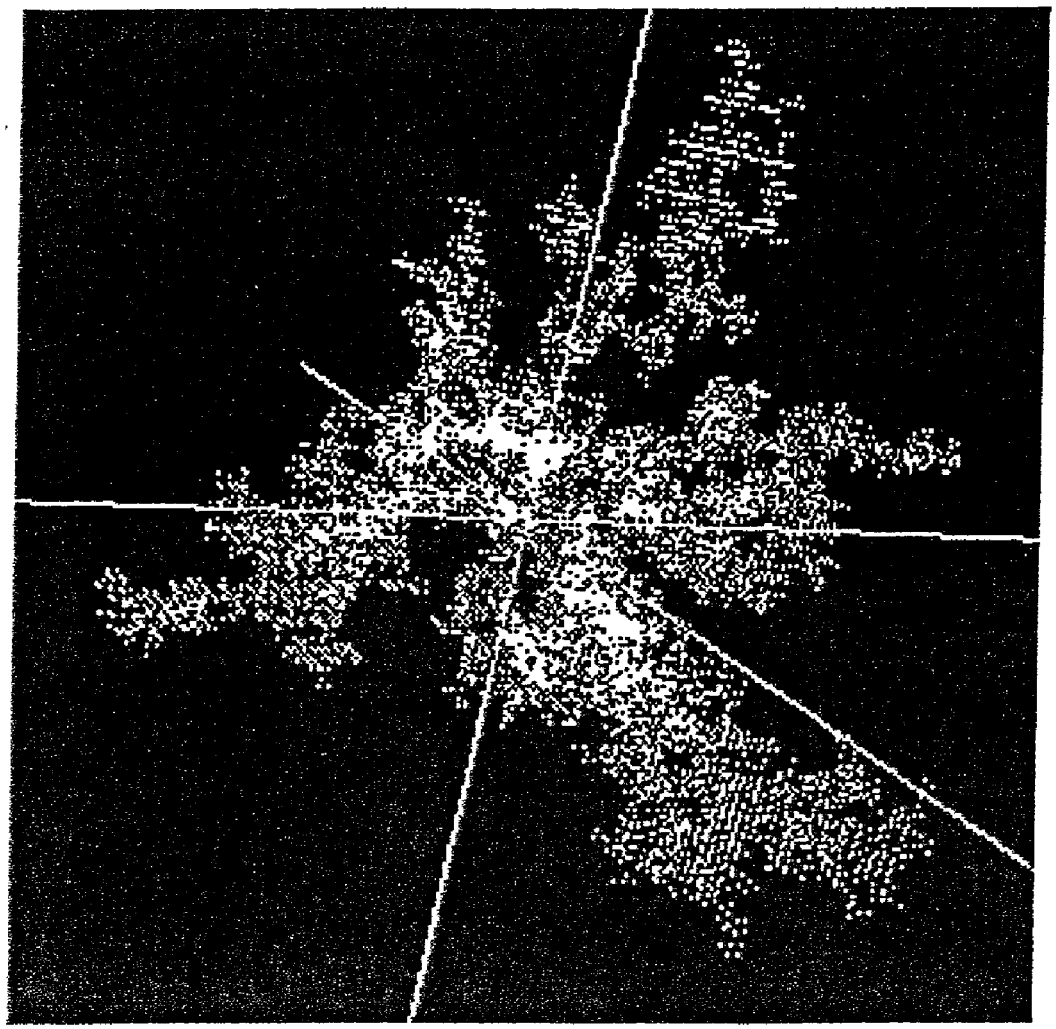
FIG. 9 is a schematic diagram that shows the nebula-like fractal-based complex structure obtained by simulation according to the second embodiment of the invention.

SECOND EMBODIMENT (1) Formation of a Nebula-Like Fractal-Based Complex Structure A method of forming the nebula-like fractal-based complex structure according to the second embodiment is the same as the method of forming the nebula-like fractal-based complex structure according to the first embodiment. Also in the second embodiment, assuming $\alpha_1 > \alpha_2$, commonly fixing $\tau_2=10000$, $\alpha_1=2$ and $\alpha_2=0$, and changing $\tau_1$, simulation is carried out. Results of the simulation are shown in FIGS. 6, 7, 8 and 9. FIG. 6 is for $\tau_1=2000$, FIG. 7 is for $\tau_1=4000$, FIG. 8 is for $\tau_1=6000$, and FIG. 9 is for $\tau_1=8000$. As seen from FIGS. 6, 7, 8 and 9, similarly to the first embodiment, since regions of a low fractal dimension are formed while violently branching in an early period of growth; a layer of a higher fractal dimension thereafter grows on the branched structure; and the growth progresses entirely in the regions formed in the latter half of the growth, it shows the tendency of smoothing the branched structure formed in the initial stage.

(2) Electron System on the Nebula-Like Fractal-Based Complex Structure

A quantum system of a single particle is defined on the nebula-like fractal-based complex structure defined in (1). Assume a lattice site shown below, which is the origin of $T_n$.

$$r_p = (i_{1,p}, i_{2,p}, i_{3,p}) \in T_n \tag{20}$$

where p=0, 1, 2, ..., n. Here is defined an operator $\hat{c}_p^\dagger$ that creates a quantum at a lattice site $r_p \in T_n$. Of course, an anticommutative relation $$\{\hat{c}_p, \hat{c}_q^\dagger\} = \delta_{p,q} \tag{21}$$

is established. Here the Hamiltonian $\hat{H}$ is defined as $$\hat{H} = -\sum_{p,q} t_{p,q} \hat{c}_p^\dagger \hat{c}_q \tag{22}$$

Here is employed as the transfer $t_{p,q}$, $$t_{p,q} = \begin{cases} 1 & \text{when } |r_p - r_q| = 1 \\ 0 & \text{otherwise} \end{cases} \tag{23}$$

In this model, hopping is possible only between nearest-neighbor sites.

When $\in_m$ denotes the eigenenergy of the Hamiltonian $\hat{H}$ and $|m\rangle$ denotes the eigenvector, $$\hat{H}|m\rangle = \in_m |m\rangle \tag{24}$$

where m=0, 1, 2, . . . , n.

First, n+1 quantum levels $\in_m$ are standardized such that spacing between nearest-neighbor levels becomes 1 in average. That is, $$\omega_j = \in_j - \in_{j-1} \tag{25}$$

However, when j=1, 2, . . . , n, by using $$\overline{\omega} = \frac{1}{n} \sum_{j=1}^{n} \omega_j \tag{26}$$

it is converted into new levels $$\in_0 = 0$$

$$\varepsilon_m = \frac{1}{\overline{\omega}} \sum_{j=1}^{m} \omega_j = \sum_{j=1}^{m} \Omega_j \tag{28}$$

Here, $$\Omega_j = \frac{\omega_j}{\overline{\omega}} \tag{29}$$

The density of states of the system is defined by $$\rho(\varepsilon) = \frac{1}{n+1} \sum_{m=0}^{n+1} \delta(\varepsilon - \varepsilon_m) \tag{30}$$

and the staircase function $$\lambda(\varepsilon) = \int_{-\infty}^{\varepsilon} d\eta \rho(\eta) \tag{31}$$

is calculated. The staircase function obtained is converted by a technique called "unfolding" such that the density of states becomes constant in average. By using quantum levels obtained in this manner, nearest-neighbor level spacing distribution P(s) and $\Delta_3$ statistics of Dyson and Metha are calculated as quantum level statistics. As taught in literatures ((36) (37)), by using these statistics, it can be detected whether quantum chaos has been generated or not. It is also known that a quantum chaotic system is sensitive to perturbation from outside similarly to the classical chaotic system, and analysis of quantum chaos is important as a polestar of designs of non-linear materials.

In case of an integrable system, nearest-neighbor level spacing distribution P(s) and $\Delta_3$ statistics are those of Poisson distribution $$P_p(s) = e^{-s} \tag{32}$$

$$\Delta_3(n) = \frac{n}{15} \tag{33}$$

In case of a quantum chaotic system, it becomes GOE (Gaussian orthogonal ensemb) distribution $$P_{GOE}(s) = \frac{\pi s}{2} e^{-\pi s^2/4} \tag{34}$$

$$\Delta_3(n) = \frac{1}{\pi^2} \left[ \log(2\pi n) + \gamma - \frac{\pi^2}{8} - \frac{5}{4} \right] + O(n^{-1}) \tag{35}$$

where $\gamma$ is the Euler's constant.

Figure 10:
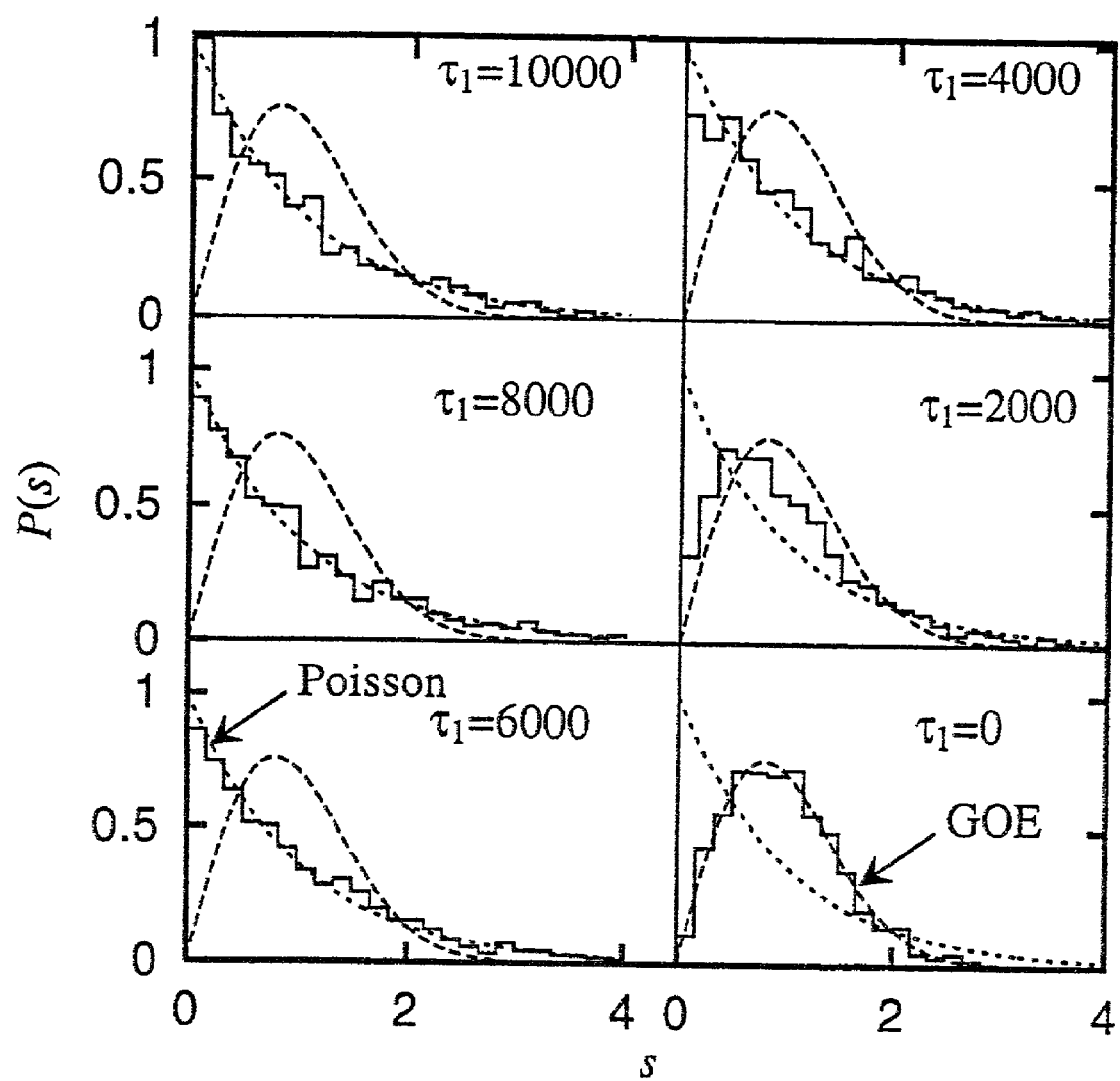
FIG. 10 is a schematic diagram that shows quantum level statistics in the nebula-like fractal-based complex structure according to the second embodiment of the invention.
Figure 11:
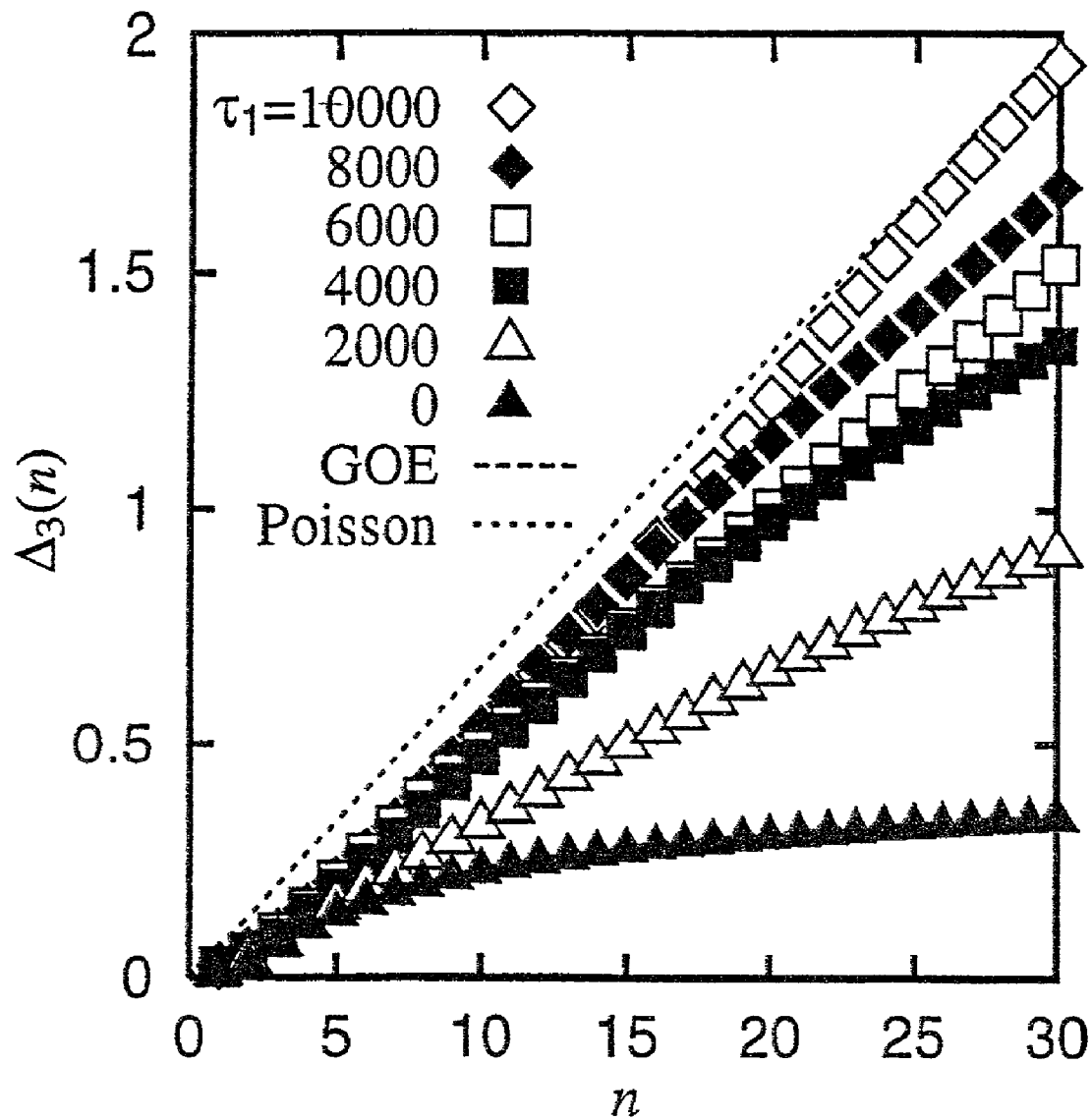
FIG. 11 is a schematic diagram that shows quantum level statistics in the nebula-like fractal-based complex structure according to the second embodiment of the invention.

Since the nebula-like fractal-based complex structure analyzed here is one obtained by growth experiment of n=10000, this quantum system includes n+1=10001 eigenstates. Based on energy eigenvalues concerning 1501 states from the 510-th to 2001-th eigenstates from the ground state, among those eigenstates, the following quantum level statistics was calculated. FIGS. 10 and 11 show quantum level statistics in a nebula-like fractal-based complex structure of $(\alpha_1, \alpha_2) = (0, 2)$. FIG. 10 shows P(s) and FIG. 11 shows $\Delta_3$ statistics. In case of $\tau_1 = 10000$, the structure is the same as the simple fractal of $\alpha = 2$, and the fractal dimension is near 2 ($D_f \sim 2.16$). Therefore, the system behaves as an integrable system. In this case, the quantum level statistics is that of Poisson distribution. On the other hand, in case of $\tau_1 = 0$, the structure is the same as the simple fractal of $\alpha = 0$, and the fractal dimension is near 3 ($D_f \sim 2.91$). Therefore, the system behaves as a quantum chaotic system, and the quantum level statistics is that of GOE distribution. As shown in FIGS. 10 and 11, as $\tau_1$ increases from 0 to 10000, the quantum level statistics changes from GOE distribution to Poisson distribution. Therefore, wide kinds of quantum systems can be realized by setting $\tau_1$ at predetermined values.

Through a review of the changes in quantum level statistics in the nebula-like fractal-based complex structure, it is recognized that the quantum chaotic properties begin to decrease with a relatively small value of $\tau_1$. This suggests that the branching property still remains sufficiently in the complex structure obtained and the chaotic property of the quantum chaos is weakened. Taking it into consideration, it is recognized that a plurality of regions conjoin in the nebula-like fractal-based complex structure and form a complex structure as a whole.

Figure 12:
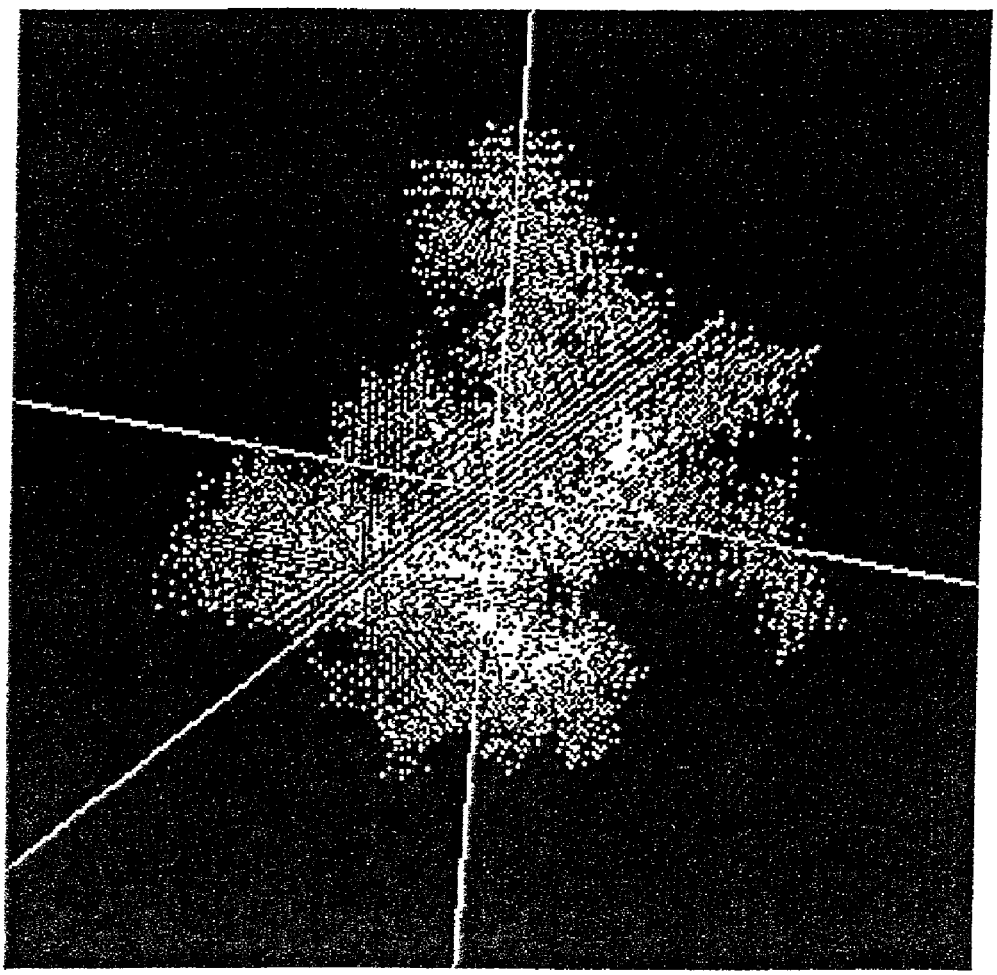
FIG. 12 is a schematic diagram that shows a nebula-like fractal-based complex structure obtained by simulation according to the third embodiment of the invention.
Figure 13:
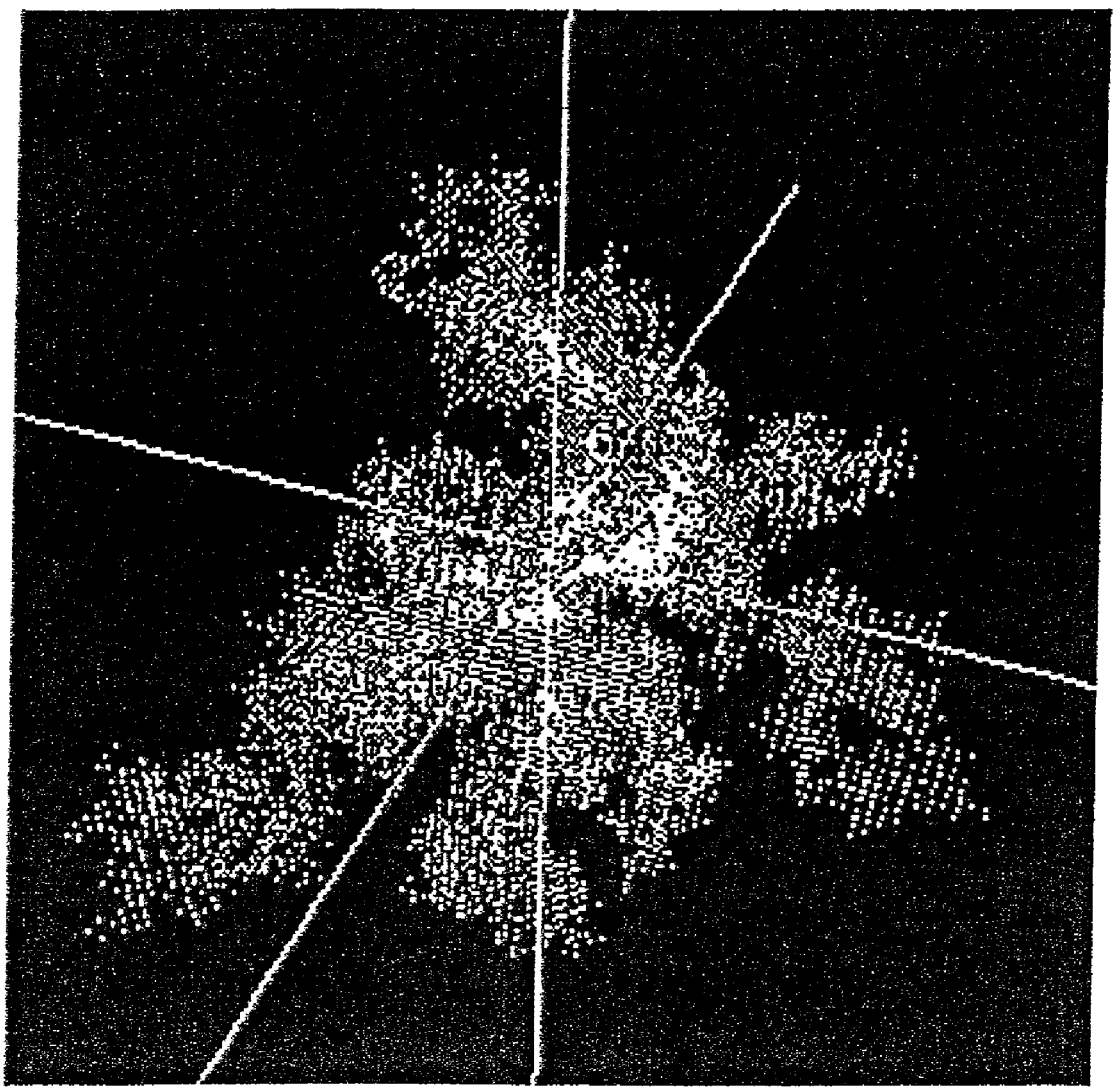
FIG. 13 is a schematic diagram that shows the nebula-like fractal-based complex structure obtained by simulation according to the third embodiment of the invention.
Figure 14:
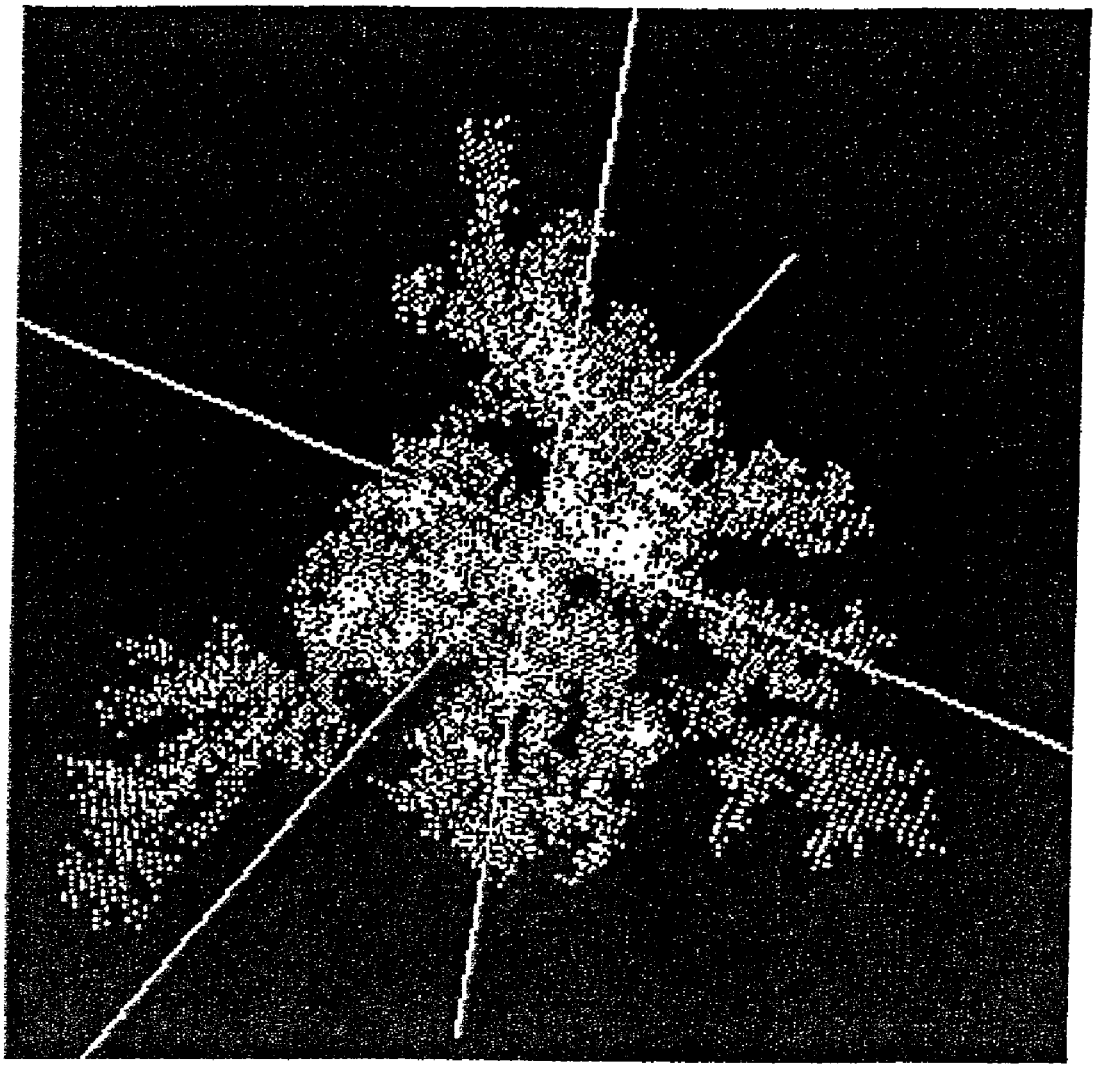
FIG. 14 is a schematic diagram that shows the nebula-like fractal-based complex structure obtained by simulation according to the third embodiment of the invention.
Figure 15:
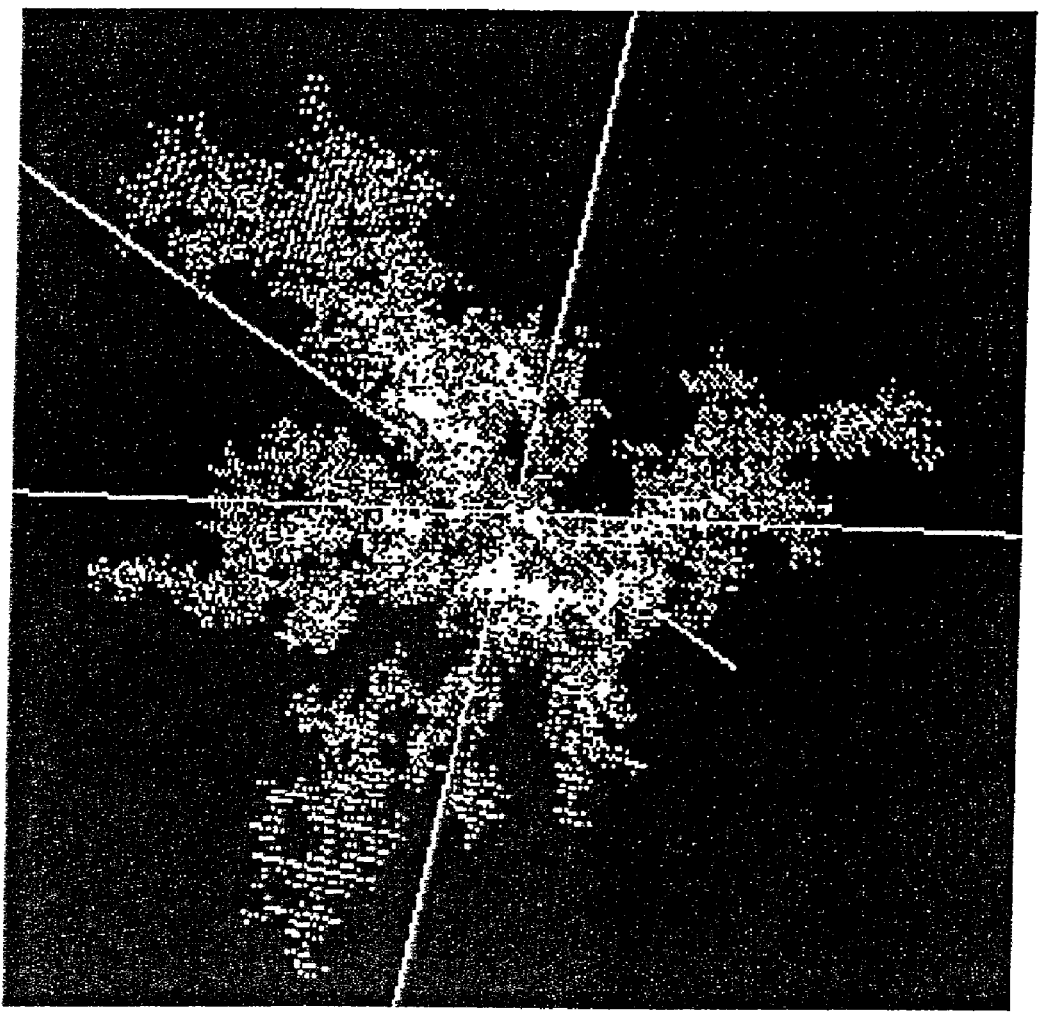
FIG. 15 is a schematic diagram that shows the nebula-like fractal-based complex structure obtained by simulation according to the third embodiment of the invention.

THIRD EMBODIMENT (1) Formation of a Nebula-Like Fractal-Based Complex Structure A method of forming the nebula-like fractal-based complex structure according to the third embodiment is the same as the method of forming the nebula-like fractal-based complex structure according to the first embodiment. In the third embodiment, assuming $\alpha_1 > \alpha_2$, commonly fixing $\tau_2=10000$, $\alpha_1=2$ and $\alpha_2=0$, and changing $\tau_1$, simulation is carried out. Results of the simulation are shown in FIGS. 12, 13, 14 and 15. FIG. 12 is for $\tau_1=2000$, FIG. 13 is for $\tau_1=4000$, FIG. 14 is for $\tau_1=6000$, and FIG. 15 is for $\tau_1=8000$. As seen from FIGS. 12, 13, 14 and 15, similarly to the first embodiment, since regions of a low fractal dimension are formed while violently branching in an early period of growth; a layer of a higher fractal dimension thereafter grows on the branched structure; and the growth progresses entirely in the regions formed in the latter half of the growth, it shows the tendency of smoothing the branched structure formed in the initial stage.

(2) Electron System on the Nebula-Like Fractal-Based Complex Structure

A quantum system of a single particle is defined on the nebula-like fractal-based complex structure defined in (1). Assume a lattice site shown below, which is the origin of $T_n$.

$$r_p = (i_{1,p}, i_{2,p}, i_{3,p}) \in T_n \tag{36}$$

where p=1, 2, ..., n+1. Here is defined an operator $\hat{c}_p^\dagger$ that creates a quantum at a lattice site $r_p \in T_n$. Of course, an anticommutative relation $$\{\hat{c}_p, \hat{c}_q^\dagger\} = \delta_{p,q} \tag{37}$$

is established. Here the Hamiltonian $\hat{H}$ is defined as $$\hat{H} = -\sum_{p,q} t_{p,q} \hat{c}_p^\dagger \hat{c}_q \tag{38}$$

Here is employed as the transfer $t_{p,q}$, $$t_{p,q} = \begin{cases} 1 & \text{when} \quad |r_p - r_q| = 1 \\ 0 & \text{otherwise} \end{cases} \tag{39}$$

where $\theta_{p,q} = -\theta_{q,p}$ is a random real number satisfying $$0 < \theta_{p,q} < 2\pi \tag{40}$$

In this model, hopping is possible only between nearest-neighbor sites. Then, along with the hopping, phase factors $\theta_{p,q}$, which are random from one site to another, are added. If the phase factor is integrated in the loop making one turn around a lattice point, a magnetic flux passing through the loop is obtained. This means a magnetic field is locally introduced to the random distribution of $0 < \theta_{p,q} < 2\pi$. This magnetic field is absolutely random in both intensity and direction, and in spatial average, it becomes a zero magnetic field and never breaks the fractal property of the system.

When $\in_m$ denotes the eigenenergy of the Hamiltonian $\hat{H}$ and |m> denotes the eigenvector, $$\hat{H}|m\rangle = \in_m |m\rangle \tag{41}$$

where m=0, 1, 2, ..., n.

First, n+1 quantum levels $\in_m$ are standardized such that spacing between nearest-neighbor levels becomes 1 in average. That is, $$\omega_j = \in_j - \in_{j-1} \tag{42}$$

However, when j=1, 2, ..., n, by using $$\bar{\omega} = \frac{1}{n}\sum_{j=1}^{n} \omega_j \tag{43}$$

it is converted into new levels $$\varepsilon_0 = 0 \tag{44}$$

$$\varepsilon_m = \frac{1}{\bar{\omega}}\sum_{j=1}^{m} \omega_j = \sum_{j=1}^{m} \Omega_j \tag{45}$$

Here, $$\Omega_j = \frac{\omega_j}{\bar{\omega}} \tag{46}$$

The density of states of the system is defined by $$\rho(\varepsilon) = \frac{1}{n+1}\sum_{m=1}^{n+1} \delta(\varepsilon - \varepsilon_m) \tag{47}$$

and the staircase function $$\lambda(\varepsilon) = \int_{-\infty}^{\varepsilon} d\eta \rho(\eta) \tag{48}$$

is calculated. The staircase function obtained is converted by a technique called "unfolding" such that the density of states becomes constant in average. By using quantum levels obtained in this manner, nearest-neighbor level spacing distribution P(s) and $\Delta_3$ statistics of Dyson and Metha are calculated as quantum level statistics. As taught in a literature ((36) and (37) shown above), by using these statistics, it can be detected whether quantum chaos has been generated or not. It is also known that a quantum chaotic system is sensitive to perturbation from outside similarly to the classical chaotic system, and analysis of quantum chaos is important as a polestar of designs of non-linear materials.

In case of an integrable system, nearest-neighbor level spacing distribution P(s) and $\Delta_3$ statistics are those of Poisson distribution $$P_P(s) = e^{-s} \tag{49}$$

$$\Delta_3(n) = \frac{n}{15} \tag{50}$$

In case of a quantum chaotic system under a magnetic field, it becomes GUE (Gaussian unitary ensemble) distribution $$P_{GUE}(s) = \frac{32s^2}{\pi^2} e^{-4s^2/\pi} \tag{51}$$

$$\Delta_3(n) = \frac{1}{2\pi^2} \left[ \log(2\pi n) + \gamma - \frac{5}{4} \right] + O(n^{-1}) \tag{52}$$

where $\gamma$ is the Euler's constant.

Figure 16:
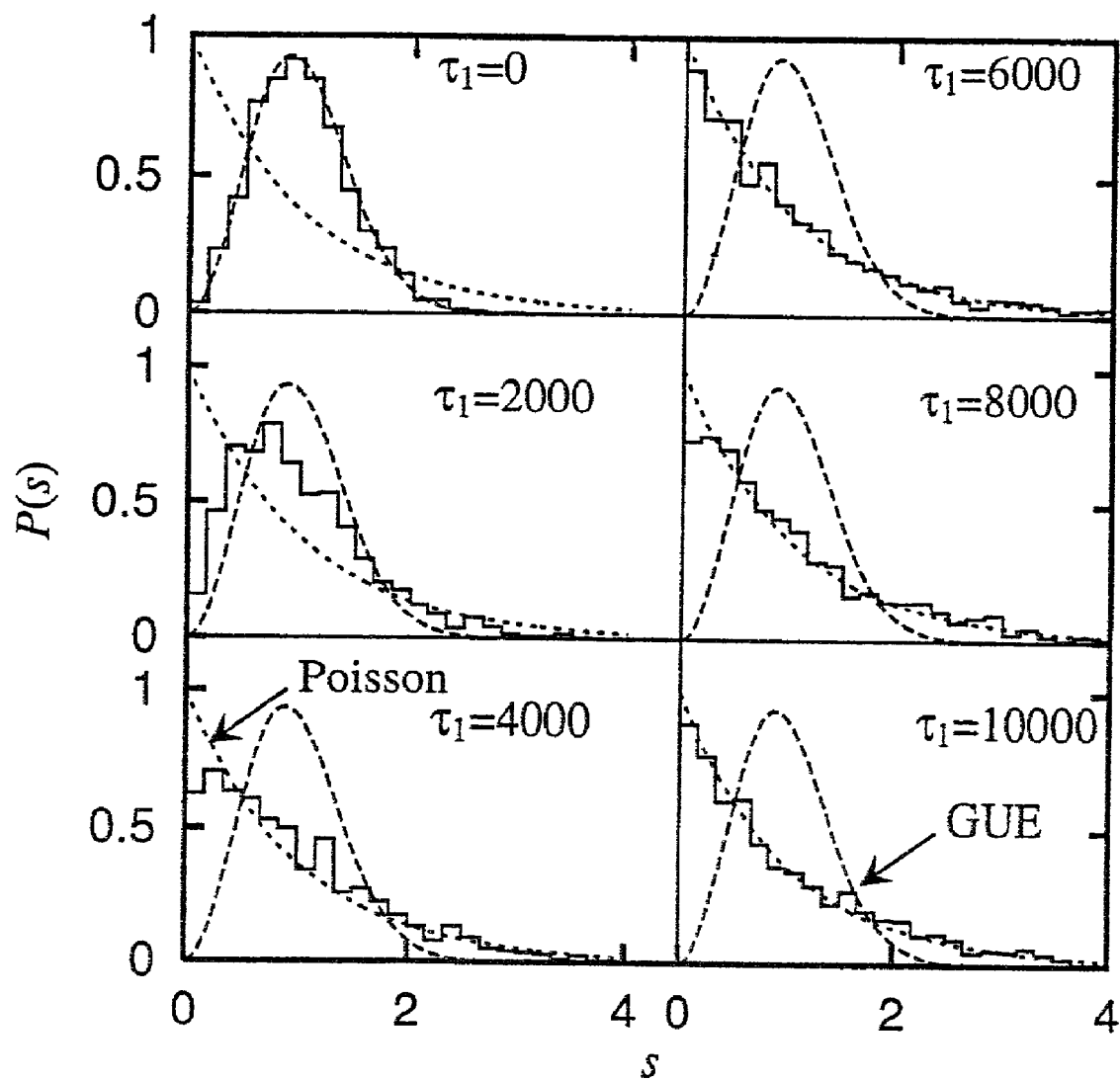
FIG. 16 is a shematic diagram that shows quantum level statistics in the nebula-like fractal-based complex structure according to the third embodiment of the invention.
Figure 17:
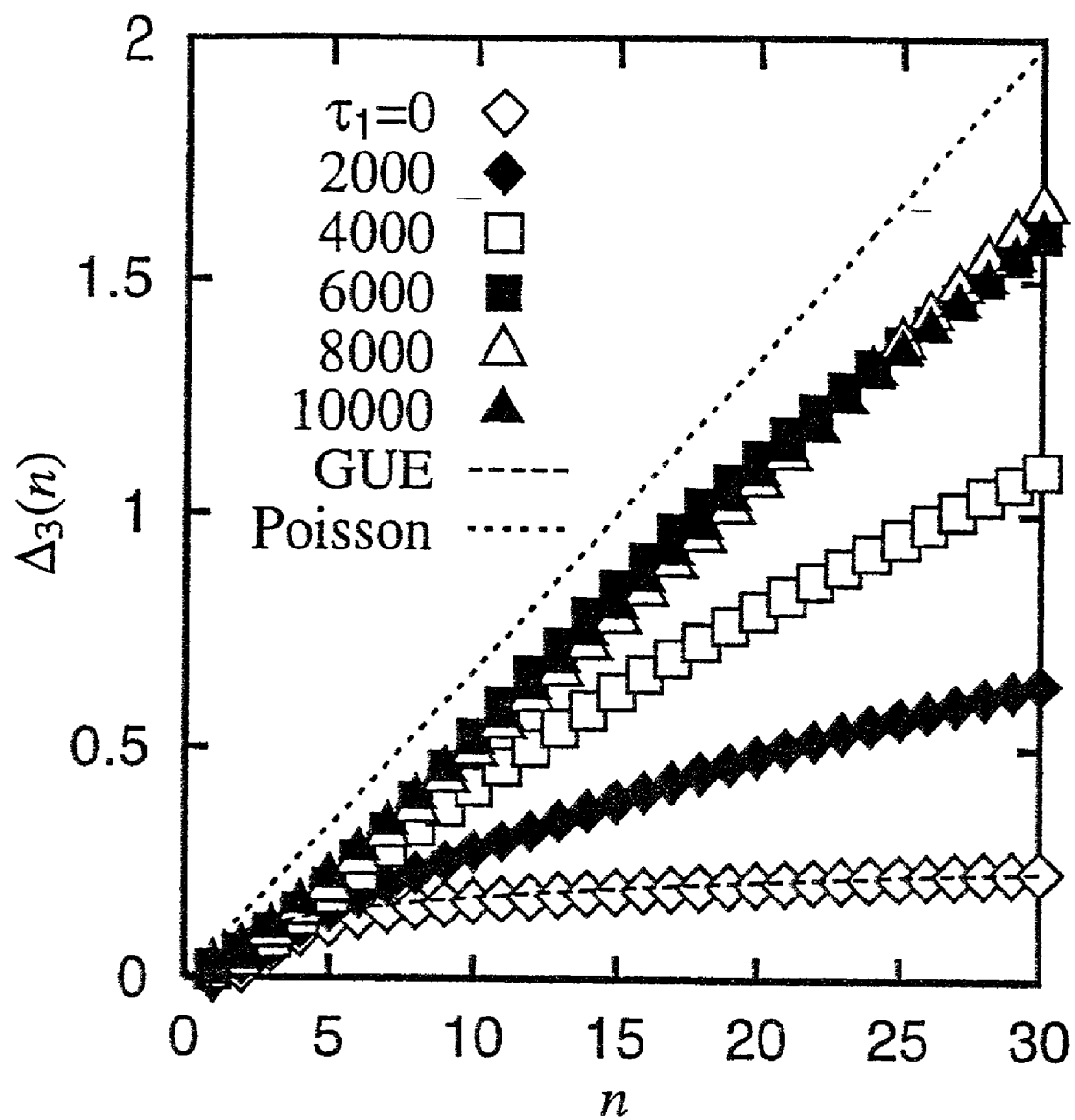
FIG. 17 is a shematic diagram that shows quantum level statistics in the nebula-like fractal-based complex structure according to the third embodiment of the invention.

Since the nebula-like fractal-based complex structure analyzed here is one obtained by growth experiment of n=10000, this quantum system includes n+1=10001 eigenstates. Based on energy eigenvalues concerning 1501 states from the 510-th to 2001-th eigenstates from the ground state, among those eigenstates, the following quantum level statistics was calculated. FIGS. 16 and 17 show quantum level statistics in a nebula-like fractal-based complex structure under a random magnetic field of $(\alpha_1, \alpha_2)=(2, 0)$. FIG. 16 shows P(s) and FIG. 17 shows $\Delta_3$ statistics. In case of $\tau_1=10000$, the structure is the same as the simple fractal of $\alpha=2$, and the fractal dimension is near $2(D_f\sim2.16)$. Therefore, the system behaves as an integrable system. In this case, the quantum level statistics is that of Poisson distribution. On the other hand, in case of $\tau_1=0$, the structure is the same as the simple fractal of $\alpha=0$, and the fractal dimension is near $3(D_f\sim2.91)$. Therefore, the system behaves as a quantum chaotic system, and the quantum level statistics is that of GUE distribution. As shown in FIGS. 16 and 17, as $\tau_1$ increases from 0 to 10000, the quantum level statistics changes from GUE distribution to Poisson distribution. Therefore, wide kinds of quantum systems can be realized by setting $\tau_1$ at predetermined values.

FOURTH EMBODIMENT (1) Formation of a Nebula-Like Fractal-Based Complex Structure A method of forming the nebula-like fractal-based complex structure according to the fourth embodiment is the same as the method of forming the nebula-like fractal-based complex structure according to the first embodiment. As growth conditions, however, while fixing $\tau_1=5000$ and $\tau_2=10000$, $(\alpha_1, \alpha_2)$ was changed variously within the range satisfying $\alpha_1>\alpha_2$ for carrying out numerical experiment of growth.

Figure 18:
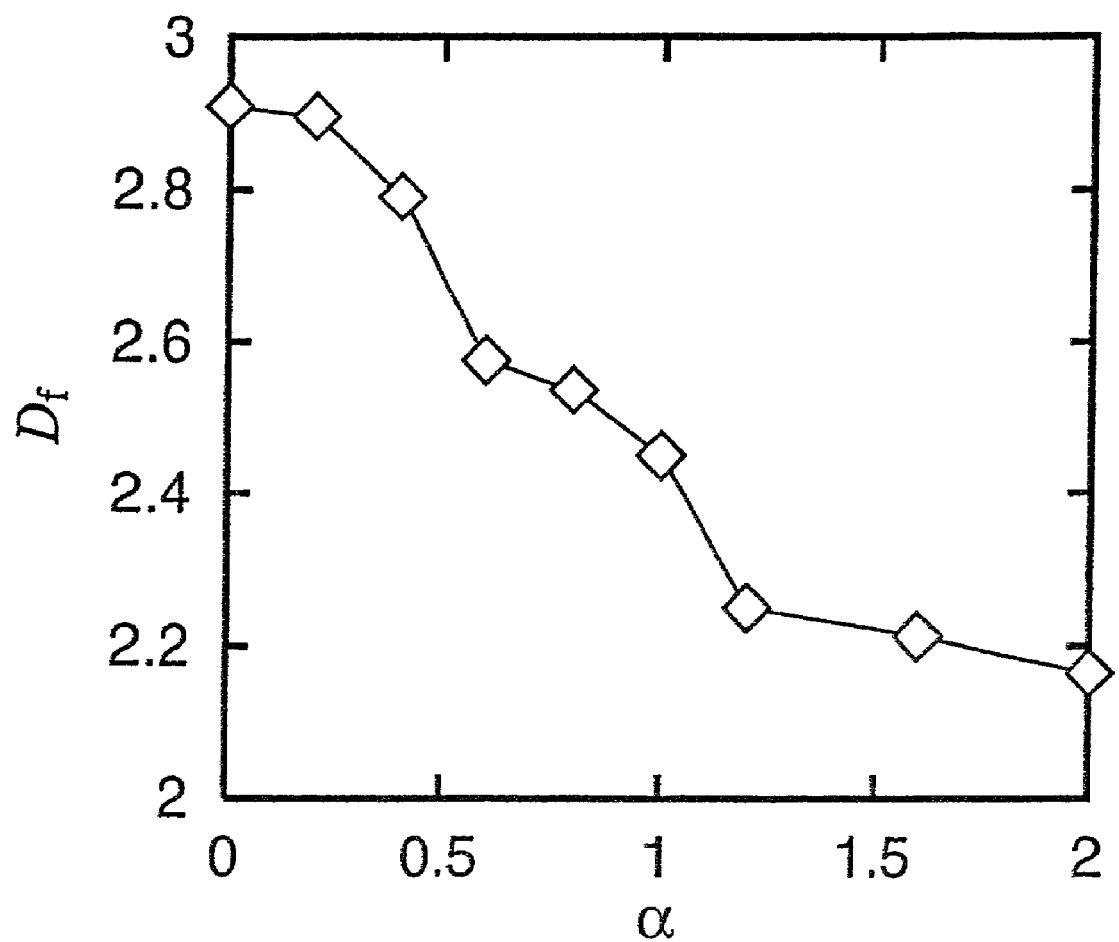
FIG. 18 is a shematic diagram that shows a relation between $\alpha$ and the fractal dimension $D_f$ in a simplex fractal structure.

Regarding methods of forming a single fractal structure by a dielectric breakdown model, it is known that changes of a invite changes of the fractal dimension $D_f$ of the fractal structure to be formed. Fractal dimensions having obtained by simulation are shown in FIG. 18 (see Literature (34)). As apparent from FIG. 18, as $\alpha$ increases, $D_f$ decreases. When $\alpha<0.5$, $D_f>2.7$ is obtained. When $\alpha>1$, $D_f<2.3$ is obtained.

(2) Ferromagnetic Phase Transition in a Nebula-Like Fractal-Based Complex Structure A spin system describing a ferromagnetic structure is defined on the nebula-like fractal-based complex structure defined in (1). A review is made about the lattice point $$r_p = (i_{1,p}, i_{2,p}, i_{3,p}) \in T_n \tag{53}$$

that is the origin of $T_n$. In Equation 53, p=0, 1, 2, ..., n. By placing a spin on a lattice site $r_p \in T_n$, here is taken a spin system that can be described by the following Hamiltonian.

$$H = -\sum_{p,q} J_{p,q} S_p \cdot S_q \tag{54}$$

$S_p$ is the spin at the p site. A natural model of spin-spin interaction $J_{p,q}$ is:

$$J_{p,q} = \begin{cases} 1 & \text{when } |r_p - r_q| = 1 \\ 0 & \text{otherwise} \end{cases} \tag{55}$$

That is, spin-spin interaction exists only between nearest-neighbor sites. For the purpose of calculating spontaneous magnetization M at a finite temperature T, statistical mechanics of an equilibrium system is introduced. A partition function Z is defined as follows.

$$Z = \sum_{\{S_p\}} e^{-H/T} \tag{56}$$

where $\{S_p\}$ in the symbol of the sum pertains to the sum regarding all spin states. Spontaneous magnetization is defined as the statistical average of spins as follows.

$$M = \frac{1}{n+1} \sum_{p=1}^{n} \langle S_p \rangle \tag{57}$$

where the expected value $\langle S_p \rangle$ is $$\langle S_p \rangle = \frac{1}{Z} \sum_{\{S_p\}} S_p e^{-H/T} \tag{58}$$

and n+1 is the total number of spins. M is generally a vector quantity in a spin space, but its absolute value M=|M| is calculated.

Here is made a review about an Ising model. In an Ising model, only two states of $$S_p = 1 \text{ or } -1 \tag{59}$$

can exist. Let a mean field approximation be introduced into the Ising model. Spontaneous magnetization of the p-th site is written as $\mu_p$. In this system, since the molecule field varies with site, let it written as $\bar{\mu}_p$. As an assumption of the mean field approximation, here is employed a molecule field that can be written by spontaneous magnetization of the nearest-neighbor site as $$\bar{\mu}_p = \sum_q J_{p,q} \mu_q \qquad (60)$$

This assumption simplifies the foregoing Hamiltonian to $$H_{MF} = -\sum_{P=0}^{n+1} \bar{\mu}_p \sigma_p \qquad (61)$$

A self-consistent equation ensuring spontaneous magnetization obtained by using a partition function by the simplified Hamiltonian becomes $\mu_p$ results in $$\mu_p = \tan h(\beta \bar{\mu}_p) \qquad (62)$$

and by numerically solving this equation, spontaneous magnetization of the system $$M_{Ising} = \frac{1}{n+1} \sum_{j=0}^{n} \mu_j \qquad (63)$$

is obtained.

Figure 19:
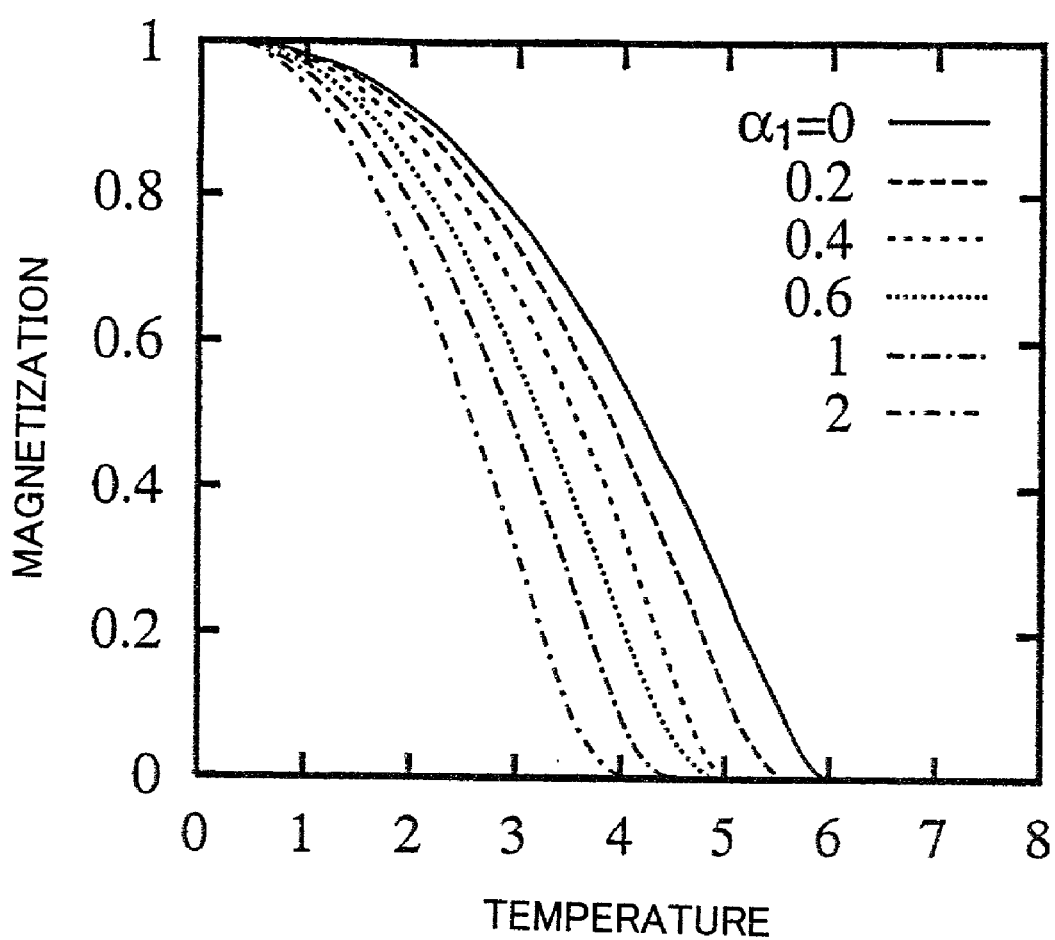
FIG. 19 is a schematic diagram that shows spontaneous magnetization in a nebula-like fractal-based complex structure according to the fourth embodiment of the invention.

FIG. 19 shows spontaneous magnetization in case of $\alpha_2=0$ fixed and $\alpha_1$ changed. Here, $\alpha_1=0$ corresponds to spontaneous magnetization in the same structure as the simple fractal of $\alpha=0$. As shown in FIG. 19, as $\alpha_1$ increases, the phase transition temperature of the nebula-like fractal-based complex structure is remarkably changed.

Figure 20:
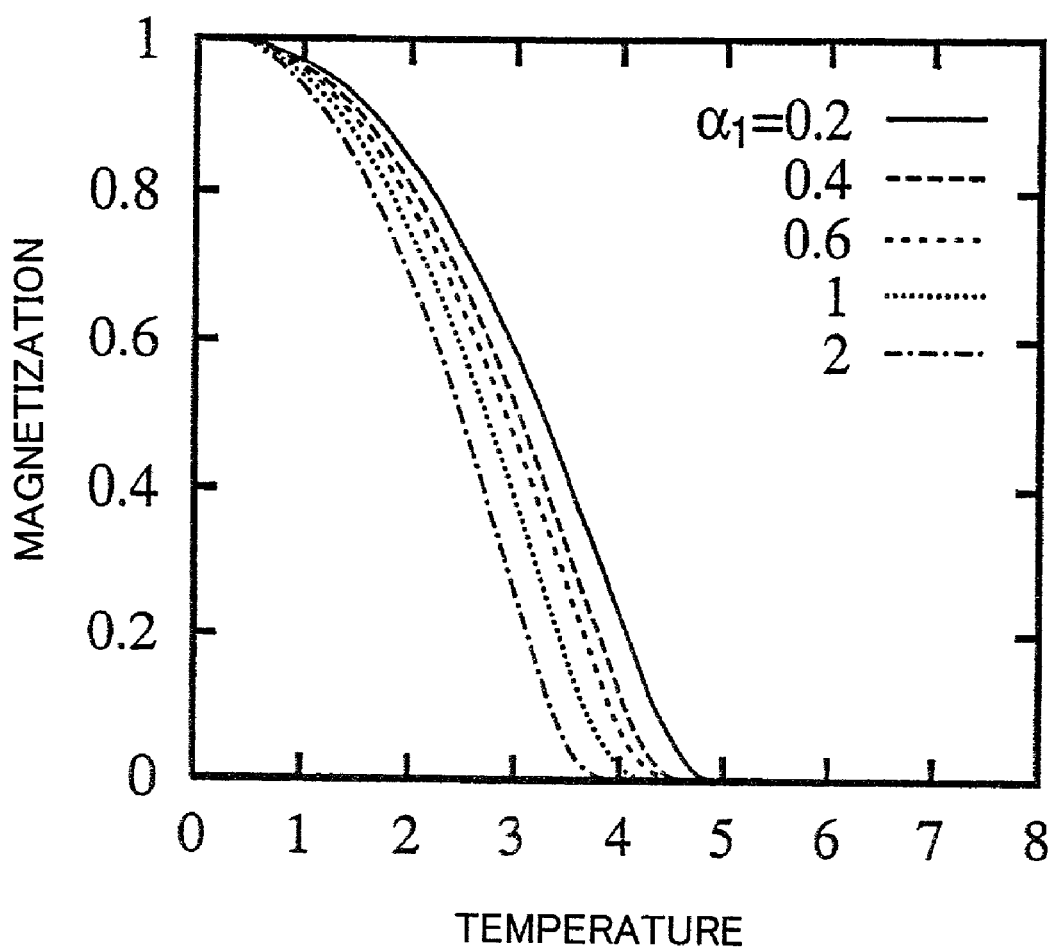
FIG. 20 is a schematic diagram that shows spontaneous magnetization in the nebula-like fractal-based complex structure according to the fourth embodiment of the invention.

FIG. 20 shows spontaneous magnetization in case of $\alpha_2=0.2$ fixed and $\alpha_1$ changed. Here, $\alpha_1=0.2$ corresponds to spontaneous magnetization in the same structure as the simple fractal of $\alpha=0.2$. The modulatory property is smaller as compared with FIG. 19, but still remains significantly large.

Figure 21:
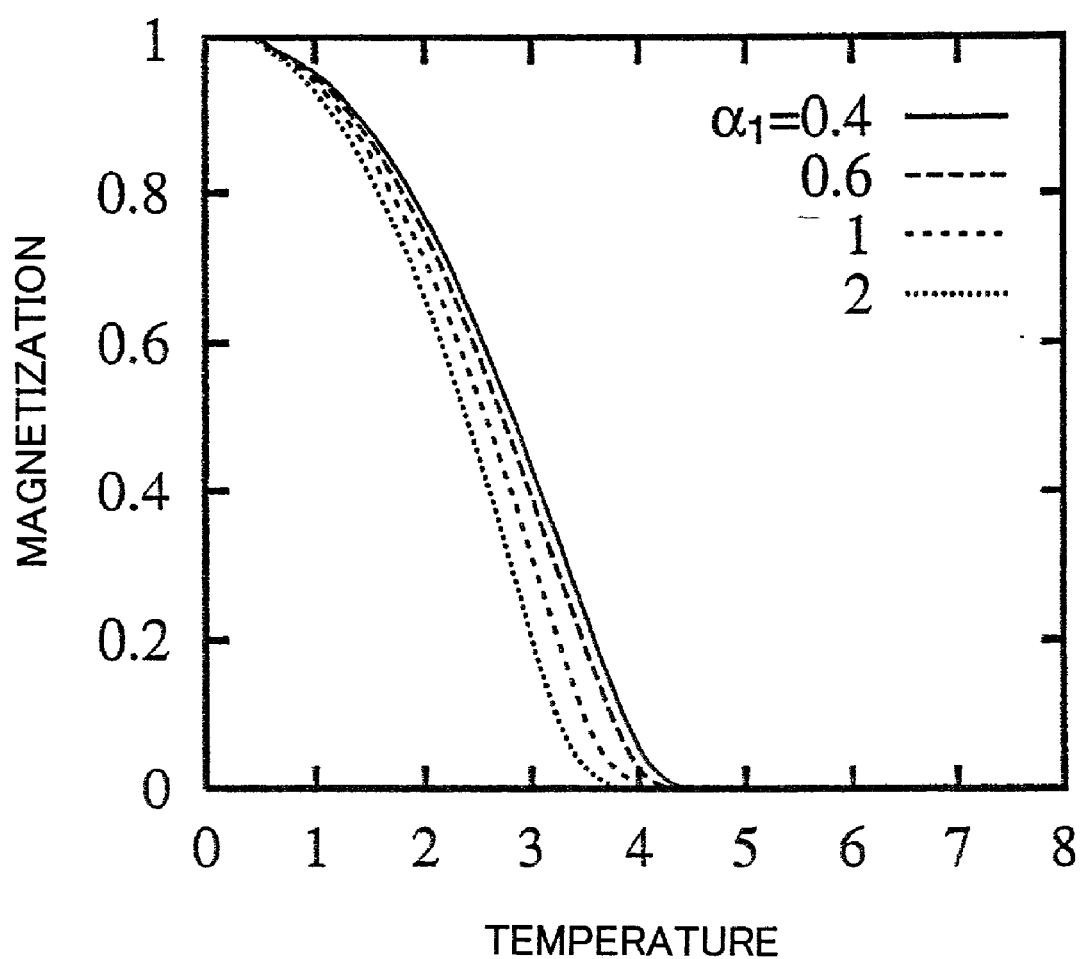
FIG. 21 is a schematic diagram that shows spontaneous magnetization in the nebula-like fractal-based complex structure according to the fourth embodiment of the invention.

FIG. 21 shows spontaneous magnetization in case of $\alpha_2=0.4$ fixed and $\alpha_1$ changed. Here, $\alpha_1=0.4$ corresponds to spontaneous magnetization in the same structure as the simple fractal of $\alpha=0.4$. As seen from FIG. 21, the modulatory property is remarkably smaller as compared with FIGS. 19 and 20.

Figure 22:
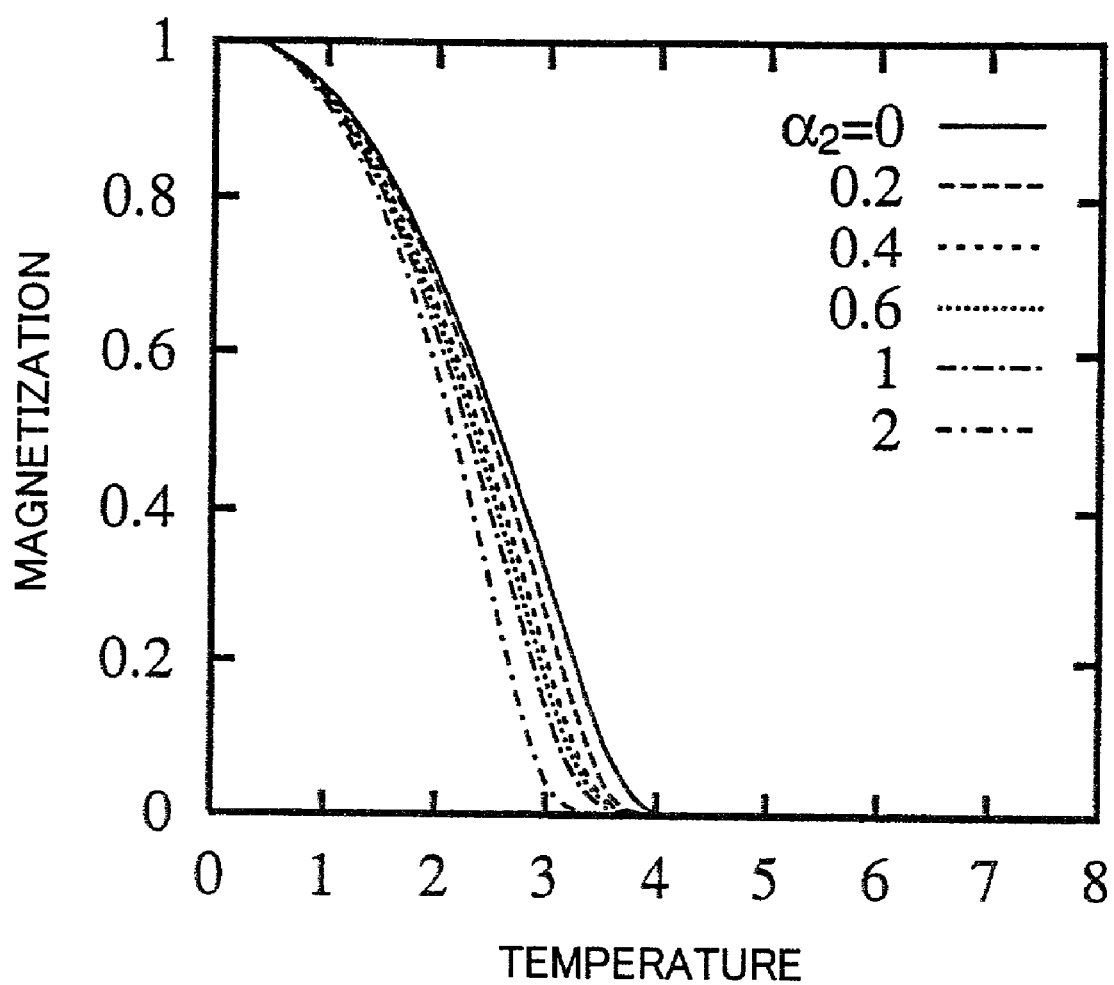
FIG. 22 is a schematic diagram that shows spontaneous magnetization in the nebula-like fractal-based complex structure according to the fourth embodiment of the invention.
Figure 23:
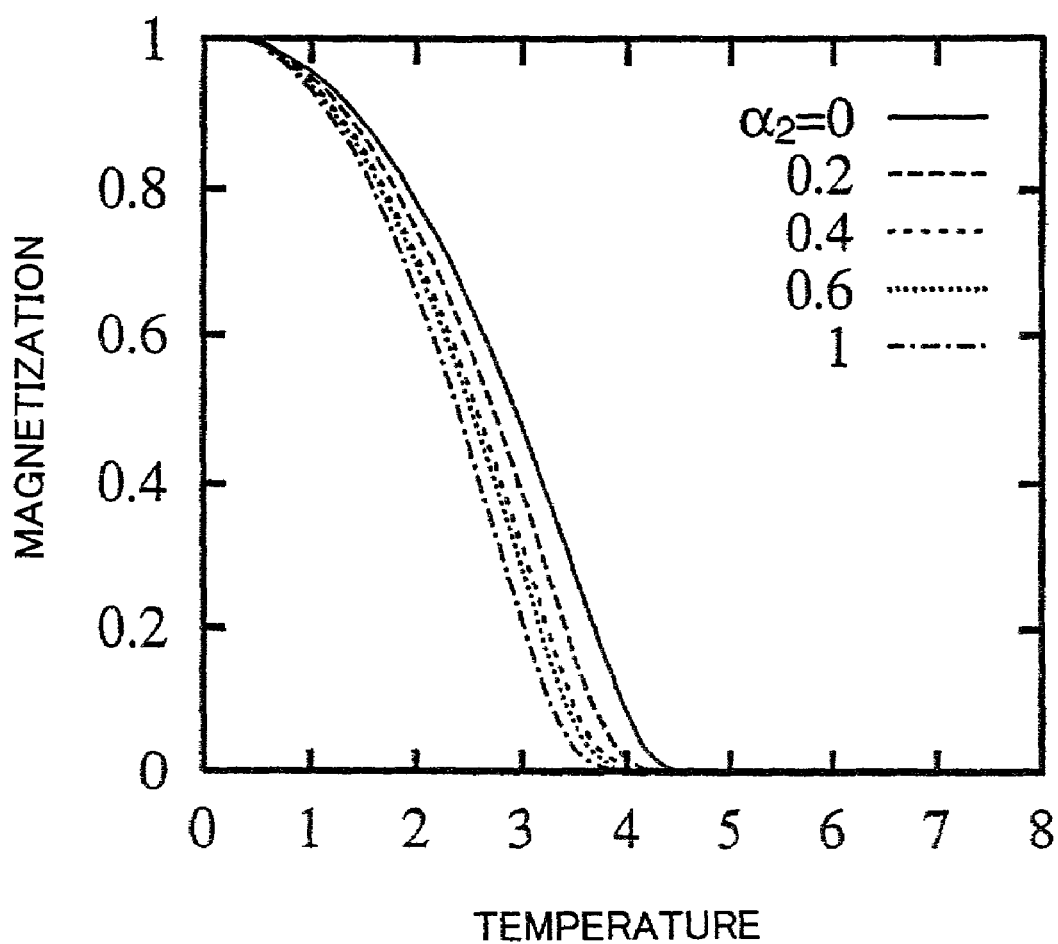
FIG. 23 is a schematic diagram that shows spontaneous magnetization in the nebula-like fractal-based complex structure according to the fourth embodiment of the invention.
Figure 24:
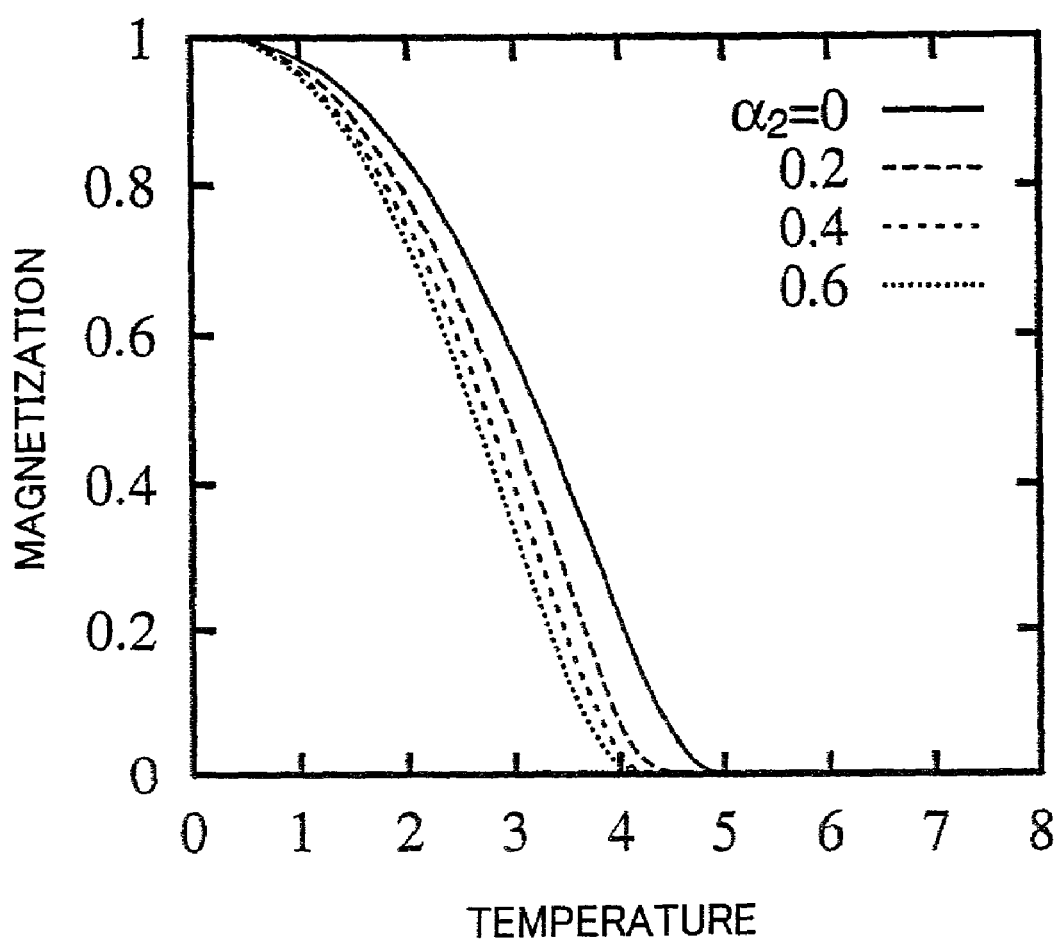
FIG. 24 is a schematic diagram that shows spontaneous magnetization in the nebula-like fractal-based complex structure according to the fourth embodiment of the invention.

FIG. 22 shows spontaneous magnetization in case of $\alpha_1=2$ fixed and $\alpha_2$ changed. Here, $\alpha_2=2$ corresponds to spontaneous magnetization in the same structure as the simple fractal of $\alpha=2$. FIG. 23 shows spontaneous magnetization in case of $\alpha_1=1$ fixed and $\alpha_2$ changed. Here, $\alpha_2=1$ corresponds to spontaneous magnetization in the same structure as the simple fractal of $\alpha=1$. FIG. 24 shows spontaneous magnetization in case of $\alpha_1=0.6$ fixed and $\alpha_2$ changed. Here, $\alpha_2=0.6$ corresponds to spontaneous magnetization in the same structure as the simple fractal of $\alpha=0.6$. As seen from FIGS. 22, 23 and 24, the phase transition temperatures are controlled by $\alpha_2$ to a certain extent.

Generalizing the above aspects of spontaneous magnetization, when a nebula-like fractal-based complex structure satisfies the condition of approximately $D_f<2.3$ in the growth process of $1 \leq n \leq \tau_1$, i.e. in the initial stage of the growth, and the growth condition of approximately $D_f>2.7$ in the growth process of $\tau_1+1 \leq n \leq \tau_2$, i.e. in the final stage of the growth, the ferromagnetic phase transition temperature in the nebula-like fractal-based complex structure will be controlled well.

FIFTH EMBODIMENT (1) Formation of a Nebula-Like Fractal-Based Complex Structure

A method of forming the nebula-like fractal-based complex structure according to the fifth embodiment is the same as the method of forming the nebula-like fractal-based complex structure according to the first embodiment. As growth conditions, however, fixing $\tau_1=5000$ and $\tau_2=10000$ and using various combinations of $(\alpha_1, \alpha_2)$ satisfying $\alpha_1>\alpha_2$, particularly using 0, 0.2, 0.4, 0.6, 1 and 2 as $\alpha_1$ and $\alpha_2$, numerical experiment of growth was carried out.

(2) Electron System on the Nebula-Like Fractal-Based Complex Structure

In the same process as demonstrated by Equations (20) through (35) of the second embodiment, a quantum system of one particle is defined on the nebula-like fractal-based complex structure defined in (1).

Figure 25:
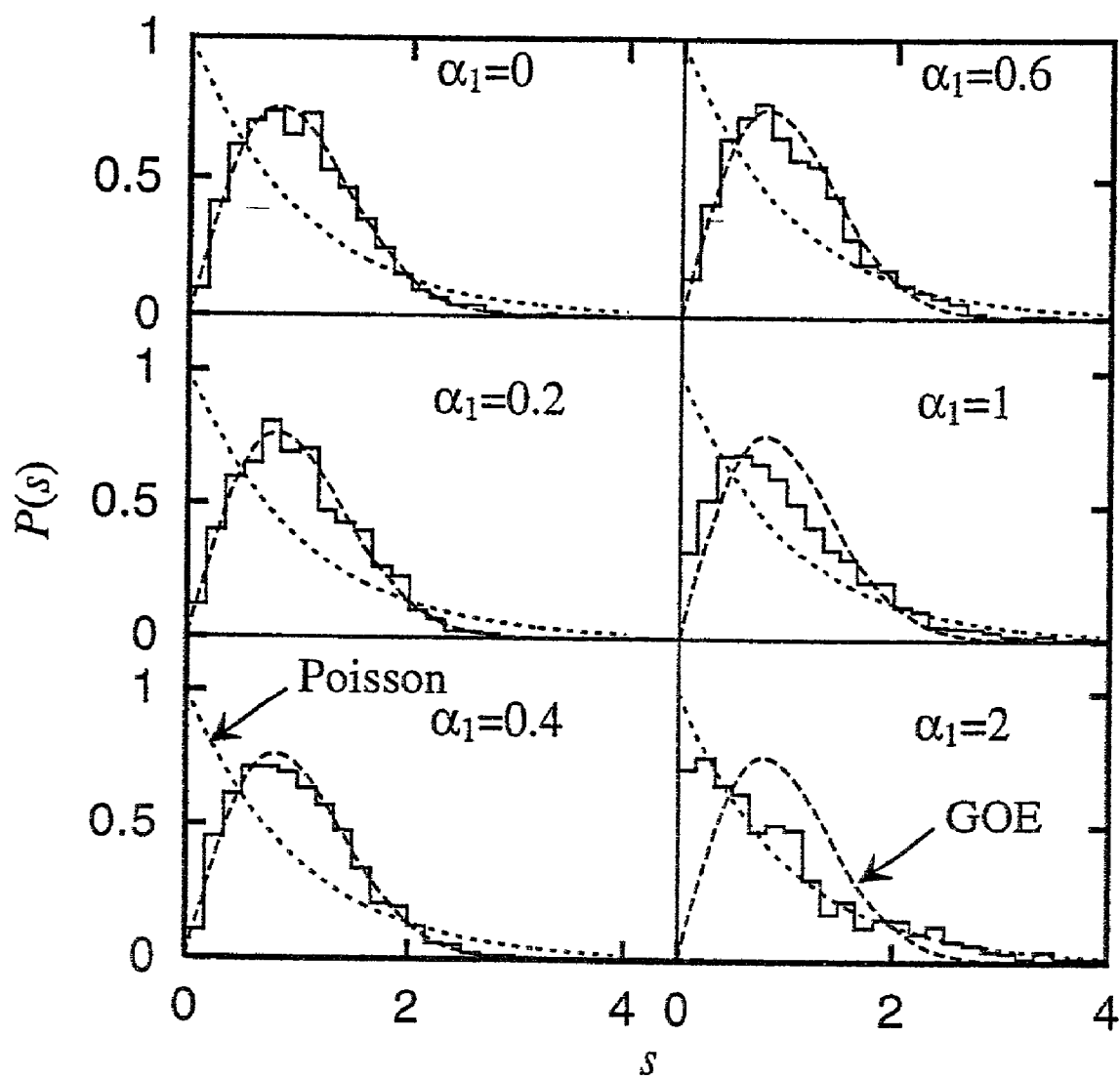
FIG. 25 is a schematic diagram that shows quantum level statistics in a nebula-like fractal-based complex structure according to the fifth embodiment of the invention.
Figure 26:
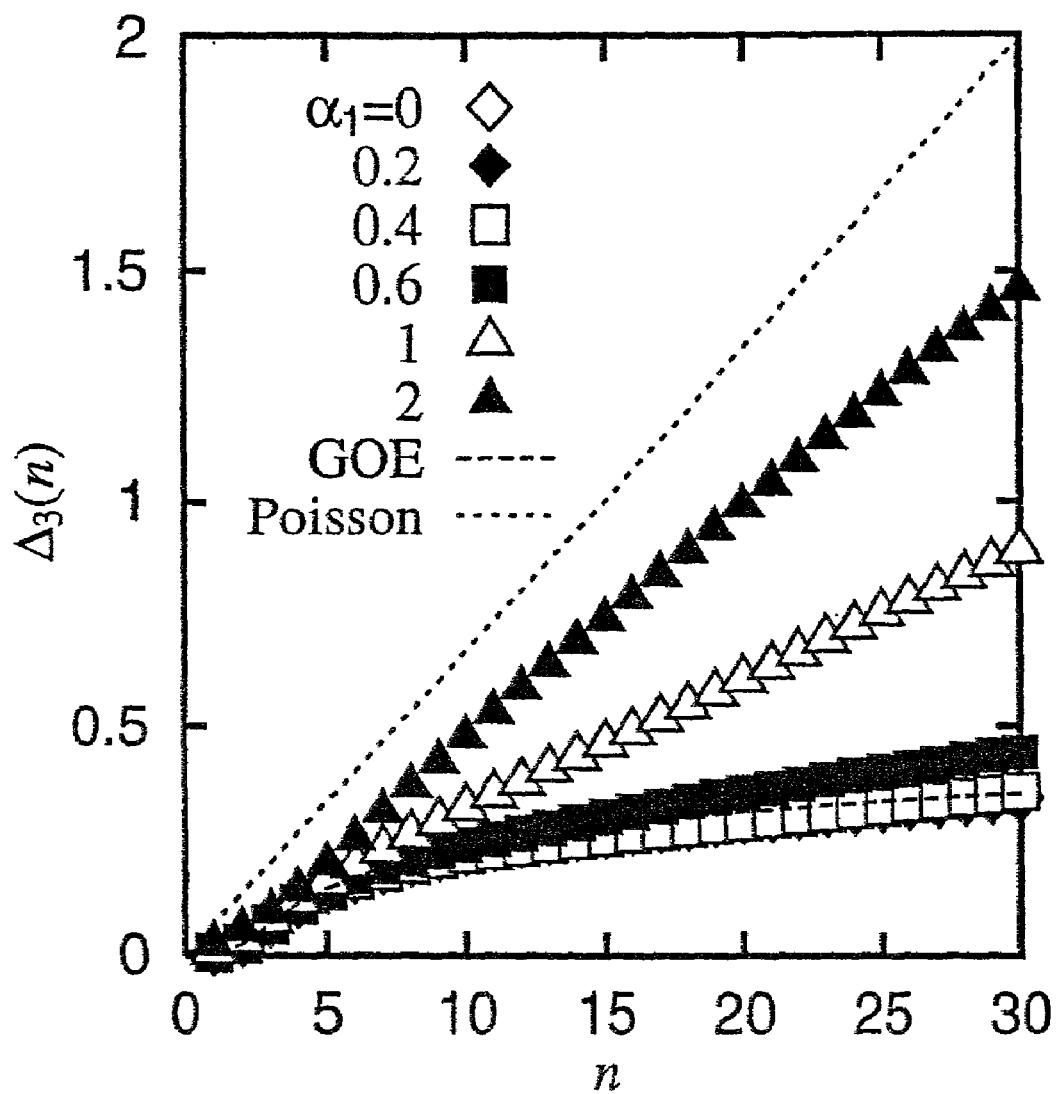
FIG. 26 is a schematic diagram that shows quantum level statistics in the nebula-like fractal-based complex structure according to the fifth embodiment of the invention.

Since the nebula-like fractal-based complex structure analyzed here is one obtained by growth experiment of n=10000, this quantum system includes n+1=10001 eigenstates. Based on energy eigenvalues concerning 1501 states from the 510-th to 2001-th eigenstates from the ground state, among those eigenstates, the following quantum level statistics was calculated. FIGS. 25 and 26 show quantum level statistics in a nebula-like fractal-based complex structure under $(\alpha_1, \alpha_2)=(x, 2)$ where x=0, 0.2, 0.4, 0.6, 1 and 2. FIG. 25 shows P(s) and FIG. 26 shows $\Delta_3$ statistics. In case of $\alpha_1=0$, the structure is the same as the simple fractal of $\alpha=0$, and the fractal dimension is near $3(D_f\sim2.91)$. Therefore, the system behaves as a quantum chaotic system. In this case, the quantum level statistics is that of GOE distribution. As $\alpha_1$ increases, the quantum level statistics changes away from that of GOE distribution and approaches that of Poisson distribution. However, even after reading $\alpha_1=2$, a large difference from Poisson distribution still remains.

Figure 27:
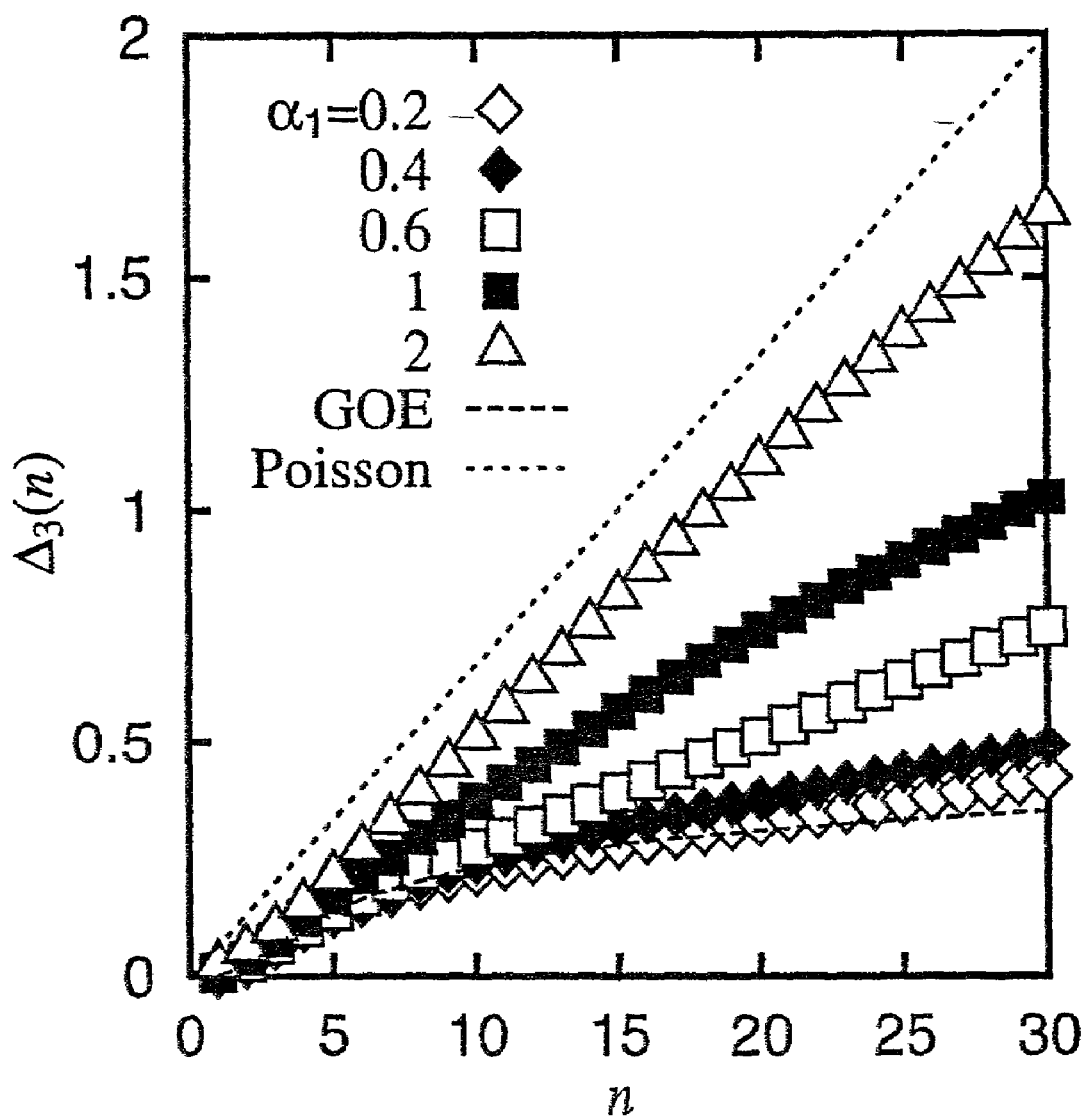
FIG. 27 is a schematic diagram that shows quantum level statistics in the nebula-like fractal-based complex structure according to the fifth embodiment of the invention.
Figure 28:
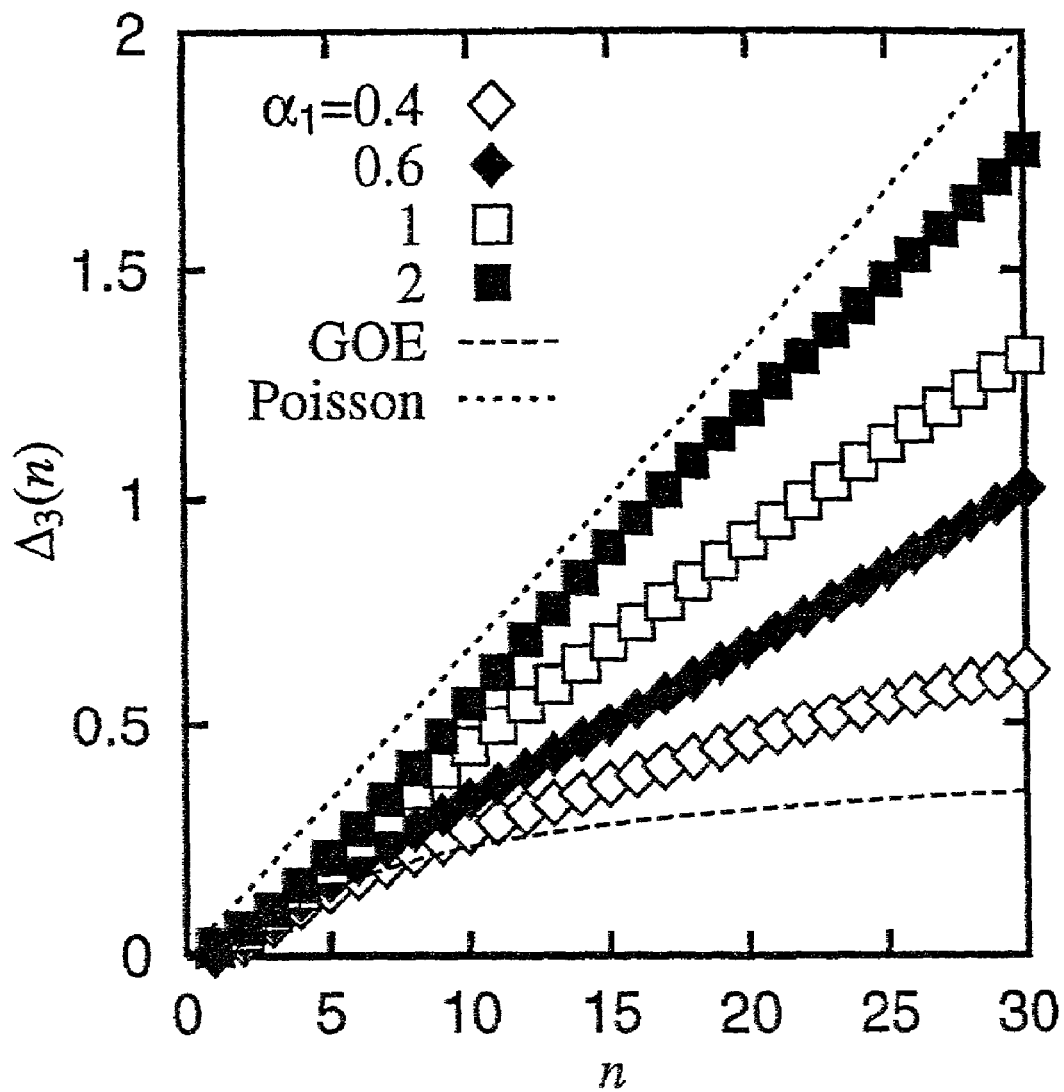
FIG. 28 is a schematic diagram that shows quantum level statistics in the nebula-like fractal-based complex structure according to the fifth embodiment of the invention.

FIG. 27 shows $\Delta_3$ statistics in a nebula-like fractal-based complex structure under $(\alpha_1, \alpha_2)=(x, 0.2)$ where x=0.2, 0.4, 0.6, 1 and 2. In case of $\alpha_1=0.2$, the structure is the same as the simple fractal of $\alpha=0.2$, and behaves as a quantum chaotic system. As $\alpha_1$ increases, the quantum level statistics changes away from that of GOE distribution and approaches that of Poisson distribution. FIG. 28 shows $\Delta_3$ statistics in a nebula-like fractal-based complex structure under $(\alpha_1, \alpha_2)=$ (x, 0.4) where x=0.4, 0.6, 1 and 2. In case of $\alpha_1=0.4$, the structure is the same as the simple fractal of $\alpha=0.4$, and it is already apart from that of GOE distribution too much to be a quantum chaotic system. Here again, as $\alpha_1$ increases, the quantum level statistics changes away from that of GOE distribution and approaches that of Poisson distribution.

Figure 29:
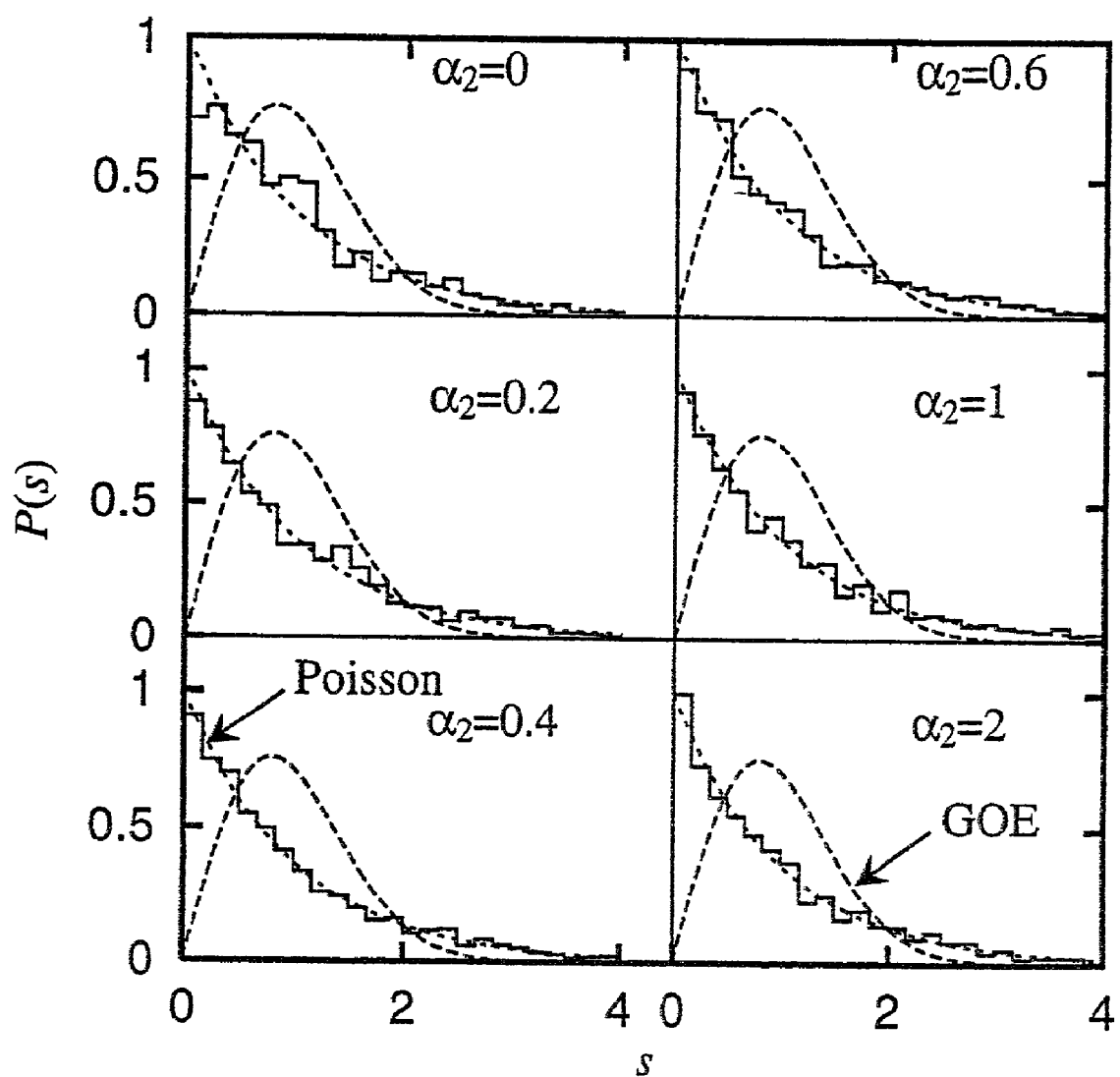
FIG. 29 is a schematic diagram that shows quantum level statistics in the nebula-like fractal-based complex structure according to the fifth embodiment of the invention.
Figure 30:
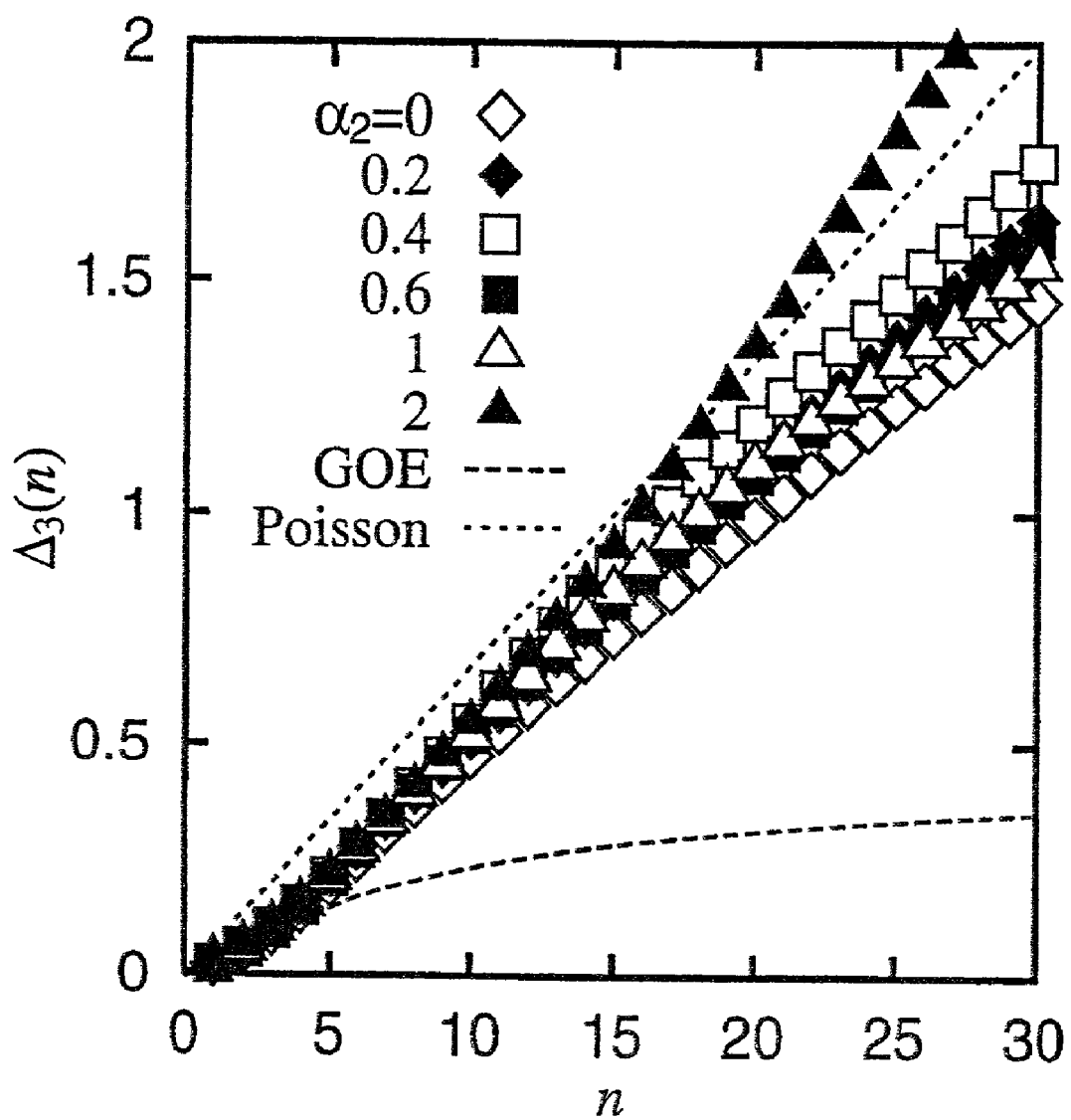
FIG. 30 is a schematic diagram that shows quantum level statistics in the nebula-like fractal-based complex structure according to the fifth embodiment of the invention.

FIGS. 29 and 30 show quantum level statistics in a nebula-like fractal-based complex structure under $(\alpha_1, \alpha_2)=$ (2, x) where x=0, 0.2, 0.4, 0.6, 1 and 2. FIG. 29 shows P(s) and FIG. 30 shows $\Delta_3$ statistics. In case of $\alpha_2=0$, it is the same as $\alpha_1=2$ of FIGS. 25 and 26. In case of $\alpha_2=2$, the structure is the same as the simple fractal of $\alpha=2$, and the fractal dimension is near $2(D_f\sim2.16)$. Therefore, the system behaves as an integrable system. As $\alpha_2$ decreases, the quantum level statistics changes away from that of Poisson distribution and approaches GOE distribution.

Figure 31:
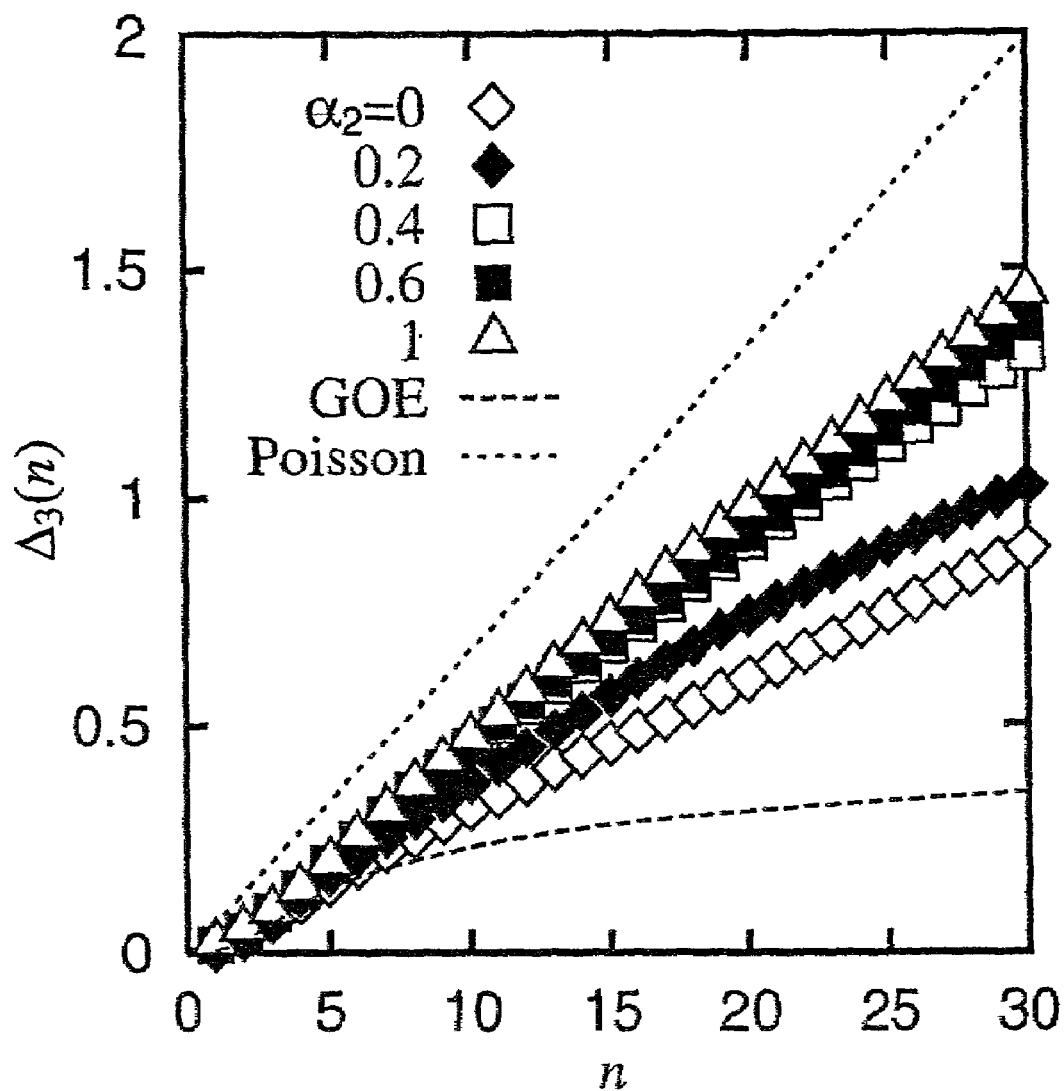
FIG. 31 is a schematic diagram that shows quantum level statistics in the nebula-like fractal-based complex structure according to the fifth embodiment of the invention.
Figure 32:
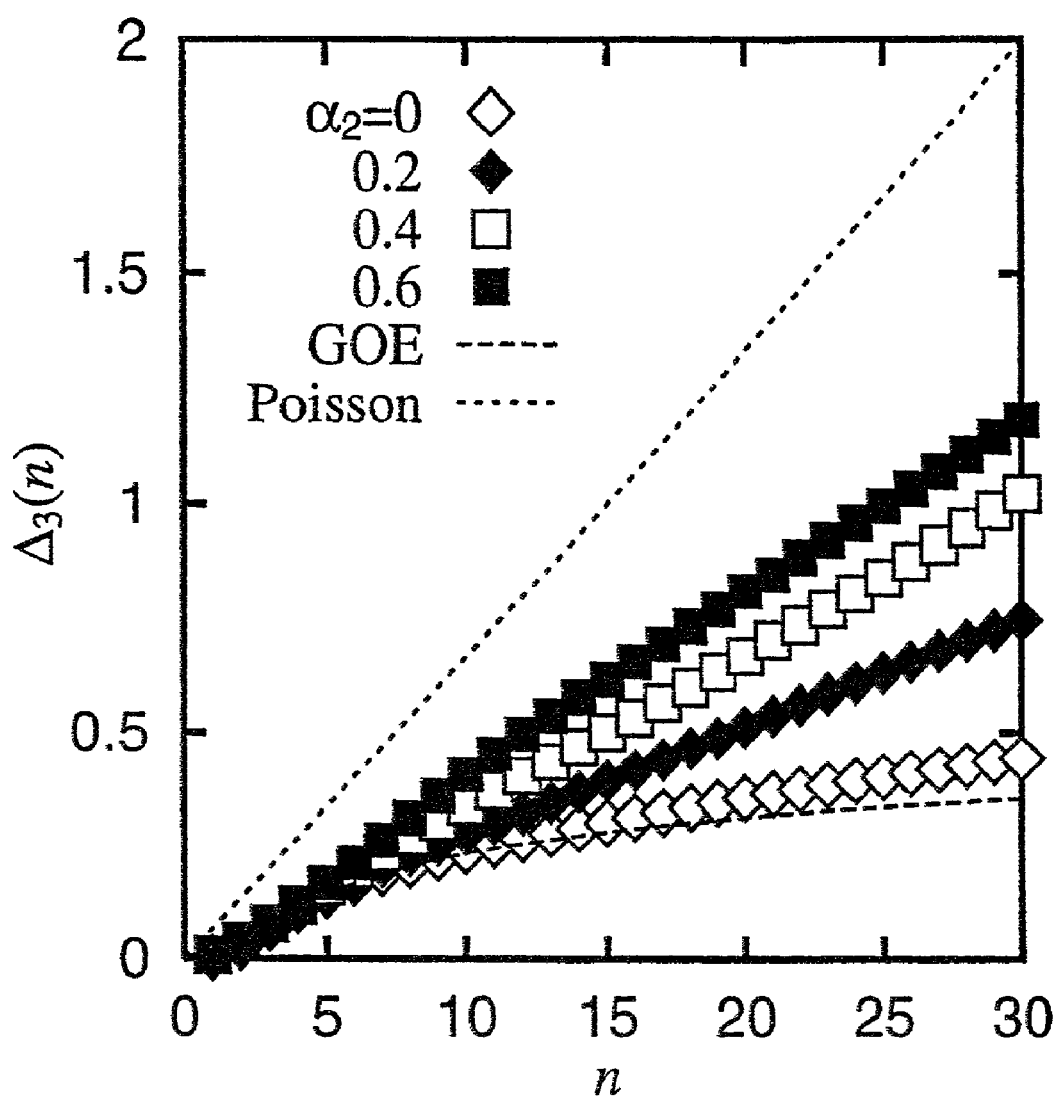
FIG. 32 is a schematic diagram that shows quantum level statistics in the nebula-like fractal-based complex structure according to the fifth embodiment of the invention.

FIG. 31 shows $\Delta_3$ statistics in a nebula-like fractal-based complex structure under $(\alpha_1, \alpha_2)=(1, x)$ where $x=0, 0.2, 0.4, 0.6$ and 1. FIG. 32 shows $\Delta_3$ statistics in a nebula-like fractal-based complex structure under $(\alpha_1, \alpha_2)=(0.6, x)$ where $x=0, 0.2, 0.4$ and $0.6$. As $\alpha_2$ decreases, the quantum level statistics changes away from that of Poisson distribution and approaches that of GOE distribution.

For quantitative evaluation of the above-reviewed controllability, the Berry-Robnik parameter $\rho$ is used ((38) M. V. Berry and M. Robnik, J. Phys. A (Math. Gen.) 17, 2413(1984)). First, when $\bar{\rho}=1-\rho$, $$P_2(s, p) = p^2 e^{-ps} erf\left(\frac{\sqrt{\pi}\, \bar{p}s}{2}\right) - (2p\bar{p}) + \frac{\pi \bar{p}^3 s}{2} e^{-ps-\pi \bar{p}^2 s^2/4} \qquad (64)$$

is introduced, where $$erf(x) = \frac{2}{\sqrt{\pi}} \int_x^\infty d\tau e^{-\tau^2} \qquad (65)$$

was used. This function $P_2(s, \rho)$ coincides with $P(s)$ of Poisson distribution under $\rho=1$, and coincides with $P(s)$ of GOE distribution under $\rho=0$. That is, by changing $\rho$ from 0 to 1, quantum level statistics from those of quantum chaotic systems to those of integrable systems can be interpolated. The Berry-Robnik parameter is the value of $\rho$ obtained by optimum approximation of $P(s)$ obtained y numerical calculation with $P_2(s, \rho)$ shown above. Within the range of semiclassical approximation, $\rho$ is the ratio in volume of regular regions (integrable systems and regions capable of perturbing development therefrom) in a phase space.

Figure 33:
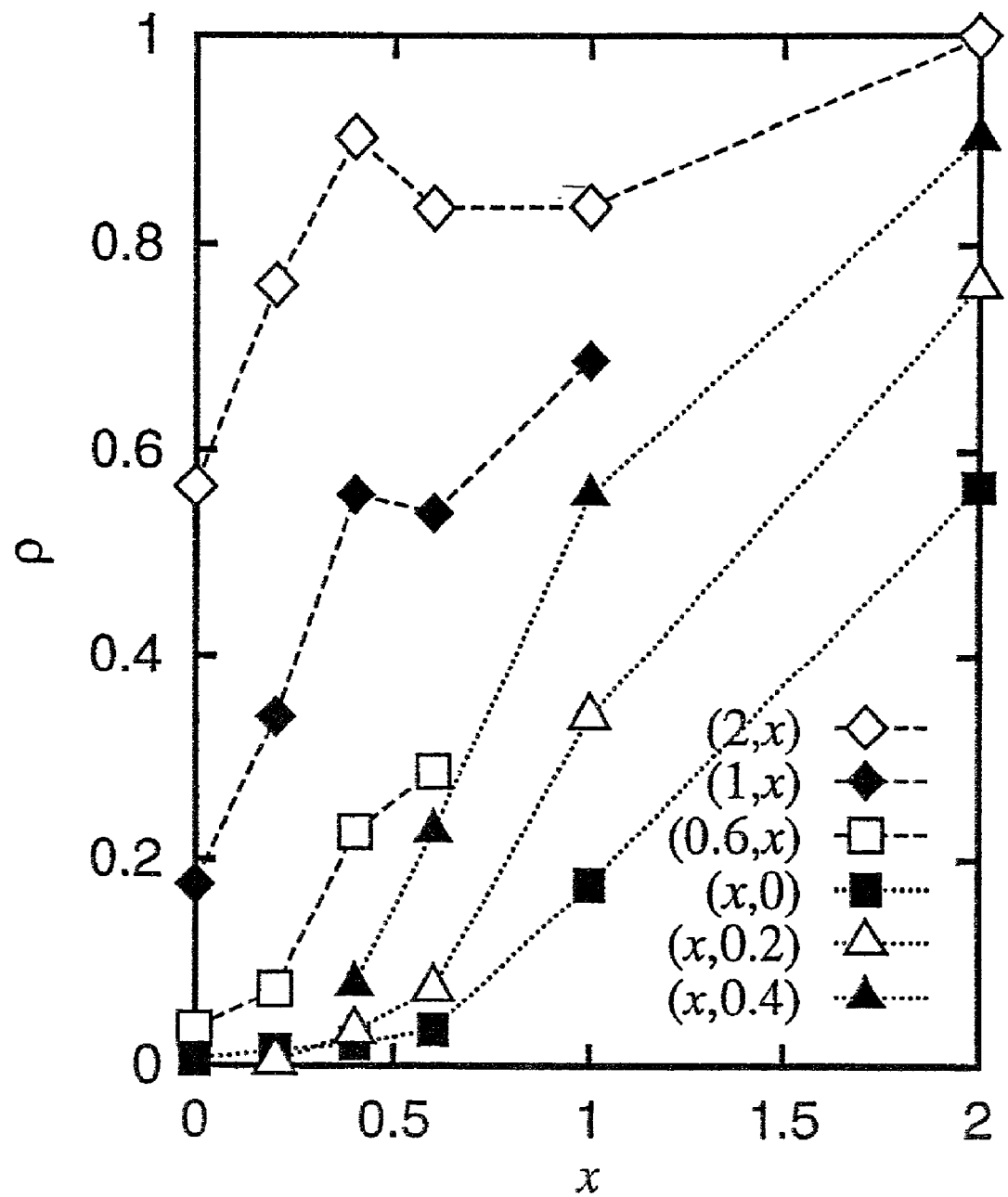
FIG. 33 is a schematic diagram that shows a Berry-Robnik parameter $\rho$ in the nebula-like fractal-based complex structure according to the fifth embodiment of the invention.

FIG. 33 shows the Berry-Robnik parameter $\rho$ in nebula-like fractal-based complex structures. $(\alpha_1, \alpha_2)=(x, 0)$ is the Berry-Robnik parameter in the case where $\alpha_1$ is placed on the abscissa while fixing $\alpha_2=2$. It is apparent from FIG. 33 that widely various quantum systems from quantum chaotic systems to integrable systems can be realized by setting $(\alpha_1, \alpha_2)$ to predetermined values.

SIXTH EMBODIMENT (1) Formation of a Nebula-Like Fractal-Based Complex Structure

A method of forming the nebula-like fractal-based complex structure according to the sixth embodiment is the same as the method of forming the nebula-like fractal-based complex structure according to the first embodiment. As growth conditions, however, fixing $\tau_1=5000$ and $\tau_2=10000$ and using various combinations of $(\alpha_1, \alpha_2)$ satisfying $\alpha_1>\alpha_2$, particularly using 0, 0.2, 0.4, 0.6, 1 and 2 as $\alpha_1$, and $\alpha_2$, numerical experiment of growth was carried out.

(2) Correlative Electron System on the Nebula-Like Fractal-Based Complex Structure An electron system is defined on the nebula-like fractal-based complex structure defined in (1). A review is made about the lattice point $$r_p=(i_{1,p}, i_{2,p}, i_{3,p}) \in T_n \qquad (66)$$

that is the origin of $T_n$. In Equation (66), $p=0, 1, 2, \ldots, n$. An operator $\hat{c}_{p,\sigma}^\dagger$ for generating an electron of a spin $\sigma$ is defined at the lattice point $r_p \in T_n$. Of course, there is the anticommutative relation $$\{\hat{c}_{p,\sigma}, \hat{c}_{q,\rho}^\dagger\} = \delta_{p,q} \delta_{\sigma,\rho} \qquad (67)$$

Here is defined a single-band Hubbard Hamiltonian $\hat{H}$ of the electron system as follows.

$$\hat{H} = t \sum_{i,j,\sigma} \lambda_{i,j} \hat{c}_{i,\sigma}^\dagger \hat{c}_{j,\sigma} + U \sum_j \hat{n}_{j,\uparrow} \hat{n}_{j,\downarrow} \qquad (68)$$

Assuming that electrons are movable only among nearest-neighbor sites, the following is employed as $\lambda_{p,q}$.

$$\lambda_{p,q} = \begin{cases} 1 & \text{when } |r_p - r_q| = 1 \\ 0 & \text{otherwise} \end{cases} \qquad (69)$$

Additionally, the spin $\sigma$ electron density operator of the j-th site, $\hat{n}_{j,\sigma} = \hat{c}_{j,\sigma}^\dagger \hat{c}_{j,\sigma}$, and their sum, $\hat{n}_j = \Sigma_\sigma \hat{n}_{j,\sigma}$, are defined.

For the purpose of defining a temperature Green's function, here is introduced a grand canonical Hamiltonian $\hat{K}=\hat{H}-\mu\hat{N}$ where $\hat{N}=\Sigma_j \hat{n}_j$. In the half-filled taken here, chemical potential is $\mu=U/2$. The half-filled grand canonical Hamiltonian can be expressed as $$\hat{K} = t \sum_{i,j,\sigma} \lambda_{j,i} \hat{t}_{j,i,\sigma} + U/2 \sum_i (\hat{u}_i - 1) \qquad (70)$$

Operators $\hat{t}_{j,i,\sigma}$, $\hat{j}_{j,i,\sigma}$, $\hat{U}_i$ and $\hat{d}_{i,\sigma}$ are defined beforehand as $$\hat{t}_{j,i,\sigma} = \hat{c}_{j,\sigma}^\dagger \hat{c}_{i,\sigma} + \hat{c}_{i,\sigma}^\dagger \hat{c}_{j,\sigma} \qquad (71)$$

$$\hat{j}_{j,i,\sigma} = \hat{c}_{j,\sigma}^\dagger \hat{c}_{i,\sigma} - \hat{c}_{i,\sigma}^\dagger \hat{c}_{j,\sigma} \qquad (72)$$

$$\hat{u}_i = \hat{c}_{i,\uparrow}^\dagger \hat{c}_{i,\uparrow} \hat{c}_{i,\downarrow}^\dagger \hat{c}_{i,\downarrow} + \hat{c}_{i,\uparrow} \hat{c}_{i,\uparrow}^\dagger \hat{c}_{i,\downarrow} \hat{c}_{i,\downarrow}^\dagger \qquad (73)$$

$$\hat{d}_{i,\sigma} = \hat{c}_{i,\sigma}^\dagger \hat{c}_{i,\sigma} - \hat{c}_{i,\sigma} \hat{c}_{i,\sigma}^\dagger \qquad (74)$$

If the temperature Green function is defined for operators $\hat{A}$ and $\hat{B}$ given, taking $\tau$ as imaginary time, it is as follows.

$$\langle \hat{A}; \hat{B} \rangle = -\int_0^\beta d\tau \langle T_\tau \hat{A}(\tau) \hat{B} \rangle e^{i\omega_n \tau} \qquad (75)$$

The on-site Green function $$G_{j,\sigma}(i\omega_n) = \langle \hat{c}_{j,\sigma}; \hat{c}_{j,\sigma}^\dagger \rangle \qquad (76)$$

is especially important.

Imaginary time development of the system is obtained by the Heisenberg equation $$\frac{d}{d\tau} \hat{A}(\tau) = [\hat{K}, \hat{A}] \qquad (77)$$

As the equation of motion of the on-site Green function, $$i\omega_n \langle \hat{c}_{j,\sigma}; \hat{c}_{j,\sigma}^\dagger \rangle = 1 + t\sum_{p,j} \lambda_{p,j} \langle \hat{c}_{p,\sigma}; \hat{c}_{j,\sigma}^\dagger \rangle + \frac{U}{2} \langle \hat{d}_{j,-\sigma} \hat{c}_{j,\sigma}; \hat{c}_{j,\sigma}^\dagger \rangle \quad (78)$$

is obtained. Then, the approximation shown below is introduced, following Gros ((35) C. Gros, Phys. Rev. B50, 7295(1994)). If the site p is the nearest-neighbor site of the site j, the resolution $$\langle \hat{c}_{p,\sigma}; \hat{c}_{j,\sigma}^\dagger \rangle \to t \langle \hat{c}_{p,\sigma}; \hat{c}_{p,\sigma}^\dagger \rangle \langle \hat{c}_{j,\sigma}; \hat{c}_{j,\sigma}^\dagger \rangle \quad (79)$$

is introduced as the approximation. This is said to be exact in case of infinite-dimensional Bethe lattices, but in this case, it is only within approximation. Under the approximation, the following equation is obtained.

$$(i\omega_n - t^2\Gamma_{j,\sigma})G_{j,\sigma} = 1 + \frac{U}{2}\langle \hat{d}_{j,-\sigma}\hat{c}_{j,\sigma}; \hat{c}_{j,\sigma}^\dagger \rangle \quad (80)$$

where $$\Gamma_{j,\sigma} = \sum_p \lambda_{p,j} G_{p,\sigma} \quad (81)$$

was introduced. To solve the equation, obtained, $\langle \hat{d}_{j,-\sigma}\hat{c}_{j,\sigma}; \hat{c}_{j,\sigma}^\dagger \rangle$ has to be analyzed. In case of half-filled models, this equation of motion is $$i\omega_n \langle \hat{d}_{j,-\sigma}\hat{c}_{j,\sigma}; \hat{c}_{j,\sigma}^\dagger \rangle = \quad (82)$$

$$\frac{U}{2}G_{j,\sigma} - 2t\sum_p \lambda_{p,j} \langle \hat{j}_{p,j,-\sigma}\hat{c}_{j,\sigma}; \hat{c}_{j,\sigma}^\dagger \rangle + t\sum_p \lambda_{p,j}\langle \hat{d}_{j,-\sigma}\hat{c}_{p,\sigma}; \hat{c}_{j,\sigma}^\dagger \rangle$$

Here again, with reference to the Gros theory, approximation is introduced. It is the following translation.

$$\langle \hat{j}_{p,j,-\sigma}\hat{c}_{j,\sigma}; \hat{c}_{j,\sigma}^\dagger \rangle \to -tG_{p,-\sigma}\langle \hat{d}_{j,-\sigma}\hat{c}_{j,\sigma}; \hat{c}_{j,\sigma}^{554}\rangle \quad (83)$$

$$\langle \hat{d}_{j,-\sigma}\hat{c}_{j,\sigma}; \hat{c}_{j,\sigma}^\dagger \rangle \to tG_{p,\sigma}\langle \hat{d}_{j,-\sigma}\hat{c}_{j,\sigma}; \hat{c}_{j,\sigma}^{554}\rangle \quad (84)$$

By executing this translation, the following closed equation is obtained.

$$(i\omega_n - t^2\Gamma_{j,\sigma})G_{j,\sigma} = 1 + \frac{(U/2)^2}{i\omega_n - t^2\Gamma_{j,\sigma} - 2t^2\Gamma_{j,\sigma}}G_{j,\sigma} \quad (85)$$

Here is assumed that there is no dependency on spin. That is, assuming $$G_{j,\uparrow} = G_{j,\downarrow} \quad (86)$$

the following calculation is executed. This is because, when analytic continuation is conducted as $i\omega_n \to \omega + i\delta$ for small $\delta$, $$D_j(\omega) = -ImG_j(\omega + i\delta) \quad (87)$$

becomes the local density of states of the site j, and $$D(\omega) = -\frac{1}{n+1}\sum_j D_j(\omega) \quad (88)$$

becomes the density of states of the system. For later numerical calculation of densities of states, $\delta=0.0001$ will be used.

Figure 34:
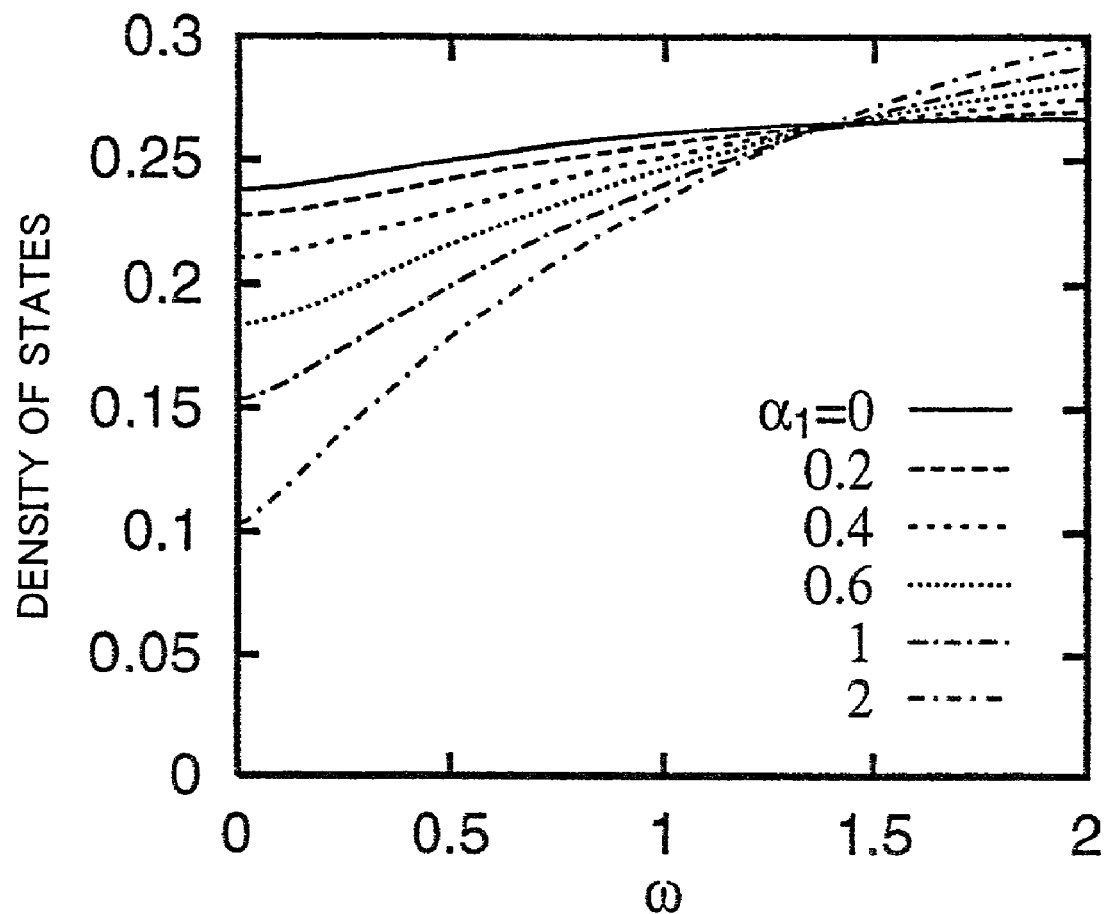
FIG. 34 is a schematic diagram that shows a relation between energy and density of states in a nebula-like fractal-based complex structure according to the sixth embodiment of the invention.
Figure 35:
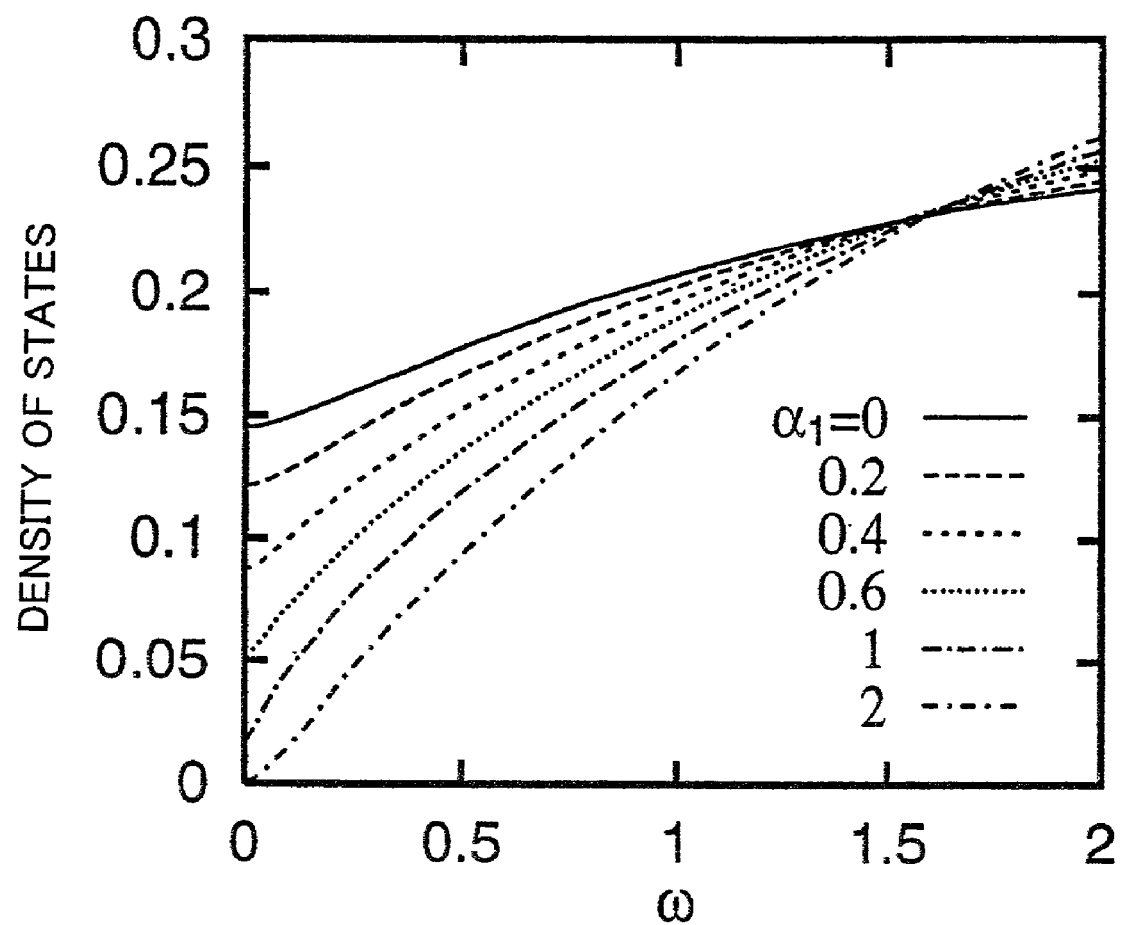
FIG. 35 is a schematic diagram that shows a relation between energy and density of states in the nebula-like fractal-based complex structure according to the sixth embodiment of the invention.
Figure 36:
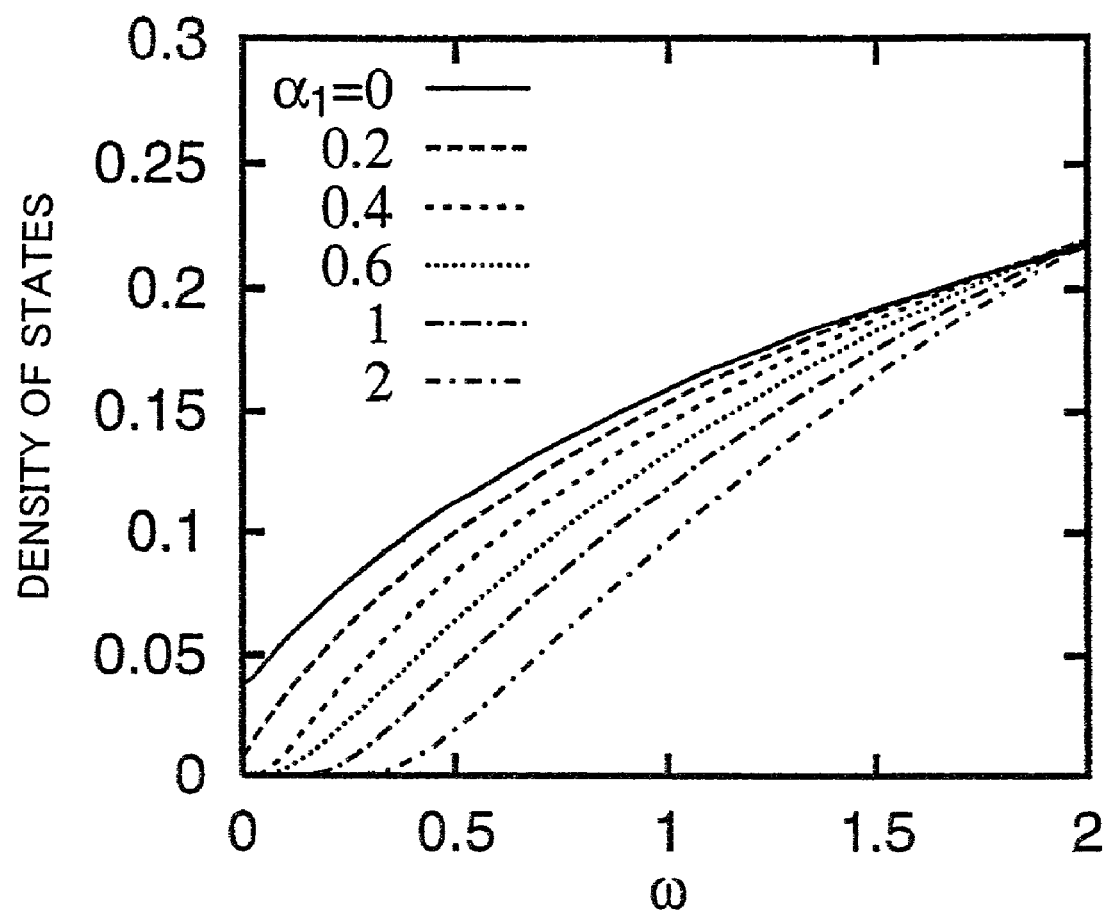
FIG. 36 is a schematic diagram that shows a relation between energy and density of states in the nebula-like fractal-based complex structure according to the sixth embodiment of the invention.

Regarding the nebula-like fractal-based complex structure obtained in (1), fixing $t=1$, $\tau_1=5000$ and $\tau_2=10000$, densities of states are calculated. FIGS. 34, 35 and 36 show densities of states of half-filled electron systems (10001 electrons) in the nebula-like fractal-based complex structure under $(\alpha_1, \alpha_2)=(x, 0)$ where $x=0, 0.2, 0.4, 0.6, 1$ and $2$. $U=6$ is used in FIG. 34, $U=7$ in FIG. 35, and $U=8$ in FIG. 36. In case of $\alpha_1=0$, the structure is the same as the simple fractal of $\alpha=0$, and the fractal dimension is near $3(D_f\sim2.91)$. In FIG. 34, for all values of $\alpha_1$, densities of states $D(0)$ under $\omega=0$ are finite, and the electron system is in a metal phase. As $\alpha_1$ increases, $D(0)$ gradually decreases, and the electron system approaches an insulator. In FIG. 35, when $\alpha_1<1$, the state of density $D(0)$ under $\omega=0$ is finite, and the electron system is in a metal phase. However, when $\alpha_1=2$, $D(0)$ disappears substantially, and Mott insulator transformation occurs. In FIG. 36, as $\alpha_1$ increases, disappearance of $D(0)$ occurs, that is, typical Mott transition occurs.

Figure 37:
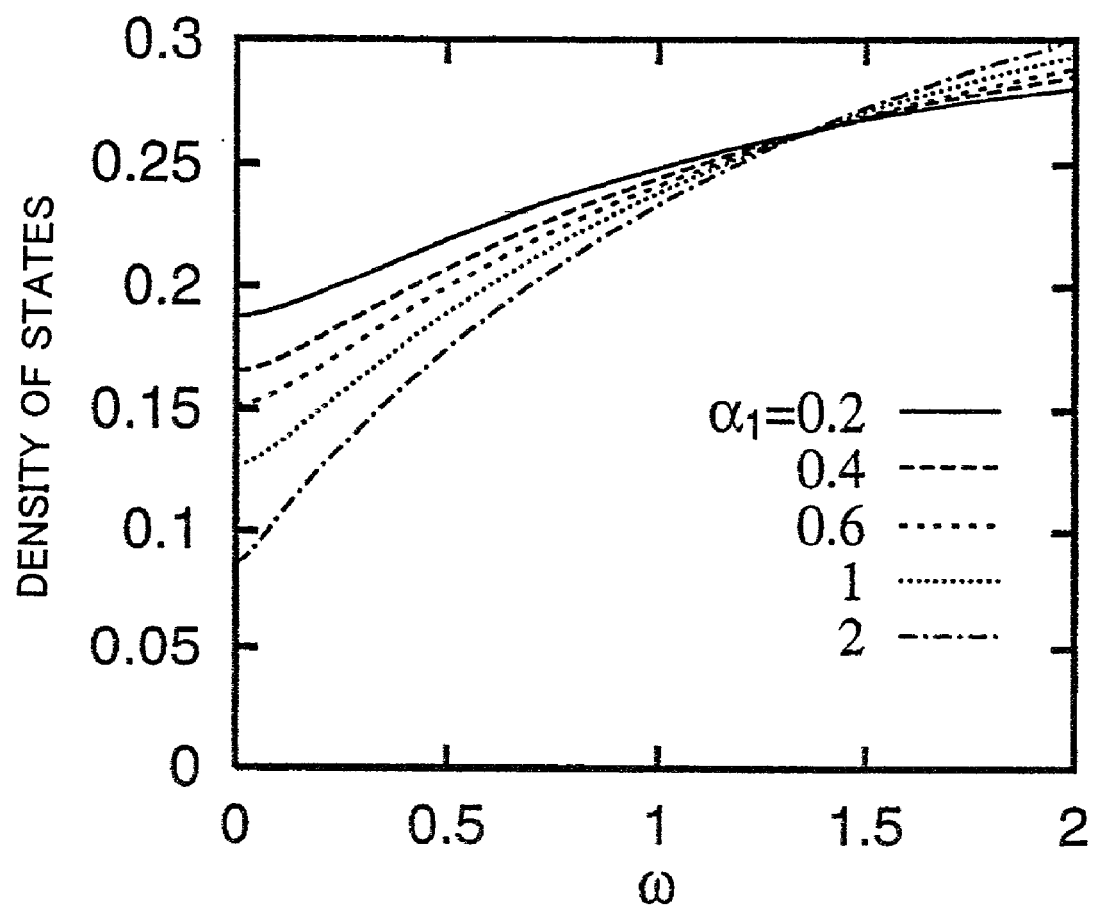
FIG. 37 is a schematic diagram that shows a relation between energy and density of states in the nebula-like fractal-based complex structure according to the sixth embodiment of the invention.
Figure 38:
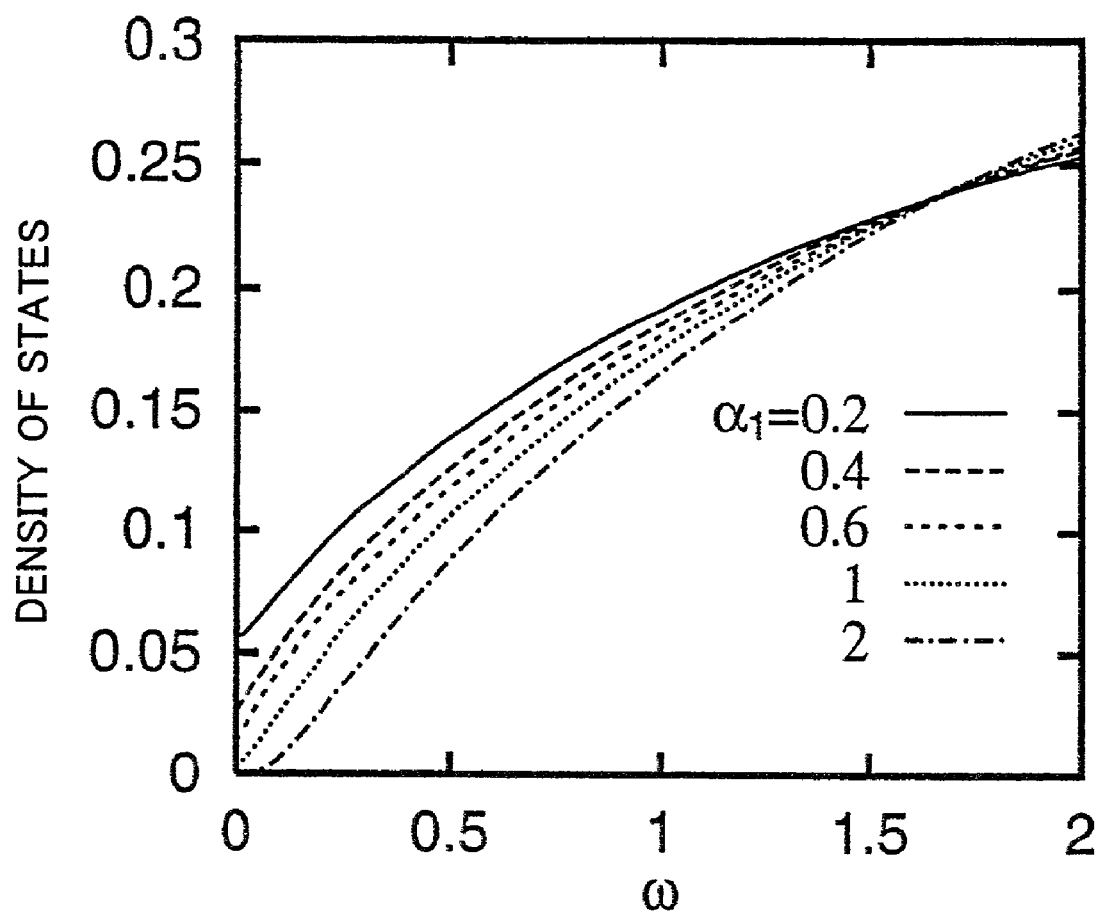
FIG. 38 is a schematic diagram that shows a relation between energy and density of states in the nebula-like fractal-based complex structure according to the sixth embodiment of the invention.
Figure 39:
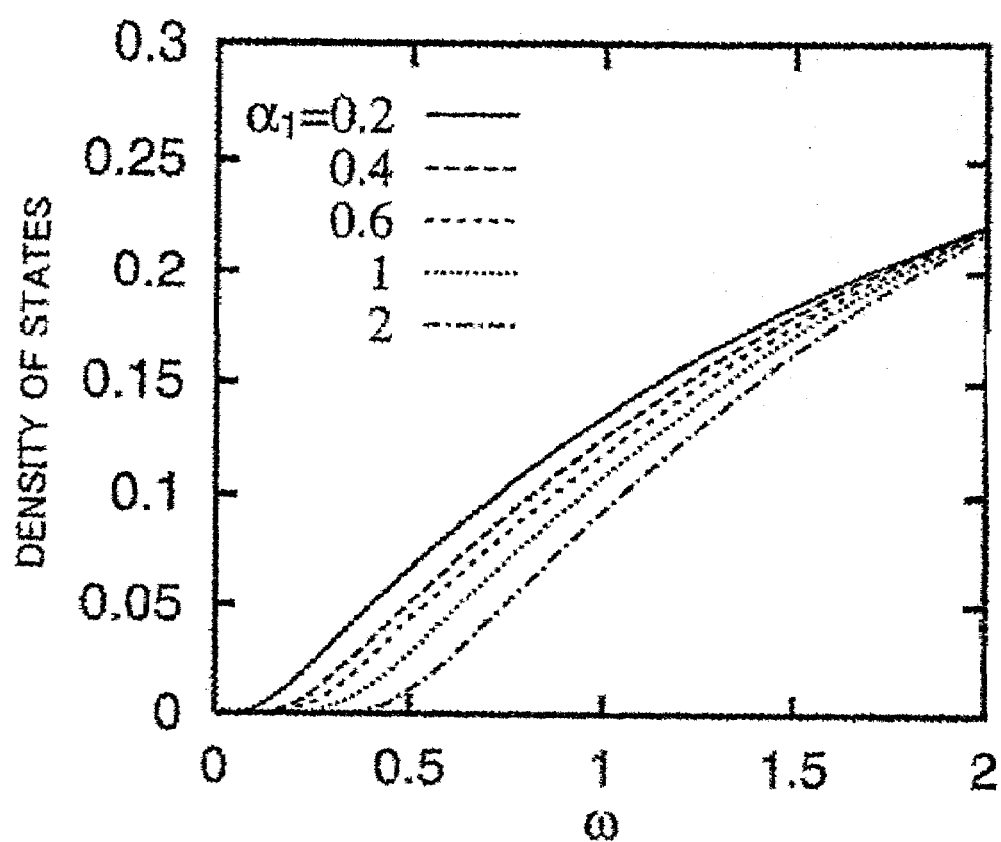
FIG. 39 is a schematic diagram that shows a relation between energy and density of states in the nebula-like fractal-based complex structure according to the sixth embodiment of the invention.

FIGS. 37, 38 and 39 show densities of states of half-filled electron systems (10001 electrons) in the nebula-like fractal-based complex structure under $(\alpha_1, \alpha_2)=(x, 0.2)$ where $x=0.2, 0.4, 0.6, 1$ and $2$. $U=6$ is used in FIG. 37, $U=7$ in FIG. 38, and $U=8$ in FIG. 39. In case of $\alpha_1=0.2$, the structure is the same as the simple fractal of $\alpha=0.2$. In FIG. 37, for all values of $\alpha_1$, densities of states $D(0)$ under $\omega=0$ are finite, and the electron system is in a metal phase. As $\alpha_1$ increases, $D(0)$ gradually decreases, and the electron system approaches an insulator. In FIG. 38, when $\alpha_1<1$, the state of density $D(0)$ under $\omega=0$ is finite, and the electron system is in a metal phase. However, when $\alpha_1=2$, $D(0)$ disappears substantially, and Mott insulator transformation occurs. In FIG. 39, it is recognized the system behaves as a Mott insulator under all values of $\alpha_1$, but its insulation performance, i.e. electron-to-electron correlative effect, is enhanced as $\alpha_1$ increases. This is because width of the effective Hubbard gap increases along with the increase of $\alpha_1$.

Figure 40:
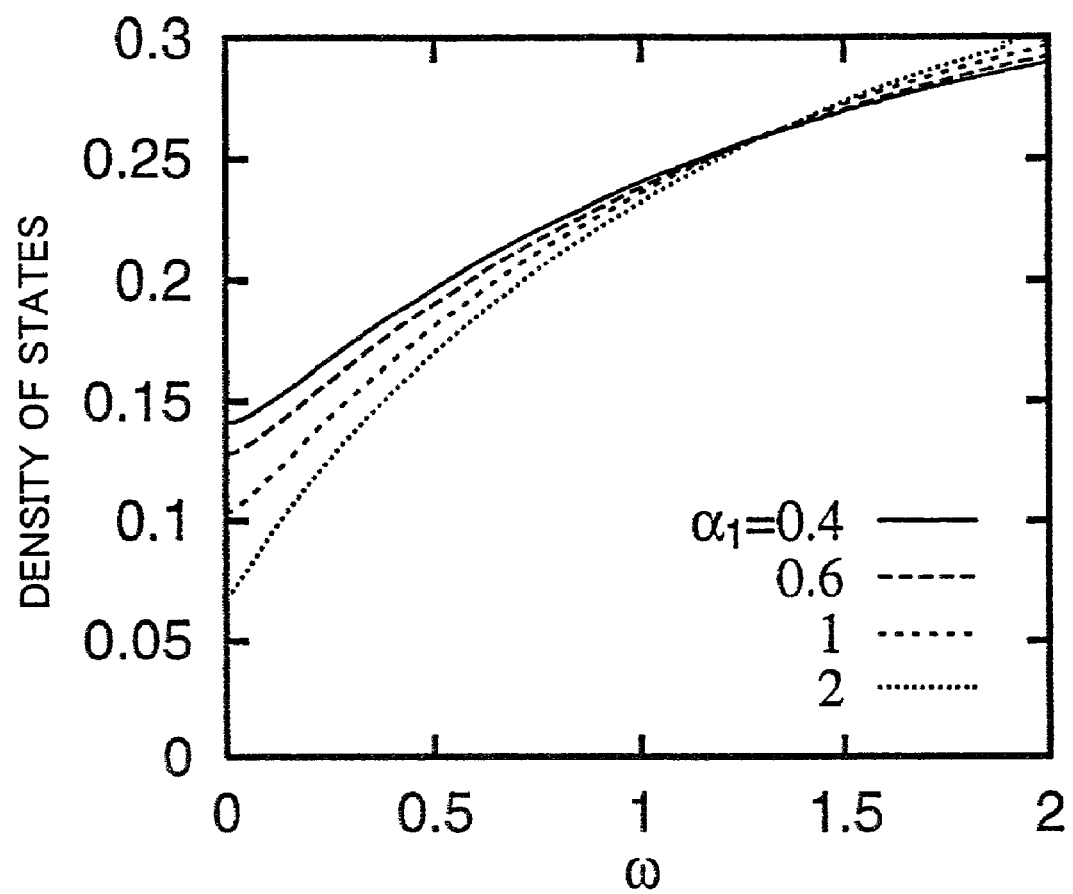
FIG. 40 is a schematic diagram that shows a relation between energy and density of states in the nebula-like fractal-based complex structure according to the sixth embodiment of the invention.
Figure 41:
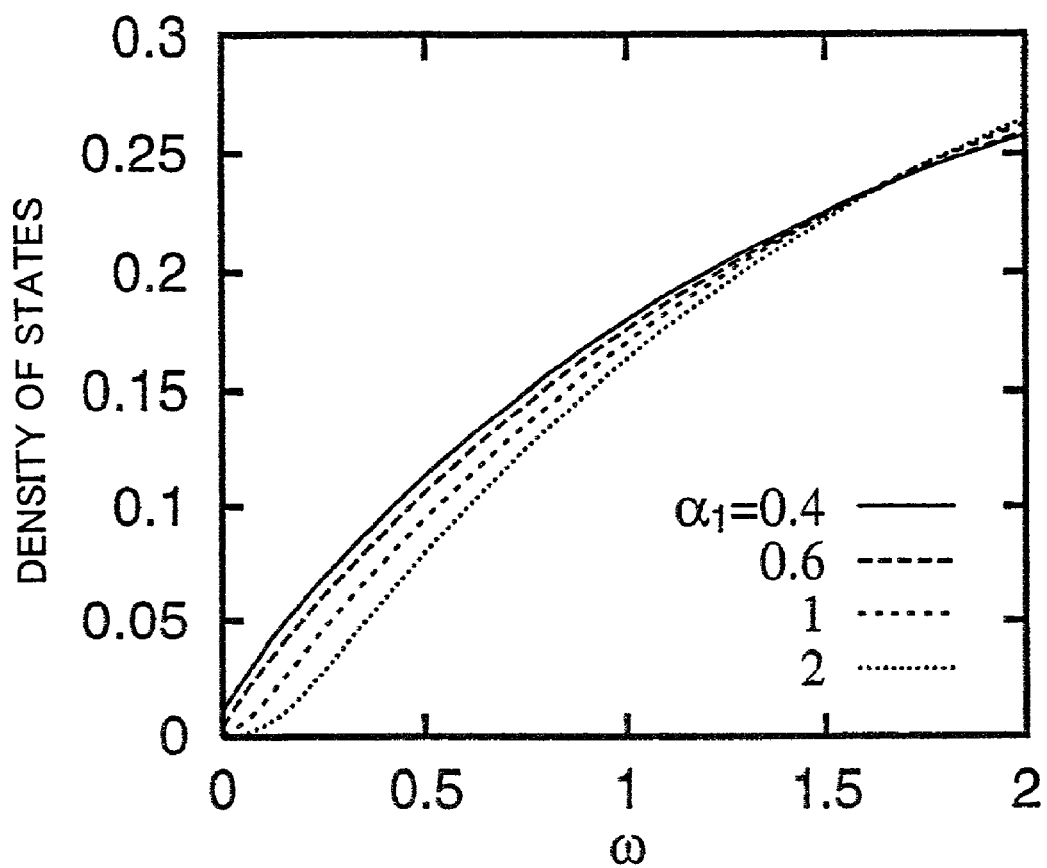
FIG. 41 is a schematic diagram that shows a relation between energy and density of states in the nebula-like fractal-based complex structure according to the sixth embodiment of the invention.
Figure 42:
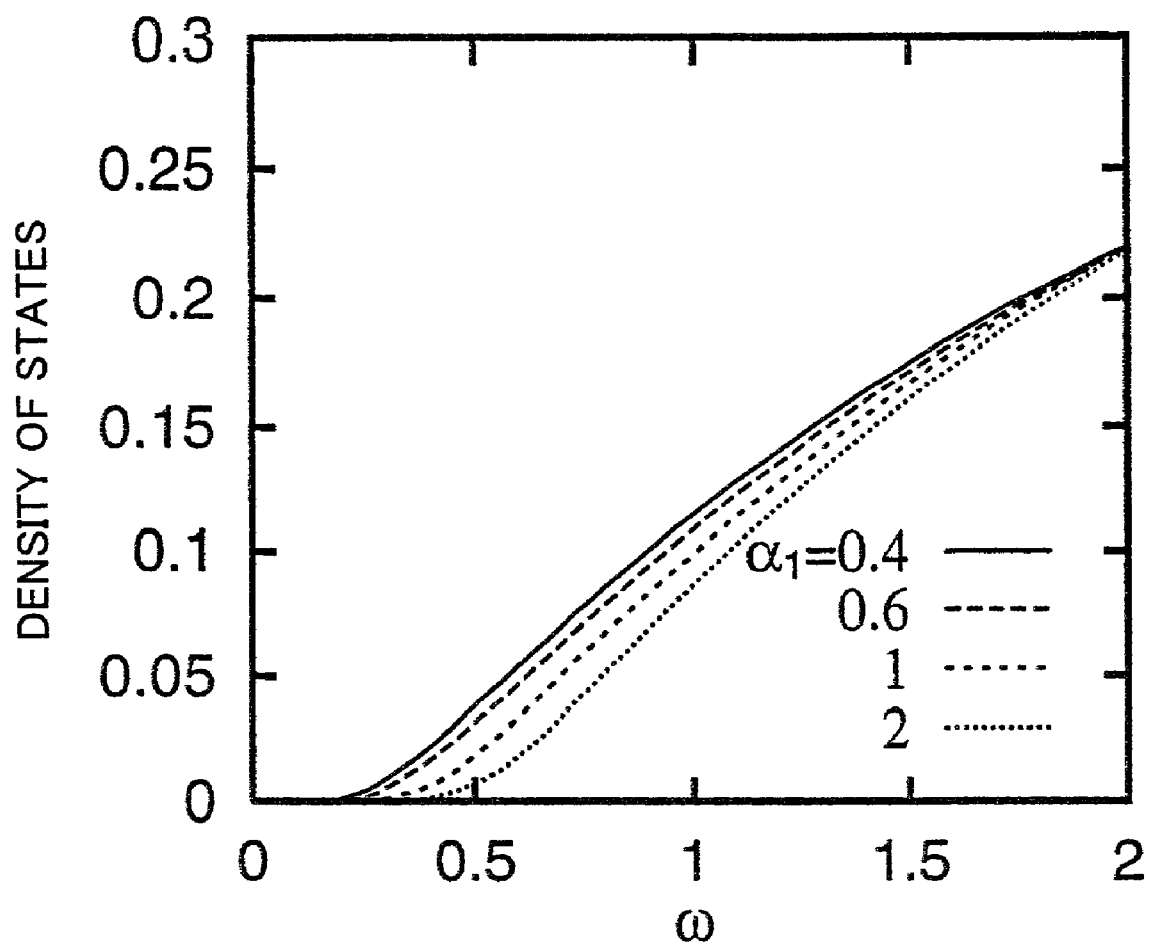
FIG. 42 is a schematic diagram that shows a relation between energy and density of states in the nebula-like fractal-based complex structure according to the sixth embodiment of the invention.

FIGS. 40, 41 and 42 show densities of states of half-filled electron systems (10001 electrons) in the nebula-like fractal-based complex structure under $(\alpha_1, \alpha_2)=(x, 0.4)$ where $x=0.4, 0.6, 1$ and $2$. $U=6$ is used in FIG. 40, $U=7$ in FIG. 41, and $U=8$ in FIG. 42. In case of $\alpha_1=0.4$, the structure is the same as the simple fractal of $\alpha=0.4$. In FIG. 40, for all values of $\alpha_1$, densities of states $D(0)$ under $\omega=0$ are finite, and the electron system is in a metal phase. As $\alpha_1$ increases, $D(0)$ gradually decreases, and the electron system approaches an insulator. In FIG. 41, as $\alpha_1$ increases, disappearance of $D(0)$ occurs, that is, typical Mott transition occurs. In FIG. 42, for all values of $\alpha_1$, the systems behave as Mott insulators, but it is recognized that the insulation performance, i.e. electron-to-electron correlative effect, increases along with the increase of $\alpha_1$. This is because the width of the effective Hubbard gap becomes larger as $\alpha_1$ increases.

Figure 43:
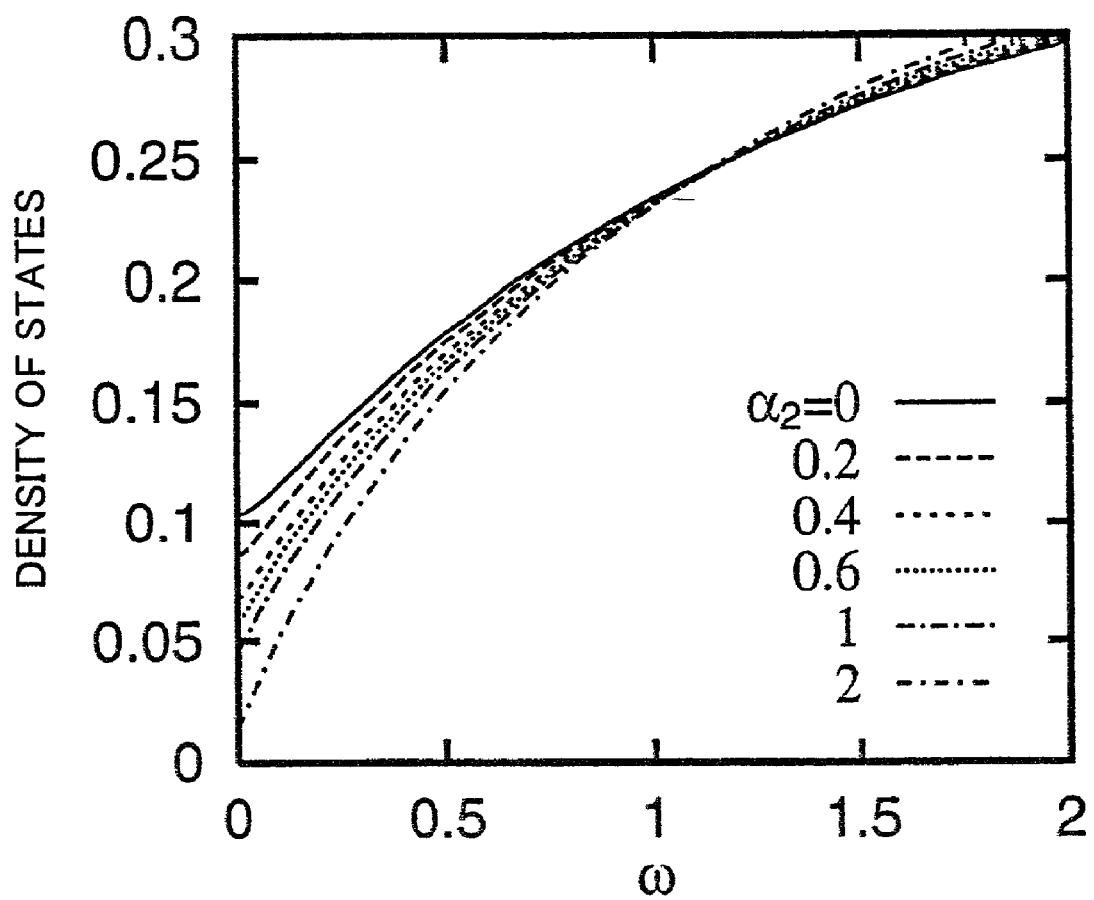
FIG. 43 is a schematic diagram that shows a relation between energy and density of states in the nebula-like fractal-based complex structure according to the sixth embodiment of the invention.
Figure 44:
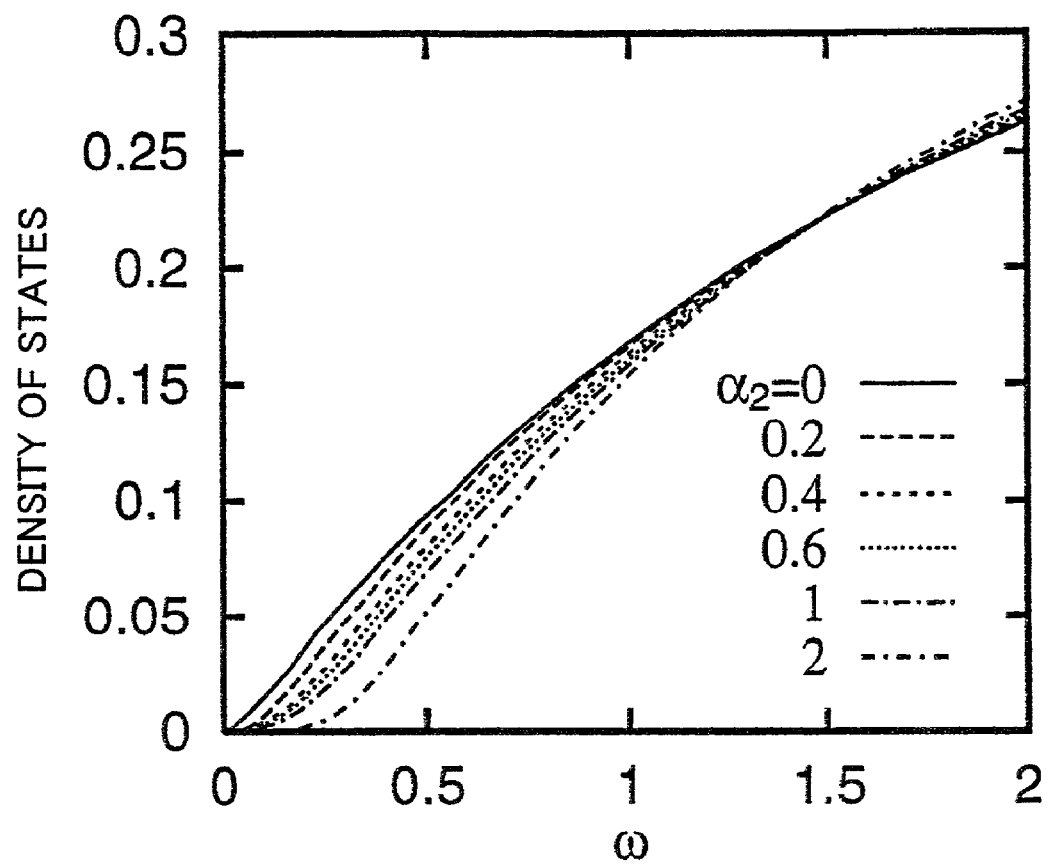
FIG. 44 is a schematic diagram that shows a relation between energy and density of states in the nebula-like fractal-based complex structure according to the sixth embodiment of the invention.
Figure 45:
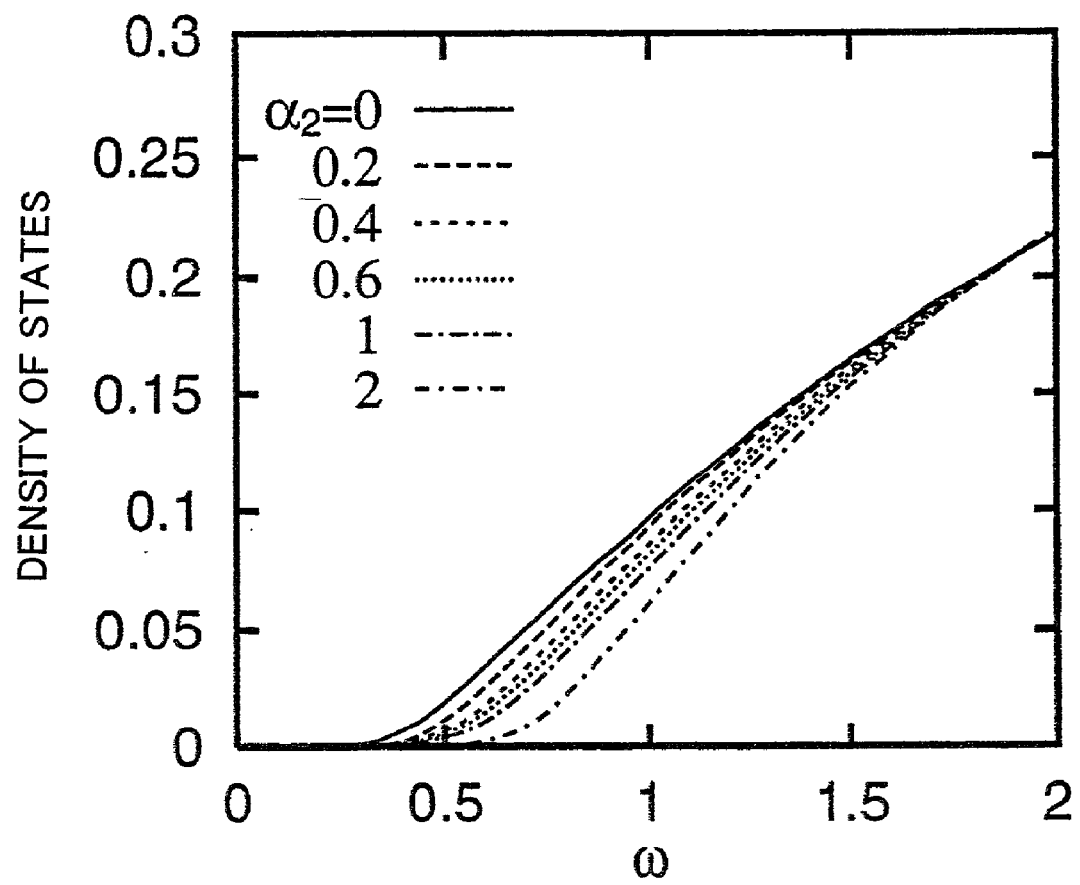
FIG. 45 is a schematic diagram that shows a relation between energy and density of states in the nebula-like fractal-based complex structure according to the sixth embodiment of the invention.

FIGS. 43, 44 and 45 show densities of states of half-filled electron systems (10001 electrons) in the nebula-like fractal-based complex structure under $(\alpha_1, \alpha_2)=(2, x)$ where $x=0$, 0.2, 0.4, 0.6, 1 and 2. U=6 is used in FIG. 43, U=7 in FIG. 44, and U=8 in FIG. 45. In case of $\alpha_2=2$, the structure is the same as the simple fractal of $\alpha=2$, and the fractal dimension is near 2($D_f\sim2.16$). In FIG. 43, for all values of $\alpha_2$, densities of states D(0) under $\omega=0$ are finite, and the electron system is in a metal phase. As $\alpha_2$ increases, D(0) gradually decreases, and the electron system approaches an insulator. In FIGS. 44 and 45, for all values of $\alpha_2$, the systems behave as Mott insulators, but it is recognized that the insulation performance, i.e. electron-to-electron correlative effect, increases along with the increase of $\alpha_2$. This is because the width of the effective Hubbard gap becomes larger as $\alpha_2$ increases.

Figure 46:
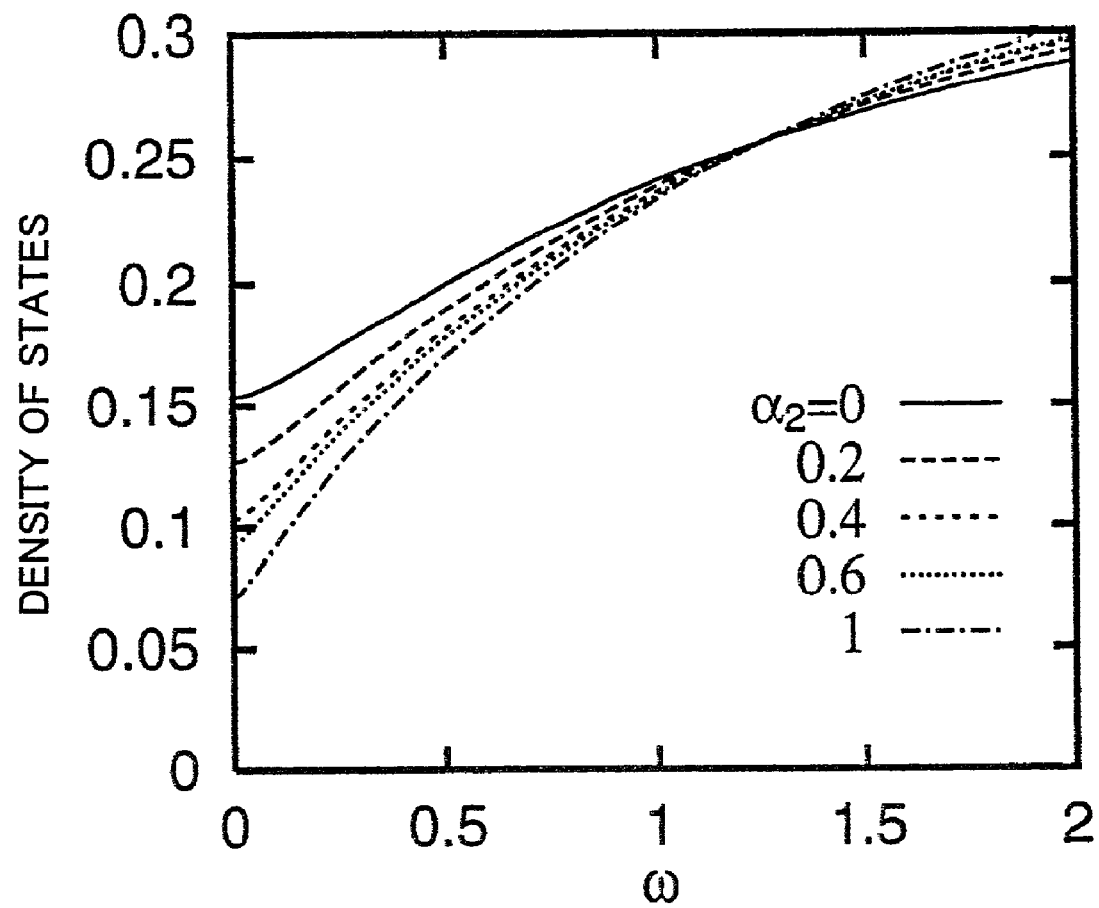
FIG. 46 is a schematic diagram that shows a relation between energy and density of states in the nebula-like fractal-based complex structure according to the sixth embodiment of the invention.
Figure 47:
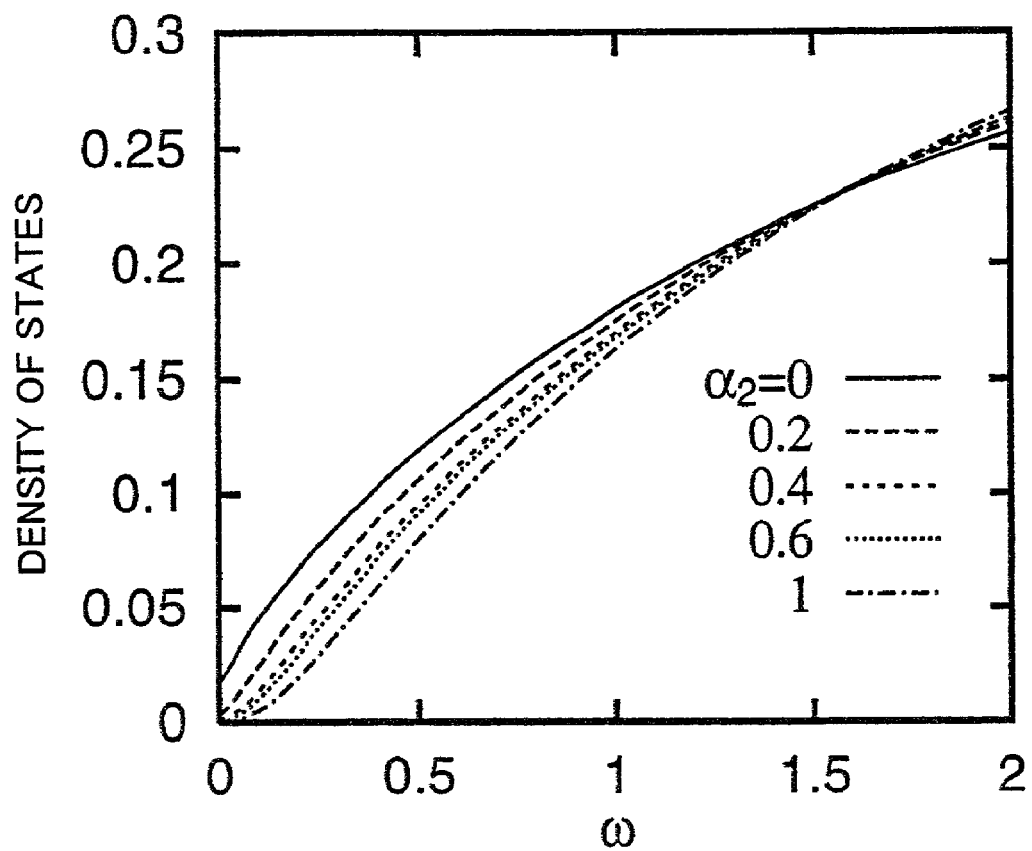
FIG. 47 is a schematic diagram that shows a relation between energy and density of states in the nebula-like fractal-based complex structure according to the sixth embodiment of the invention.
Figure 48:
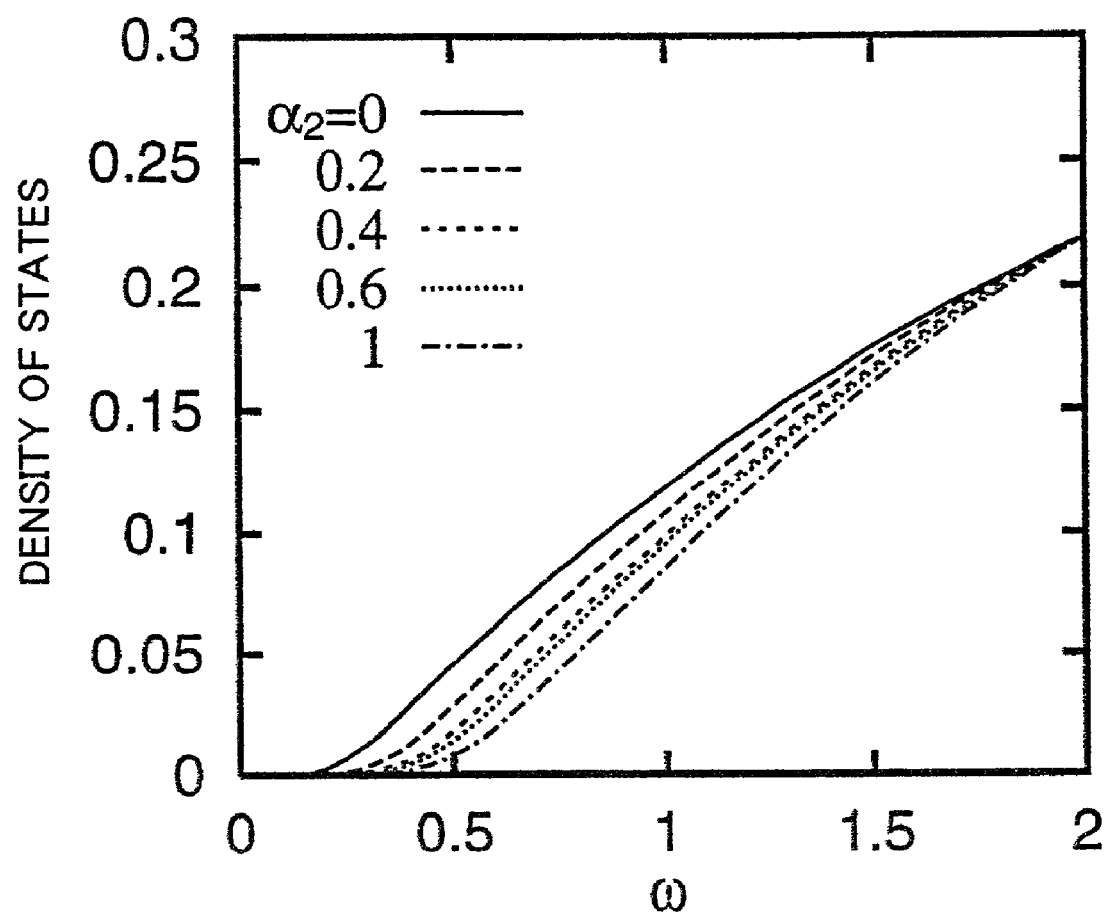
FIG. 48 is a schematic diagram that shows a relation between energy and density of states in the nebula-like fractal-based complex structure according to the sixth embodiment of the invention.

FIGS. 46, 47 and 48 show densities of states of half-filled electron systems (10001 electrons) in the nebula-like fractal-based complex structure under $(\alpha_1, \alpha_2)=(1, x)$ where x=0, 0.2, 0.4, 0.6 and 1. U=6 is used in FIG. 46, U=7 in FIG. 47, and U=8 in FIG. 48. In case of $\alpha_2=1$, the structure is the same as the simple fractal of $\alpha=1$. In FIG. 46, for all values of $\alpha_2$, densities of states D(0) under $\omega=0$ are finite, and the electron system is in a metal phase. In FIG. 47, as $\alpha_2$ increases, disappearance of D(0) occurs, that is, typical Mott transition occurs. In FIG. 48, for all values of $\alpha_2$, the systems behave as Mott insulators, but it is recognized that the insulation performance, i.e. electron-to-electron correlative effect, is enhanced as for all values of $\alpha_2$. This is because the width of the effective Hubbard gap becomes larger as $\alpha_2$ increases.

Figure 49:
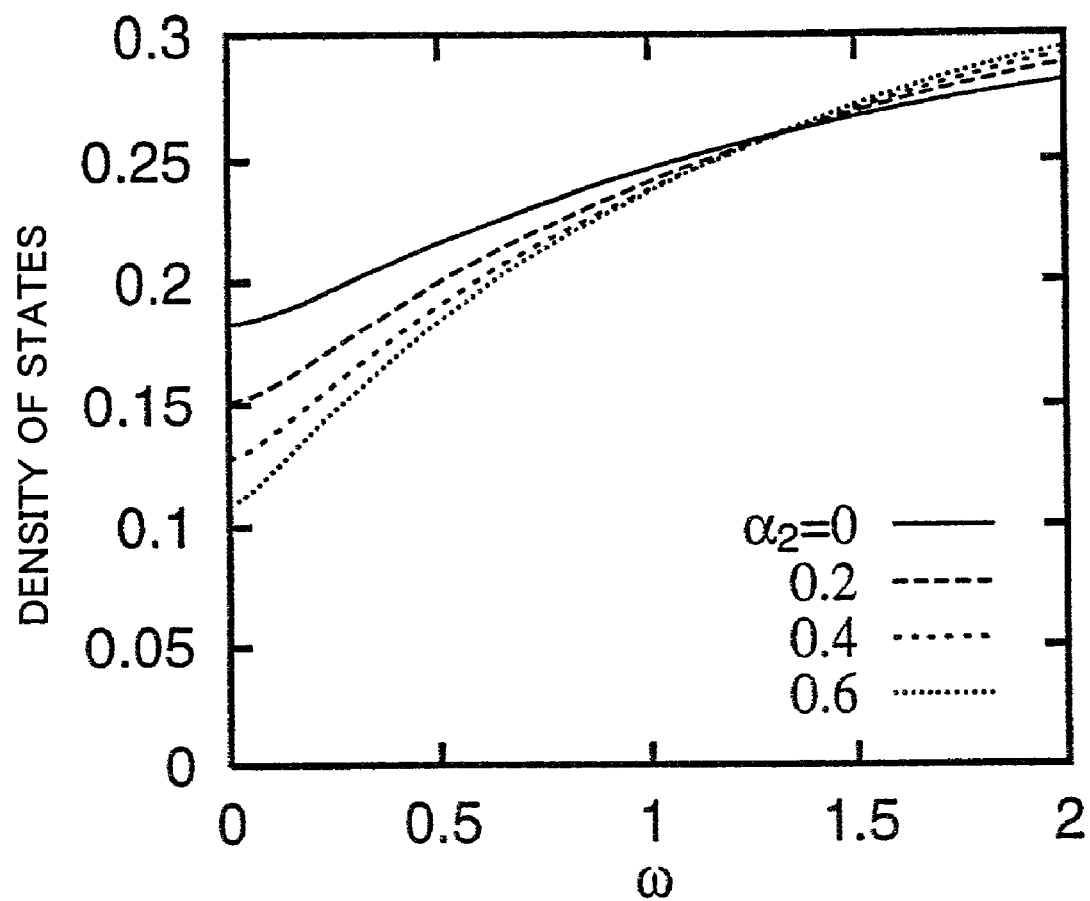
FIG. 49 is a schematic diagram that shows a relation between energy and density of states in the nebula-like fractal-based complex structure according to the sixth embodiment of the invention.
Figure 50:
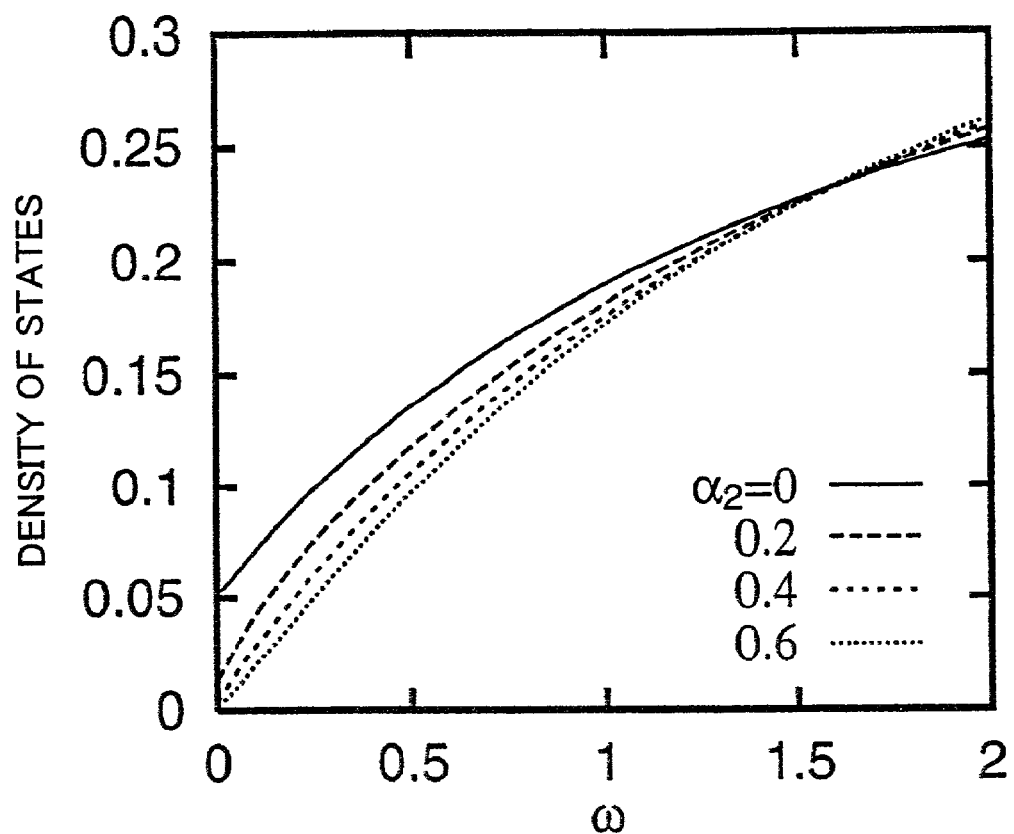
FIG. 50 is a schematic diagram that shows a relation between energy and density of states in the nebula-like fractal-based complex structure according to the sixth embodiment of the invention.
Figure 51:
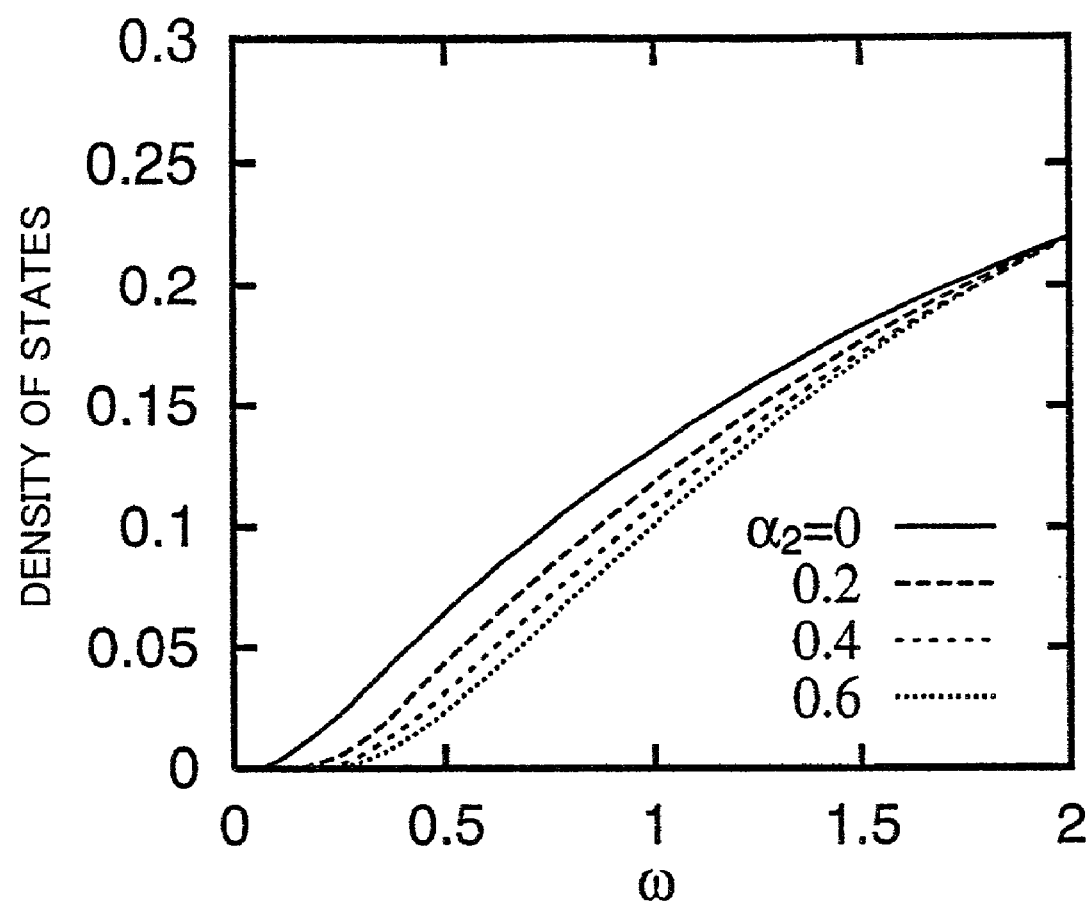
FIG. 51 is a schematic diagram that shows a relation between energy and density of states in the nebula-like fractal-based complex structure according to the sixth embodiment of the invention.

FIGS. 49, 50 and 51 show densities of states of half-filled electron systems (10001 electrons) in the nebula-like fractal-based complex structure under $(\alpha_1, \alpha_2)=(0.6, x)$ where x=0, 0.2, 0.4 and 0.6. U=6 is used in FIG. 49, U=7 in FIG. 50, and U=8 in FIG. 51. In case of $\alpha_2=0.6$, the structure is the same as the simple fractal of $\alpha=0.6$. In FIGS. 49 and 50, for all values of $\alpha_2$, densities of states D(0) under $\omega=0$ are finite, and the electron system is in a metal phase. As $\alpha_2$ increases, D(0) gradually decreases, and the system approaches an insulator. In FIG. 51, for all values of $\alpha_2$, the systems behave as Mott insulators, but it is recognized that the insulation performance, i.e. electron-to-electron correlative effect, is enhanced as $\alpha_2$ increases. This is because the width of the effective Hubbard gap becomes larger as $\alpha_2$ increases.

Through the above analysis, it has been confirmed that various forms of correlative electron systems ranging from the metal phase to the insulator phase can be realized by changing $(\alpha_1, \alpha_2)$. Especially when the condition of approximately $D_f<2.3$ as the fractal dimension in the initial stage of growth and the condition of approximately $D_f>2.7$ as the fractal dimension of the final stage of growth are satisfied, remarkably excellent controllability can be obtained.

Heretofore, the invention has been explained by way of some embodiments. The invention, however, is not limited to these embodiments but involves various changes or modifications within the technical concept and scope of the invention.

As described above, according to the invention, by changing growth conditions with time during growth of a fractal structure to first grow it under growth conditions providing a low fractal dimension and thereafter grow it under different growth conditions providing a higher fractal dimension, it is possible to obtain a nebula-like fractal-based complex structure made up of a mixture of a plurality of regions different in fractal dimension from each other and to modulate and control the dimensionality of a material by a design method beyond those heretofore used to obtain conventional simple fractal properties. Moreover, the nature of various phase transitions occurring in these fractal structures can be controlled, for example, by adjusting the timing for changing the growth conditions. Furthermore, controllability can be improved by optimization of fractal dimensions.

The invention claimed is:

1. A fractal structure, comprising:
   a first region comprising a first plurality of lattice sites, said first region having a first fractal structure grown from the start point of time of growth to a first point of time, said first fractal structure grown by:
   identifying the lattice sites adjacent to one of the first plurality of lattice sites; for each lattice site adjacent to the one lattice site;
   determining the probability that the lattice site is selected as part of the first fractal structure;
   selecting another lattice site based on the probability that the lattice site is selected as part of the first fractal structure; and
   adding the other lattice site to the first fractal structure; and
   until the first point of time:
   identifying the lattice sites adjacent to the other lattice site; and
   for each lattice site adjacent to the other lattice site;
   determining the probability that the lattice site is selected as part of the first fractal structure;
   selecting the other lattice site based on the probability that the lattice site is selected as part of the first fractal structure; and
   adding the other lattice site to the first fractal structure; and
   a second region comprising a second plurality of lattice sites, said second region having a second fractal dimension grown from said first point of time to a second point of time, said second fractal structure grown by:
   identifying the lattice sites adjacent to one of the second plurality of lattice sites;
   for each lattice site adjacent to the one lattice site;
   determining the probability that the lattice site is selected as part of the second fractal structure;
   selecting another lattice site based on the probability that the lattice site is selected as part of the second fractal structure; and
   adding the other lattice site to the second fractal structure; and
   until the second point of time:
   identifying the lattice sites adjacent to the other lattice site; and
   for each lattice site adjacent to the other lattice site;
   determining the probability that the lattice site is selected as part of the second fractal structure;
   selecting the other lattice site based on the probability that the lattice site is selected as part of the second fractal structure; and
   adding the other lattice site to the second fractal structure.

2. The fractal structure according to claim 1 wherein said fractal structure is controlled in nature of phase transition occurring therein by adjustment of the timing for changing said growth conditions.

3. The fractal structure according to claim 1 wherein said fractal structure is controlled in critical temperature for ferromagnetic phase transition occurring therein by adjustment of the timing for changing said growth conditions.

4. The fractal structure according to claim 1 wherein said fractal structure is controlled in nature of a chaos appearing therein by adjustment of the timing for changing said growth conditions.

5. The fractal structure according to claim 1 wherein said fractal structure is controlled in nature of a quantum chaos in an electron state appearing therein by adjustment of the timing for changing said growth conditions.

6. The fractal structure according to claim 5 wherein said quantum chaos in the electron state is controlled by addition of a magnetic impurity.

7. The fractal structure according to claim 1 wherein said regions are nebula-like as a whole.

8. The fractal structure according to claim 1 wherein $D_{f1} > 2.7$ and $D_{f2} < 2.3$ are satisfied where $D_{f1}$ is said first fractal dimension and $D_{f2}$ is said second fractal dimension.

9. The fractal structure according to claim 1 wherein $2.7 < D_{f1} \leq 3$ and $1 \leq D_{f2} < 2.3$ are satisfied where $D_{f1}$ is said first fractal dimension and $D_{f2}$ is said second fractal dimension.

10. The fractal structure according to claim 1 wherein $2.9 \leq D_{f1} \leq 3$ and $1 \leq D_{f2} < 2.3$ are satisfied where $D_{f1}$ is said first fractal dimension and $D_{f2}$ is said second fractal dimension.

11. A method, comprising:
 growing a fractal structure in a region comprising a first plurality of lattice sites in a first fractal dimension, wherein the step of growing the first fractal structure comprises the steps of:
  identifying the lattice sites adjacent to one of the first plurality of lattice sites;
  for each lattice site adjacent to the one lattice site;
   determining the probability that the lattice site is selected as part of the first fractal structure;
   selecting another lattice site based on the probability that the lattice site is selected as part of the first fractal structure; and
   adding the other lattice site to the first fractal structure; and
  until a first point of time:
   identifying the lattice sites adjacent to the other lattice site; and
   for each lattice site adjacent to the other lattice site;
    determining the probability that the lattice site is selected as part of the first fractal structure;
    selecting the other lattice site based on the probability that the lattice site is selected as part of the first fractal structure; and
    adding the other lattice site to the first fractal structure; and
 growing said fractal structure in a region comprising a second plurality of lattice sites in a second fractal dimension, wherein the step of growing the second fractal structure comprises the steps of:
  identifying the lattice sites adjacent to one of the second plurality of lattice sites;
  for each lattice site adjacent to the one lattice site;
   determining the probability that the lattice site is selected as part of the second fractal structure;
   selecting another lattice site based on the probability that the lattice site is selected as part of the second fractal structure; and
   adding the other lattice site to the second fractal structure; and
  until a second point of time:
   identifying the lattice sites adjacent to the other lattice site; and
   for each lattice site adjacent to the other lattice site;
    determining the probability that the lattice site is selected as part of the second fractal structure;
    selecting the other lattice site based on the probability that the lattice site is selected as part of the second fractal structure; and
    adding the other lattice site to the second fractal structure.

12. The method according to claim 11, further comprising adjusting the first point of time to control phase transition occurring in said fractal structure.

13. The method according to claim 11, further comprising adjusting the first point of time to control critical temperature for ferromagnetic phase transition occurring in said fractal structure.

14. The method according to claim 11, further comprising adjusting the first point of time to control the nature of a chaos appearing in said fractal structure.

15. The method according to claim 11, further comprising adjusting the first point of time to control a quantum chaos in an electron state appearing in said fractal structure.

16. The method according to claim 15, further comprising adding a magnetic impurity to control said quantum chaos in the electron state.

17. The method according to claim 11 wherein $D_{f1} > 2.7$ and $D_{f2} < 2.3$ are satisfied where $D_{f1}$ is said first fractal dimension and $D_{f2}$ is said second fractal dimension.

18. The method according to claim 11 wherein $2.7 < D_{f1} \leq 3$ and $1 \leq D_{f2} < 2.3$ are satisfied where $D_{f1}$ is said first fractal dimension and $D_{f2}$ is said second fractal dimension.

19. The method according to claim 11 wherein $2.9 \leq D_{f1} \leq 3$ and $1 \leq D_{f2} \leq 2.3$ are satisfied where $D_{f1}$ is said first fractal dimension and $D_{f2}$ is said second fractal dimension.

* * * * *